United States Patent
Hotta

(10) Patent No.: US 7,535,065 B2
(45) Date of Patent: May 19, 2009

(54) THIN FILM TRANSISTOR DEVICE UTILIZING TRANSISTORS OF DIFFERING MATERIAL CHARACTERISTICS

(75) Inventor: Kazushige Hotta, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/025,797

(22) Filed: Dec. 29, 2004

(65) Prior Publication Data

US 2006/0033169 A1    Feb. 16, 2006

(30) Foreign Application Priority Data

Aug. 11, 2004  (JP) ............................. 2004-234766

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/408; 257/291; 257/443

(58) Field of Classification Search ................ 257/223, 257/227, 291, 292, 439, 443, 655, 408
See application file for complete search history.

(56) References Cited

U.S. PATENT DOCUMENTS

| 6,452,241 B1 * | 9/2002 | Fukata et al. ............... 257/435 |
| 6,803,601 B2 * | 10/2004 | Nakajima .................... 257/59 |
| 6,864,134 B1 | 3/2005 | Satou et al. |
| 2003/0025127 A1 * | 2/2003 | Yanai et al. ................. 257/158 |
| 2003/0124778 A1 | 7/2003 | Doi et al. |

FOREIGN PATENT DOCUMENTS

KR    10-0411025    12/2003

* cited by examiner

*Primary Examiner*—Monica Lewis
(74) *Attorney, Agent, or Firm*—Greer, Burns & Crain, Ltd

(57) ABSTRACT

A first insulating film is formed. Then, a gate electrode of a low voltage drive thin film transistor and a mask film for covering a region constituting a channel of a high voltage drive thin film transistor are formed with a molybdenum film on the first insulating film. An impurity is implanted into a semiconductor film while using the gate electrode and the mask film as a mask, thereby forming a high density impurity region. Thereafter, the impurity is activated by performing a thermal process under a condition at 500° C. and for 2 hours, for example. Subsequently, the mask film is removed and a second insulating film is formed. A gate electrode of the high voltage drive thin film transistor is formed with an aluminum alloy on the second insulating film.

4 Claims, 61 Drawing Sheets

THE PERIPHERAL CIRCUIT PORTION

THE DISPLAY PORTION

N-TYPE LOW VOLTAGE DRIVE TFT FORMING REGION

N-TYPE HIGH VOLTAGE DRIVE TFT FORMING REGION

P-TYPE LOW VOLTAGE DRIVE TFT FORMING REGION

P-TYPE HIGH VOLTAGE DRIVE TFT FORMING REGION

N-TYPE LOW VOLTAGE DRIVE TFT FORMING REGION

N-TYPE HIGH VOLTAGE DRIVE TFT FORMING REGION

P-TYPE LOW VOLTAGE DRIVE TFT FORMING REGION

P-TYPE HIGH VOLTAGE DRIVE TFT FORMING REGION

N-TYPE LOW VOLTAGE DRIVE TFT FORMING REGION

N-TYPE HIGH VOLTAGE DRIVE TFT FORMING REGION

P-TYPE LOW VOLTAGE DRIVE TFT FORMING REGION

P-TYPE HIGH VOLTAGE DRIVE TFT FORMING REGION

THIN FILM TRANSISTOR DEVICE UTILIZING TRANSISTORS OF DIFFERING MATERIAL CHARACTERISTICS

CROSS-REFERENCE TO RELATED APLICATIONS

This application is based on and claims priority of Japanese Patent Application No. 2004-234766 filed on Aug. 11, 2004, the entire contents of which are incorporated herein by reference.

BACKGROUND OF THE INVENTION

1. Field of the Invention

The present invention relates to a thin film transistor device including a thin film transistor driven by a low voltage and a thin film transistor driven by a high voltage, and to a method of manufacturing the same. More specifically, the present invention relates to a thin film transistor device applicable to a liquid crystal display panel, which includes a peripheral circuit provided with thin film transistors and disposed outside a display region.

2. Description of the Prior Art

Liquid crystal display devices have lightweight, thin profile, and low power consumption characteristics and are therefore used in various electronic devices such as display devices for personal digital assistants (PDAs), notebook personal computers, desktop personal computers and the like, or viewfinders for video cameras. Particularly, an active matrix liquid crystal display devices including thin film transistors (TFTs) provided in respective picture elements (subpixels) as switching elements exhibits a high drive capability and an excellent display characteristic.

In general, a liquid crystal display device includes two substrates and liquid crystal which is sealed between these substrates. Picture element electrodes, TFTs, and the like are formed for respective picture elements (subpixels) on one of the substrates, while color filters opposed to the picture element electrodes and a common electrode common to the respective picture elements are formed on the other substrate. The substrate including the picture element electrodes and the TFTs formed thereon will be hereinafter referred to as a TFT substrate, and the substrate to be disposed opposite to the TFT substrate will be hereinafter referred to as a counter substrate. Moreover, a structure formed by sealing the liquid crystal between the TFT substrate and the counter substrate will be hereinafter referred to as a liquid crystal display panel.

In recent years, a peripheral circuit integrated liquid crystal display panel including peripheral circuits such as drivers (drive circuits) formed outside a display region is drawing attention. In the peripheral circuit integrated liquid crystal panel, it is necessary to form a semiconductor film constituting an active layer of the TFTs with polycrystalline silicon in order to form the TFTs having high drive capabilities.

When forming the polycrystalline silicon TFTs, a high density of an impurity is doped in a contact region by use of an ion doping device or the like, and then an activation process is carried out. The activation process includes a laser activation process of irradiating a laser beam which is outputted from a pulse oscillation excimer laser, and a thermal activation process of activating the impurity by a thermal process. In the laser activation process, the laser beam is irradiated beyond gate electrodes. Accordingly, metal having high reflectivity is used as the material for the gate electrodes. Meanwhile, in the thermal activation process, the contact region is heated at a high temperature equal to or above 500° C. Accordingly, metal having a high melting point is used as the material for the gate electrodes.

Incidentally, a display device used in a portable terminal or the like is required to be operable with low power consumption. Accordingly, the peripheral circuits are expected to be operable with low voltages. For this reason, it is preferable to form the peripheral circuit with TFTs having thin gate insulating films. However, in terms of the liquid crystal display panel, a voltage in a range from 7 to 10 V or above (a display voltage) is applied to the picture element electrodes through the TFTs to ensure the voltage required to drive the liquid crystal. Accordingly, it is necessary to increase the thickness of gate insulating films of the TFTs in a range from 80 to 150 nm to ensure the gate voltage resistance. For this reason, the peripheral circuit integrated liquid crystal display panel has a problem in that the peripheral circuits are formed with the TFTs requiring high operating voltages and power consumption is therefore increased.

To solve this problem, the inventors of the present invention have proposed to change the thickness between the gate insulating films of the TFTs at a display portion (hereinafter referred to as picture element TFTs) and the gate insulating film of the TFTs in a peripheral circuit portion as disclosed in Japanese Unexamined Patent Publication No. 2003-188183, for example. The TFT having the thinner gate insulating film will be hereinafter referred to as a low voltage drive TFT, and the TFT having the thicker gate insulating film will be hereinafter referred to as a high voltage drive TFT.

FIG. 1A is a cross-sectional view showing the low voltage drive TFT formed in the peripheral circuit portion of the liquid crystal display panel, and FIG. 1B is a cross-sectional view showing the high voltage drive TFT formed at the display portion of the liquid crystal display panel. A method of manufacturing the conventional thin film transistor device (the liquid crystal display panel) will be described with reference to FIGS. 1A and 1B.

Firstly, a glass substrate 11 is prepared as a base for a TFT substrate, and a silicon nitride (SiN) film 12 and a silicon oxide ($SiO_2$) film 13 are formed on this glass substrate 11 collectively as a base film.

Next, an amorphous silicon film is formed on the $SiO_2$ film 13 of the base film. Then, a laser beam is irradiated on the amorphous silicon film to form a polycrystalline silicon film 14. Thereafter, the polycrystalline silicon film 14 is patterned into a predetermined shape by use of the photolithography method.

Next, a $SiO_2$ film 15 is formed on the entire upper surface of the glass substrate 11, and then the $SiO_2$ film 15 located in a low voltage drive TFT forming region is removed by patterning. Thereafter, a $SiO_2$ film 16 is formed on the entire upper surface of the glass substrate 11, and a conductive film made of an Al alloy such as aluminum neodymium (Al—Nd) is further formed thereon.

Next, a resist film is formed into a predetermined shape on the conductive film, and the conductive film and the $SiO_2$ films 15 and 16 are etched by using this resist film as a mask. In this way, gate electrodes 17a and 17b of a low voltage drive TFT and a high voltage drive TFT, and a gate bus line are formed. Here, the $SiO_2$ film 16 constitutes a gate insulating film in the low voltage drive TFT forming region, and the laminated $SiO_2$ films 15 and 16 constitute a gate insulating film in a high voltage drive TFT forming region.

Thereafter, an impurity is ion-implanted into the polycrystalline silicon film 14 for forming a high density impurity region 14a constituting a source and a drain of the low voltage drive TFT, and a high density impurity region 14b constituting a source and a drain of the high voltage drive TFT. In this case, in the high voltage drive TFT forming region, it is also possible to form a low density impurity region (a lightly doped drain, or LDD) 14c between the high density impurity region 14b and a channel region by utilizing a difference in levels between the gate electrode 17b and the gate insulating film (the SiO₂ films 15 and 16) as shown in FIG. 1B.

Next, a laser beam is irradiated onto the polycrystalline silicon film 14 doped with the impurity to activate the impurity. Thereafter, a SiO₂ film 18 is formed on the entire upper surface of the glass substrate 11. Then, after forming contact holes on the SiO₂ film 18, a metallic film made of Al or an Al alloy is formed on the entire surface thereof. Source and drain electrodes 19a and 19b and a data bus line are formed by patterning this metallic film. Subsequently, a SiN film 20 is formed on the entire upper surface of the glass substrate 11 to cover the TFTs. Moreover, an insulative organic resin film 21 is formed thereon. In this way, it is possible to form the peripheral circuit integrated liquid crystal display panel including two types of TFTs having different thickness in the gate insulating films.

However, in the above-described method of manufacturing the conventional thin film transistor device, the gate electrodes of the TFTs and the gate bus line are made of Al or the Al alloy. Accordingly, although a resistance value of the gate bus line is low, it is not possible to activate the impurity by the thermal activation process. The impurity has to be activated by the laser activation process. Nevertheless, it has been proved that activation of the impurity by the thermal activation process is less susceptible to an influence of hot carrier deterioration as compared to activation of the impurity by the laser activation process, and that the thermal activation process is more effective to form the reliable TFTs.

It is also conceivable to form the gate electrodes with metal having a high melting point so as to enable the thermal activation process. However, the high melting point metal causes an increase in resistance of the gate bus line particularly in the case of a large-sized liquid crystal display device. Such an increase in resistance may cause damping of signals which may result in incapability to drive the TFTs. It is also conceivable to increase the width or the thickness of the gate bus line in order to reduce the resistance. However, in that case, there arises a new problem of a difficulty to achieve high fineness.

SUMMARY OF THE INVENTION

In consideration of the foregoing problems, it is an object of the present invention to provide a thin film transistor device provided with a low voltage drive TFT having a thin gate insulating film and a high voltage drive TFT having a thick gate insulating film and a manufacturing method thereof. Here, the thin film transistor device allows formation of a gate electrode and source and drain electrodes of the high voltage drive TFT with low resistance metal such as an Al alloy, and allows activation of an impurity by a thermal activation process.

The foregoing object is attained by providing a thin film transistor device including a substrate, a first thin film transistor formed on the substrate and applying a first insulating film as a gate insulating film, and a second thin film transistor formed on the substrate and applying a laminated film of the first insulating film and a second insulating film as a gate insulating film. Here, a gate electrode of the second thin film transistor is made of a conductive material having lower resistance and a lower melting point than a gate electrode of the first thin film transistor.

For example, the above-described thin film transistor device is manufactured by a method of manufacturing a thin film transistor device including a first step of forming a semiconductor film on a first n-type thin film transistor forming region, a first p-type thin film transistor forming region, a second n-type thin film transistor forming region, and a second p-type thin film transistor forming region of a substrate, a second step of forming a first insulating film on an entire upper surface of the substrate, a third step of forming a first metallic film on the first insulating film, a fourth step of forming a first gate electrode in the first n-type thin film transistor forming region and in the first p-type thin film transistor forming region and forming a mask film to cover at least a region constituting a channel on the second n-type thin film transistor forming region and on the second p-type thin film transistor forming region by patterning the first metallic film, a fifth step of forming an n-type low density impurity region by implanting an n-type impurity into the semiconductor film in the first n-type thin film transistor forming region, the first p-type thin film transistor forming region, the second n-type thin film transistor forming region, and the second p-type thin film transistor forming region while using the first gate electrode and the mask film as a mask, a sixth step of forming a first resist film covering the mask film in the second n-type thin film transistor forming region and a region in the vicinity thereof, the first resist film entirely covering the first p-type thin film transistor forming region and entirely covering the second p-type thin film transistor forming region, a seventh step of forming an n-type high density impurity region having higher impurity density than the n-type low density impurity region by implanting an n-type impurity into the semiconductor film in the first n-type thin film transistor forming region and in the second n-type thin film transistor forming region while using the first gate electrode and the first resist film as a mask, an eighth step of removing the first resist film, a ninth step of forming a second resist film entirely covering the first n-type thin film transistor forming region and entirely covering the second n-type thin film transistor forming region, a tenth step of forming a p-type high density impurity region constituting a source and a drain by implanting a p-type impurity into the semiconductor film in the first p-type thin film transistor forming region and in the second p-type thin film transistor forming region while using the first gate electrode and the second resist film as a mask, an eleventh step of removing the second resist film, a twelfth step of removing the mask film in the second n-type thin film transistor forming region and in the second p-type thin film transistor forming region, a thirteenth step of forming a second insulating film on the entire upper surface of the substrate, a fourteenth step of forming a second metallic film made of metal having lower resistance and a lower melting point as compared to the first metallic film onto the second insulating film, and a fifteenth step of forming a second gate electrode in the second n-type thin film transistor forming region and in the second p-type thin film transistor forming region by patterning the second metallic film. Here, a thermal process for activating the impurities implanted into the semiconductor film is performed at a lower temperature than a melting point of the metal constituting the first metallic film in mid-course from completion of the eleventh step to initiation of the fourteenth step.

In this method, the gate electrode of the low voltage drive thin film transistor and the mask film for covering the region to be the channel of the high voltage drive thin film transistor are made of the first metallic film, and the n-type high density impurity region and the p-type high density impurity region constituting the source and the drain are formed by use of the gate electrode, the mask film, and the resist film collectively as the mask. Moreover, for example, after activating the impurities implanted into the n-type high density impurity region and the p-type high density impurity region by the thermal process, the second insulating film is formed on the entire upper surface of the substrate and the gate electrode of the high voltage drive thin film transistor is formed thereon.

In this way, it is possible to use the metal having low resistance and the low melting point, such as Al, as the material for the gate electrode of the high voltage drive thin film transistor. Therefore, it is possible to form the bus line by use of the metal having the low resistance and the low melting point, such as Al, even when increasing the size of the liquid crystal display panel. Accordingly, it is possible to avoid occurrence of a defect attributable to damping of signals and thereby to ensure reliability of the liquid crystal display panel.

In this method, the low voltage drive thin film transistor does not include the LDD region, but the n-type high voltage drive thin film transistor includes the LDD region. Moreover, the n-type high voltage drive thin film transistor adopts either a structure formed by overlapping part of the LDD region and the gate electrode (a gate overlap structure: a GOLD structure) or an offset structure including a region of the semiconductor not doped with any impurity, which is located between the LDD region and the channel region. To improve reliability while maintaining on-resistance, it is preferable to adopt the gate overlap structure.

Meanwhile, the p-type high voltage drive thin film transistor adopts either a structure formed by overlapping part of the high density impurity region and the gate electrode or an offset structure including a region of the semiconductor not doped with any impurity, which is located between the high density impurity region and the channel region.

For example, the above-described thin film transistor device is manufactured by a method of manufacturing a thin film transistor device including a first step of forming a semiconductor film on a first n-type thin film transistor forming region, a first p-type thin film transistor forming region, a second n-type thin film transistor forming region, and a second p-type thin film transistor forming region of a substrate, a second step of forming a first insulating film on an entire upper surface of the substrate, a third step of forming a resist film covering regions constituting channels of the first n-type thin film transistor forming region and of the second n-type thin film transistor forming region, and entirely covering the first p-type thin film transistor forming region and the second p-type thin film transistor forming region by use of a photoresist method, a fourth step of forming an n-type low density impurity region by implanting an n-type impurity into the semiconductor film in the first n-type thin film transistor forming region and in the second n-type thin film transistor forming region while using the resist film as a mask, a fifth step of removing the resist film, a sixth step of forming a first metallic film on the first insulating film, a seventh step of forming a first gate electrode in the first p-type thin film transistor forming region and forming a first mask film for covering a region constituting a channel in the second p-type thin film transistor forming region by patterning the first metallic film in the first p-type thin film transistor forming region and in the second p-type thin film transistor forming region, an eighth step of forming a p-type high density impurity region constituting a source and a drain by implanting a p-type impurity into the semiconductor film in the first p-type thin film transistor forming region and in the second p-type thin film transistor forming region while using the first gate electrode and the first mask film as a mask, a ninth step of forming a second gate electrode in the first n-type thin film transistor forming region and forming a second mask film covering part of a region constituting a lightly doped drain and the region constituting the channel of the second n-type thin film transistor forming region by patterning the first metal film in the first n-type thin film transistor forming region and in the second n-type thin film transistor forming region, a tenth step of forming an n-type high density impurity region having higher impurity density than the n-type low density impurity region by implanting an n-type impurity into the semiconductor_film in the first n-type thin film transistor forming region and the second n-type thin film transistor forming region while using the second gate electrode and the second mask film as a mask, an eleventh step of removing the first and second mask films in the second n-type thin film transistor forming region and in the second p-type thin film transistor forming region, a twelfth step of forming a second insulating film on the entire upper surface of the substrate, a thirteenth step of forming a second metallic film made of metal having lower resistance and a lower melting point as compared to the first metallic film onto the second insulating film, and a fourteenth step of forming a third gate electrode in the second n-type thin film transistor forming region and forming a fourth gate electrode in the second p-type thin film transistor forming region by patterning the second metallic film. Here, a thermal process for activating the impurities implanted into the semiconductor film is performed at a lower temperature than a melting point of the metal constituting the first metallic film in mid-course from completion of the tenth step to initiation of the thirteenth step.

In this method as well, the gate electrode of the low voltage drive thin film transistor and the mask film for covering the region to be the channel of the high voltage drive thin film transistor are made of the first metallic film, and the n-type high density impurity region and the p-type high density impurity region constituting the source and the drain are formed by use of the gate electrode and the mask film collectively as the mask. Moreover, for example, after activating the impurities implanted into the n-type high density impurity region and the p-type high density impurity region by the thermal process, the second insulating film is formed on the entire upper surface of the substrate and the gate electrode of the high voltage drive thin film transistor is formed thereon.

In this way, it is possible to use the metal having low resistance and the low melting point, such as Al, as the material for the gate electrode of the high voltage drive thin film transistor. Therefore, it is possible to form the bus line by use of the metal having the low resistance and the low melting point, such as Al, even when increasing the size of the liquid crystal display panel. Accordingly, it is possible to avoid occurrence of a defect attributable to damping of signals and thereby to ensure reliability of the liquid crystal display panel.

In this method, the n-type low voltage drive thin film transistor adopts either a structure not including the LDD region or a structure formed by overlapping the LDD region and the gate electrode. Meanwhile, the n-type high voltage drive thin film transistor includes the LDD region, and adopts either the structure formed by overlapping part of the LDD region and the gate electrode or the offset structure including the region of the semiconductor not doped with any impurity, which is located between the LDD region and the channel region.

For example, the above-described thin film transistor device is manufactured by a method of manufacturing a thin film transistor device including a first step of forming a semiconductor film on a first n-type thin film transistor forming region, a first p-type thin film transistor forming region, a second n-type thin film transistor forming region, and a second p-type thin film transistor forming region of a substrate, a second step of forming a first insulating film on an entire upper surface of the substrate, a third step of forming a first metallic film on the first insulating film, a fourth step of forming a first gate electrode in the first p-type thin film transistor forming region and forming a first mask film to cover a region constituting a channel of the second p-type thin film transistor forming region by patterning the first metallic film in the first p-type thin film transistor forming region and in the second p-type thin film transistor forming region, a fifth step of forming a p-type high density impurity region constituting a source and a drain by implanting a p-type impurity into the semiconductor film in the first p-type thin film transistor forming region and in the second p-type thin film transistor forming region while using the first gate electrode and the first mask film as a mask, a sixth step of forming a second gate electrode in the first n-type thin film transistor forming region by patterning the first metallic film in the first n-type thin film transistor forming region and in the second n-type thin film transistor forming region and forming a second mask film covering a region constituting a lightly doped drain and a region constituting a channel of the second n-type thin film transistor forming region, a seventh step of forming an n-type high density impurity region constituting a source and a drain by implanting an n-type impurity into the semiconductor film in the first n-type thin film transistor forming region and in the second n-type thin film transistor forming region while using the second gate electrode and the second mask film as a mask, an eighth step of removing the first and second mask films in the second n-type thin film transistor forming region and in the second p-type thin film transistor forming region, a ninth step of forming a second insulating film on the entire upper surface of the substrate, a tenth step of forming a second metallic film made of metal having lower resistance and a lower melting point as compared to the first metallic film onto the second insulating film, an eleventh step of forming a third gate electrode in the second n-type thin film transistor forming region and forming a fourth gate electrode in the second p-type thin film transistor forming region by patterning the second metallic film, and a twelfth step of forming an n-type low density impurity region having lower impurity density than the n-type high density impurity region between the region constituting the channel and the n-type high density impurity region by implanting an n-type impurity into the semiconductor film in the second n-type thin film transistor forming region while using the third gate electrode as a mask. Here, a thermal process for activating the impurities implanted into the semiconductor film is performed at a lower temperature than a melting point of the metal constituting the first metallic film in mid-course from completion of the seventh step to initiation of the tenth step.

In this method as well, the gate electrode of the low voltage drive thin film transistor and the mask film for covering the region to be the channel of the high voltage drive thin film transistor are made of the first metallic film, and the n-type high density impurity region and the p-type high density impurity region constituting the source and the drain are formed by use of the gate electrode and the mask film collectively as the mask. Moreover, for example, after activating the impurities implanted into the n-type high density impurity region and the p-type high density impurity region by the thermal process, the second insulating film is formed on the entire upper surface of the substrate and the gate electrode of the high voltage drive thin film transistor is formed thereon.

In this way, it is possible to use the metal having low resistance and the low melting point, such as Al, as the material for the gate electrode of the high voltage drive thin film transistor. Therefore, it is possible to form the bus line by use of the metal having the low resistance and the low melting point, such as Al, even when increasing the size of the liquid crystal display panel. Accordingly, it is possible to avoid occurrence of a defect attributable to damping of signals and thereby to ensure reliability of the liquid crystal display panel.

In this method, the low voltage drive thin film transistor does not include the LDD region, but the n-type high voltage drive thin film transistor includes the LDD region. Meanwhile, the p-type high voltage drive thin film transistor adopts either a structure formed by overlapping part of the high density impurity region and the gate electrode or the offset structure including the region of the semiconductor not doped with any impurity, which is located between the high density impurity region and the channel region. Moreover, in this method, the low density impurity region is formed after formation of the gate electrode of the high voltage drive thin film transistor while utilizing the fact that the impurity in the low density impurity region can be sufficiently activated by a thermal process at a temperature (about 350° C., for example) not causing a trouble in a low resistance wiring material such as Al. In this way, it is possible to curtail one cycle of the photoresist step as compared to the method described previously.

BRIEF DESCRIPTION OF THE DRAWINGS

39B is a cross-sectional view taken along the A-A' line in FIG. 39A.

DESCRIPTION OF THE PREFERRED EMBODIMENTS

Now, embodiments of the present invention will be described below with reference to the accompanying drawings.

First Embodiment (Overall Configuration of Thin Film Transistor Device)

Figure 2:
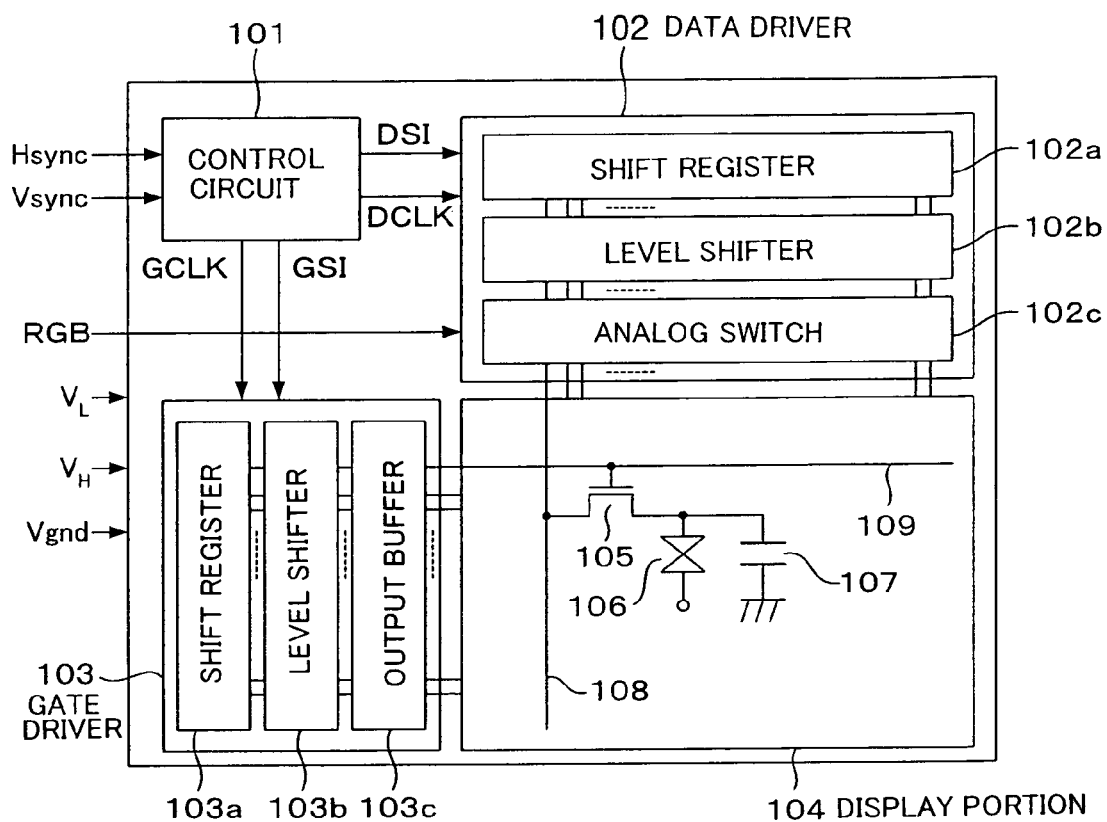
FIG. 2 is a block diagram showing an overall configuration of a thin film transistor device (a transmissive liquid crystal display panel) according to a first embodiment of the present invention.

FIG. 2 is a block diagram showing an overall configuration of a thin film transistor device (a transmissive liquid crystal display panel) according to a first embodiment of the present invention.

The thin film transistor device (the liquid crystal display panel) of this embodiment includes a control circuit 101, a data driver 102, a gate driver 103, and a display portion 104. Signals including a display signal RGB, a horizontal synchronizing signal Hsync, a vertical synchronizing signal Vsync, and the like are supplied from an external device (not shown) such as a computer to this liquid crystal display device. In the meantime, a high voltage VH (such as 18 V), a low voltage (such as 3.3 V or 5 V), and ground potential Vgnd are supplied from a power source (not shown) to this liquid crystal display device.

A plurality of picture elements are arranged in a matrix at the display portion 104. Each of the picture elements includes a thin film transistor (TFT) 105, a display cell (a liquid crystal cell) 106 connected to a source electrode of this TFT 105, and an auxiliary capacitor 107.

The display cell 106 includes a picture element electrode, a common electrode, and liquid crystal disposed therebetween to be described later. Meanwhile, the auxiliary capacitor 107 includes an auxiliary capacitor bus line, an auxiliary capacitor electrode, and an insulating film disposed therebetween to be described later.

The display portion 104 includes a plurality of data bus lines 108 extending in a vertical direction and a plurality of gate bus lines 109 extending in a horizontal direction. Gate electrodes of the respective TFTs 105 of the picture elements arranged in the horizontal direction are connected to the same gate bus line 109, and drain electrodes of the respective TFTs 105 of the picture elements arranged in the vertical direction are connected to the same data bus line 108.

The control circuit 101 inputs the horizontal synchronizing signal Hsync and the vertical synchronizing signal Vsync, and outputs a data start signal DSI which is rendered active at the start of one horizontal synchronizing period, a data clock DCLK for dividing one horizontal synchronizing period into constant intervals, a gate start signal GSI which is rendered active at the start of one vertical synchronizing period, and a gate clock GCLK for dividing one vertical synchronizing period into constant intervals. This control circuit 101 includes an n-type TFT and a p-type TFT which are driven by the low voltage VL.

The data driver 102 includes a shift register 102a, a level shifter 102b, and an analog switch 102c.

The shift register 102a includes output terminals in the same number as the number of the data bus lines 108. This shift register 102a is initialized by the data start signal DSI, and then outputs low voltage active signals sequentially from the respective output terminals at the timing synchronized with the data clock DCLK. This shift register 102a includes an n-type TFT and a p-type TFT which are driven by the low voltage VL.

The level shifter 102b includes input terminals and output terminals respectively in the same number as the number of the data bus lines 108. Moreover, the level shifter 102b converts the low voltage active signals outputted from the shift register 102a into high voltage active signals and outputs the high voltage active signals. This level shifter 102b includes an n-type TFT and a p-type TFT which are driven by the low voltage VL, and an n-type TFT and a p-type TFT which are driven by the high voltage VH.

The analog switch 102c also includes input terminals and output terminals respectively in the same number as the number of the data bus lines 108. The respective output terminals of the analog switch 102c are connected to the corresponding data bus lines 108. When the active signal is inputted from the level shifter 102b, the analog switch 102c outputs the display signal RGB (any one of an R signal, a G signal, and a B signal) to the output terminal corresponding to the input terminal which inputs the active signal. This analog switch 102c includes an n-type TFT and a p-type TFT which are driven by the high voltage VH.

In the meantime, the gate driver 103 includes a shift register 103a, a level shifter 103b, and an output buffer 103c.

The shift register 103a includes output terminals in the same number as the number of the gate bus lines 109. This shift register 103a is initialized by the gate start signal GSI, and then outputs low voltage scan signals sequentially from the respective output terminals at the timing synchronized with the gate clock GCLK. This shift register 103a includes an n-type TFT and a p-type TFT which are driven by the low voltage VL.

The level shifter 103b includes input terminals and output terminals respectively in the same number as the number of the gate bus lines 109. Moreover, the level shifter 103b converts the low voltage scan signals outputted from the shift register 103a into high voltage scan signals and outputs the high voltage scan signals. This level shifter 103b includes an n-type TFT and a p-type TFT which are driven by the low voltage VL, and an n-type TFT and a p-type TFT which are driven by the high voltage VH.

The output buffer 103c also includes input terminals and output terminals respectively in the same number as the number of the gate bus lines 109. The respective output terminals of the output buffer 103c are connected to the corresponding gate bus lines 109. The output buffer 103c supplies the scan signals inputted from the level shifter 103b to the gate bus lines 109 through the output terminals corresponding to the input terminals. This output buffer 103c includes an n-type TFT and a p-type TFT which are driven by the high voltage VH.

The TFT 105 at the display portion 104 is turned on when the scan signal is supplied to the gate bus line 109. At this time, when the display signal RGB (any one of the R signal, the G signal, and the B signal) is supplied to the data bus line 108, the display signal RGB is written in the display cell 106 and in the auxiliary capacitor 107. In the display cell 106, the inclination of the liquid crystal is changed by the display signal RGB written therein. As a result, the light transmittance of the display cell 106 is changed. A desired image is displayed by controlling the light transmittance of the display cell 106 in each picture element.

(Liquid Crystal Display Panel)

Figure 3A:
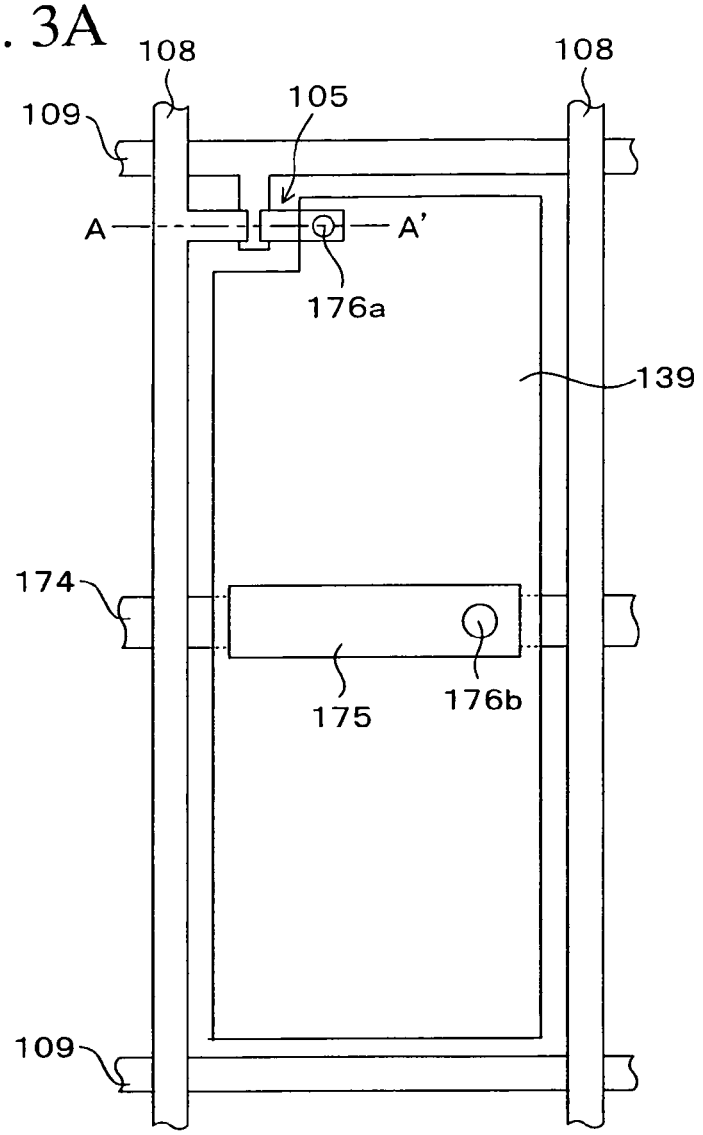
FIG. 3A is a plan view showing one picture element in the liquid crystal display panel of the first embodiment.
Figure 3B:
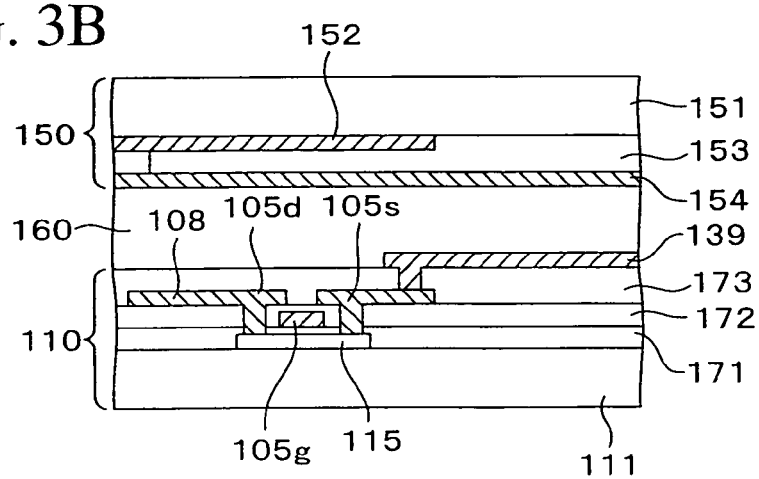
FIG. 3B is a view showing a schematic cross section taken along the A-A' line in FIG. 3A.
Figure 4A:
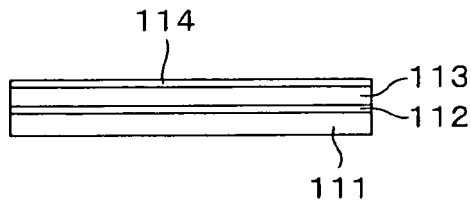
FIG. 4A to FIG. 4D are cross-sectional views (Stage 1) showing a method of manufacturing the thin film transistor device (the liquid crystal display panel) of the first embodiment.
Figure 4B:
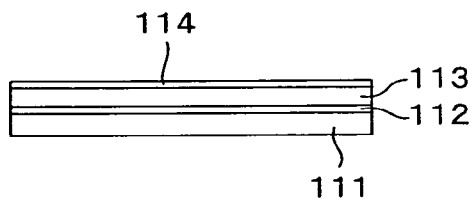
Figure 4C:
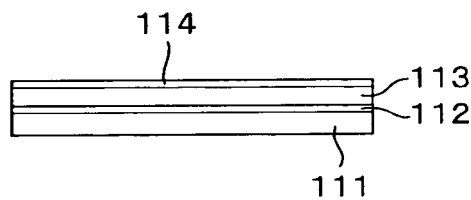
Figure 4D:
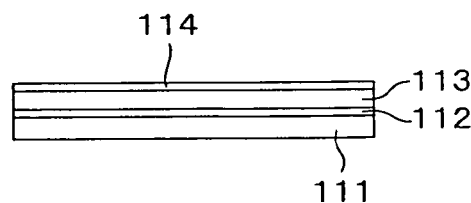
Figure 5A:
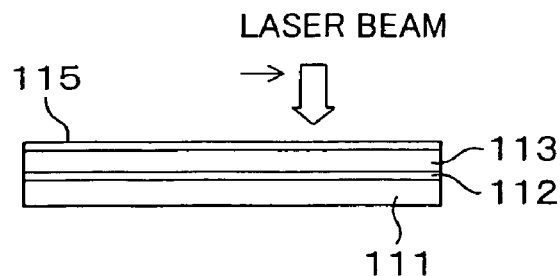
FIG. 5A to FIG. 5D are cross-sectional views (Stage 2) showing the method of manufacturing the thin film transistor device (the liquid crystal display panel) of the first embodiment.
Figure 5B:
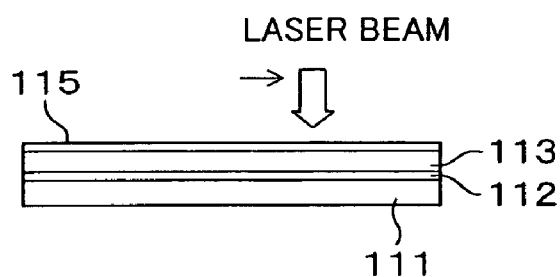
Figure 5C:
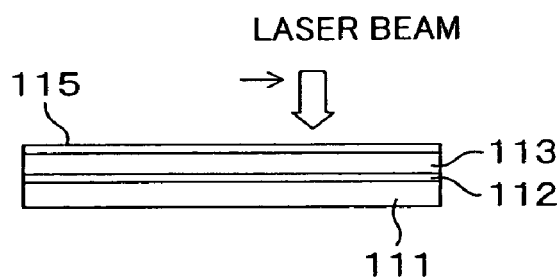
Figure 5D:
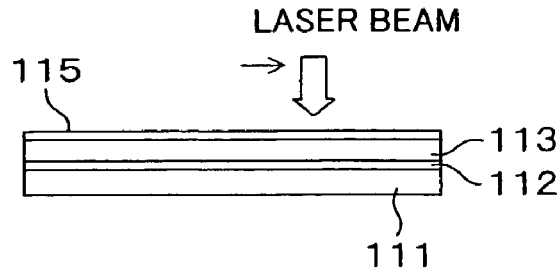
Figure 6A:
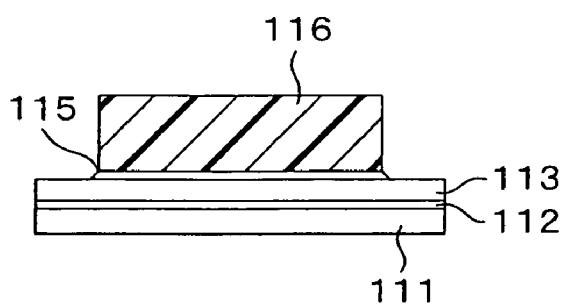
FIG. 6A to FIG. 6D are cross-sectional views (Stage 3) showing the method of manufacturing the thin film transistor device (the liquid crystal display panel) of the first embodiment.
Figure 6B:
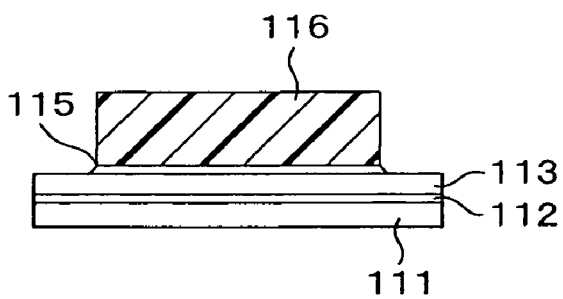
Figure 6C:
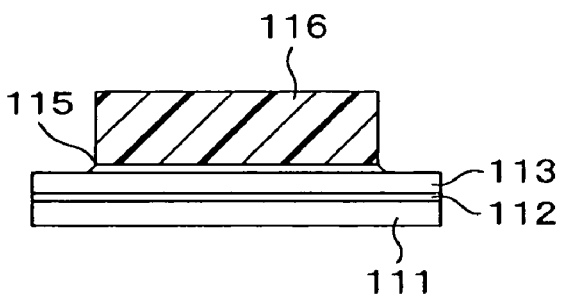
Figure 6D:
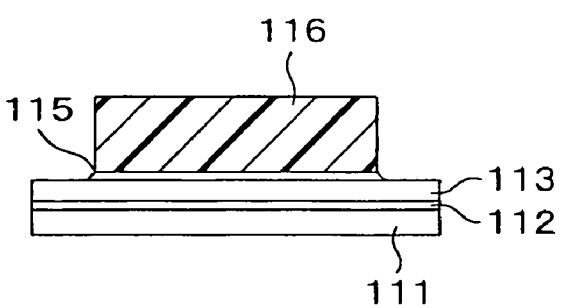
Figure 7A:
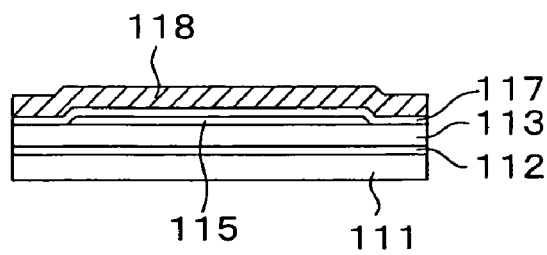
FIG. 7A to FIG. 7D are cross-sectional views (Stage 4) showing the method of manufacturing the thin film transistor device (the liquid crystal display panel) of the first embodiment.
Figure 7B:
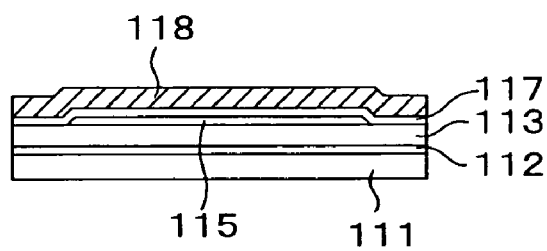
Figure 7C:
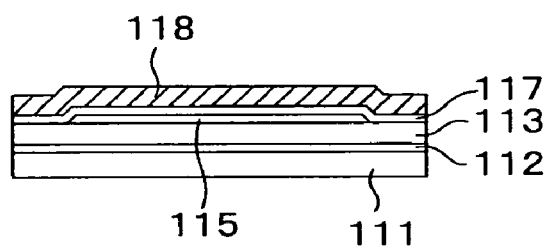
Figure 7D:
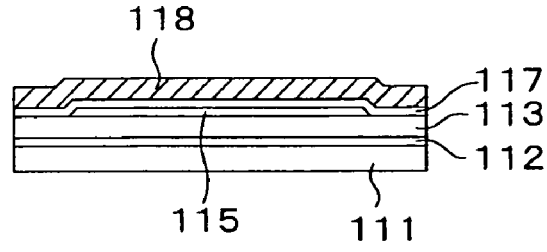
Figure 8A:
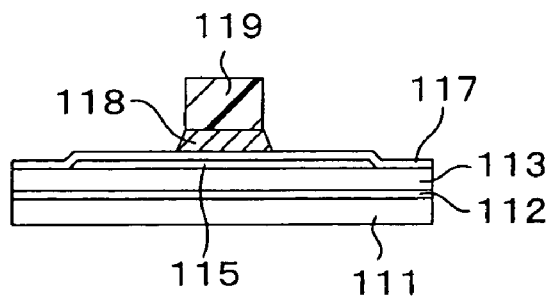
FIG. 8A to FIG. 8D are cross-sectional views (Stage 5) showing the method of manufacturing the thin film transistor device (the liquid crystal display panel) of the first embodiment.
Figure 8B:
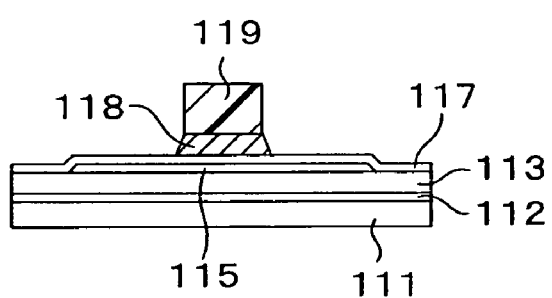
Figure 8C:
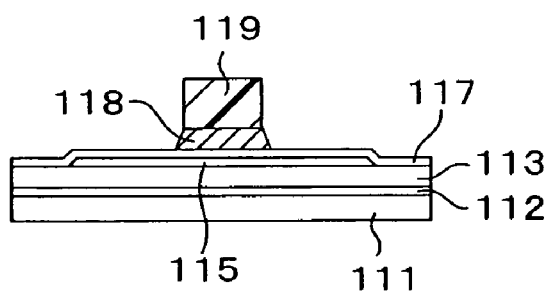
Figure 8D:
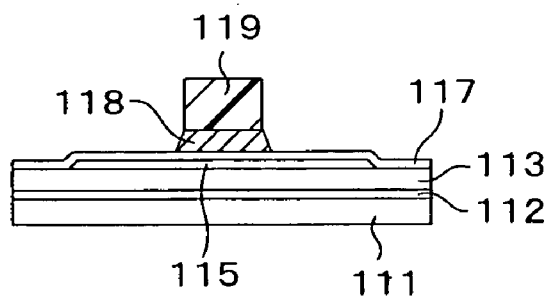
Figure 9A:
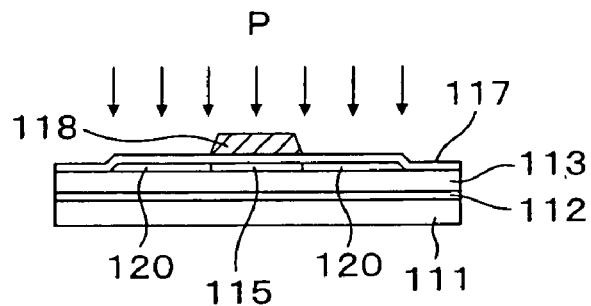
FIG. 9A to FIG. 9D are cross-sectional views (Stage 6) showing the method of manufacturing the thin film transistor device (the liquid crystal display panel) of the first embodiment.
Figure 9B:
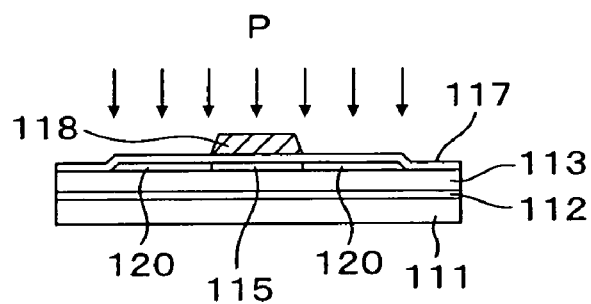
Figure 9C:
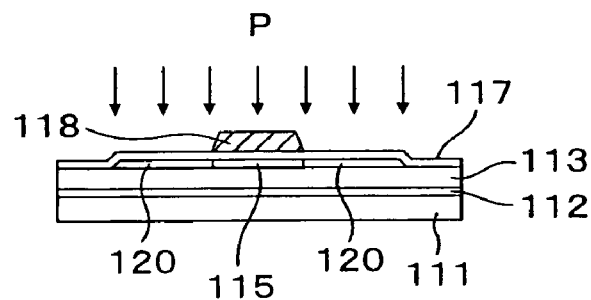
Figure 9D:
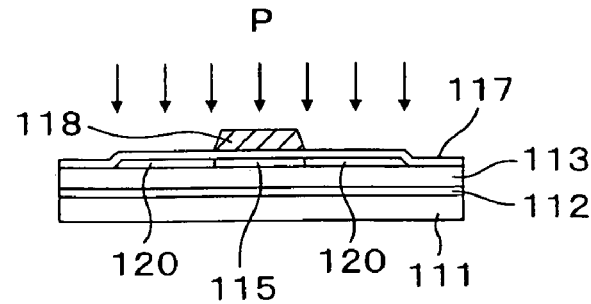
Figure 10A:
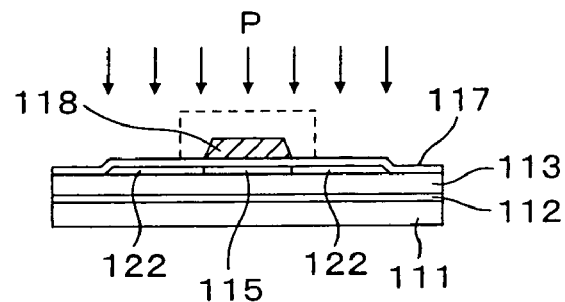
FIG. 10A to FIG. 10D are cross-sectional views (Stage 7) showing the method of manufacturing the thin film transistor device (the liquid crystal display panel) of the first embodiment.
Figure 10B:
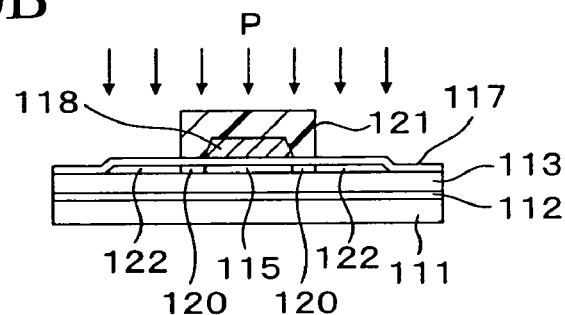
Figure 10C:
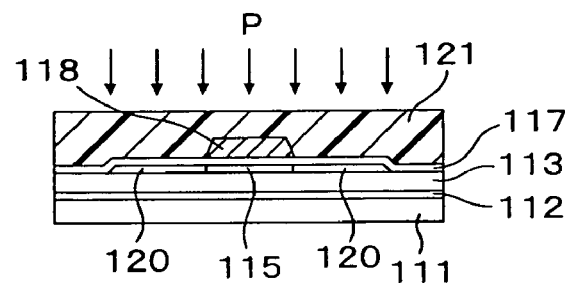
Figure 10D:
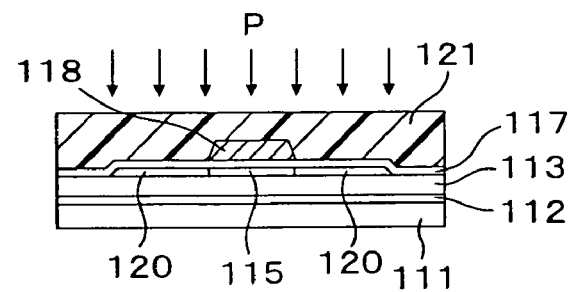

FIG. 3A is a plan view showing one picture element in the liquid crystal display panel, and FIG. 3B is a view showing a schematic cross section taken along the A-A' line in FIG. 3A.

As shown in FIG. 3A and FIG. 3B, the liquid crystal display panel includes a TFT substrate 110, a counter substrate 150, and liquid crystal 160 sealed between the TFT substrate 110 and the counter substrate 150.

As described above, the plurality of gate bus lines 109 extending in the horizontal direction (in an x-axis direction) and the plurality of data bus lines 108 extending in the vertical direction (in a y-axis direction) are formed on a glass substrate 111 which constitutes a base of the TFT substrate 110. Each rectangular region partitioned by the gate bus lines 109 and the data bus lines 108 is a picture element region. Meanwhile, an auxiliary capacitor bus line 174 is formed on the glass substrate 111, which is disposed in parallel to the gate bus lines 109 while crossing the picture element region.

The TFT 105, a picture element electrode 139 made of a transparent conductive material such as indium-tin oxide (ITO), and an auxiliary capacitor electrode 175 are formed in each picture element region. A polycrystalline silicon film 115 constituting an active layer of the TFT 105 is covered with a first insulating film (a gate insulating film) 172, and the gate bus lines 109, a gate electrode 105g, and the auxiliary capacitor bus line 174 are formed on the first insulating film 171. Meanwhile, a second insulating film 172 is formed on the first insulating film 171, the gate bus lines 109, the gate electrode 105g, and the auxiliary capacitor bus line 174. A source electrode 105s and a drain electrode 105d of the TFT 105, the data bus lines 108, and the auxiliary capacitor electrode 175 are formed on this second insulating film 172. A third insulating film 173 is formed on the source electrode 105s, the drain electrode 105d, the data bus lines 108, and the auxiliary capacitor electrode 175. The picture element electrode 139 is formed on this third insulating film 173. Meanwhile, an alignment film (not shown) made of polyimide, for example, is formed on the picture element electrode 139.

The gate electrode 105g of the TFT 105 is connected to the gate bus line 109, and the drain electrode 105d is connected to the data bus line 108. Meanwhile, the source electrode 105s of the TFT 105 is electrically connected to the picture element electrode 139 through a contact hole 176a. In addition, the auxiliary capacitor electrode 175 is electrically connected to the picture element electrode 139 through a contact hole 176b.

In the meantime, a black matrix 152, a color filter 153, and a common electrode 154 are formed on a glass substrate 151 which constitutes a base of the counter substrate 150. The black matrix 152 is formed of a metal film of chromium (Cr) or the like. The black matrix 152 shields light in regions for forming the gate bus lines 109, the data bus lines 108, the auxiliary capacitor bus line 174, and the TFT 105. The color filter 153 includes three color types of red, green, and blue, and the color filter in any of the foregoing colors is disposed in each picture element. A red picture element, a green picture element, and a blue element which are adjacent to one another collectively constitute one pixel that can display various colors.

The common electrode 154 is made of a transparent conductive material such as ITO, and is opposed to the picture element electrode 139 on the TFT substrate 110. A surface of the common electrode 154 is covered with an alignment film (not shown) made of polyimide, for example.

(Method of Manufacturing Thin Film Transistor Device)

FIG. 4A to FIG. 18D are cross-sectional views showing a method of manufacturing the thin film transistor device (the liquid crystal display panel) according to the first embodiment of the present invention sequentially in the order of the steps. Throughout FIG. 4A to FIG. 18D, a drawing marked with a suffix A shows a cross section in an n-type low voltage drive TFT forming region, a drawing marked with a suffix B shows a cross section in an n-type high voltage drive TFT forming region, a drawing marked with a suffix C shows a cross section in a p-type low voltage drive TFT forming region, and a drawing marked with a suffix D shows a cross section in a p-type high voltage drive TFT forming region. In reality, the peripheral circuit portion often adopts a structure in which two TFTs are connected to each other in order to reduce an off leak current and to ensure reliability at the same time. However, to facilitate the explanation, an assumption will be made herein that the respective TFTs are formed individually.

Firstly, as shown in FIG. 4A to FIG. 4D, a SiN film 112 in the thickness of 50 nm, for example, is formed on the glass substrate (a transparent insulative substrate) 111, and a $SiO_2$ film 113 in the thickness of 200 nm is formed thereon to constitute a base film collectively. Then, an amorphous silicon film 114 in the thickness from 40 to 100 nm is formed on the $SiO_2$ film 113 by the plasma CVD method, for example.

Next, as shown in FIG. 5A to FIG. 5D, the amorphous silicon is crystallized by scanning the entire upper surface of the glass substrate 111 with a laser beam using an excimer laser or a continuous-wave solid-state laser (a CW laser), thereby forming the polycrystalline silicon film 115. Here, before irradiating the laser beam, it is preferable to anneal the glass substrate 111 at a high temperature to the extent not to deform the glass substrate 111 (in a range from 450° C. to 550° C., for example). In this way, hydrogen contained in the amorphous silicon film 114 is removed and occurrence of ablation upon irradiation of the laser beam can be avoided. Alternatively, instead of scanning the entire upper surface of the glass substrate 111 with the laser beam, it is possible to form the polycrystalline silicon film 115 partially by scanning only the TFT forming regions with the laser beam.

Next, as shown in FIG. 6A to FIG. 6D, a resist film 116 is formed on the TFT forming regions of the polycrystalline silicon film 115 by the photoresist method. Then, the polycrystalline silicon film 115 is subjected to dry etching with fluorine-based etching gas while using this resist film 116 as a mask. Thereafter, the resist film 116 is removed.

Next, as shown in FIG. 7A to FIG. 7D, a $SiO_2$ film 117 constituting a gate insulating film of the low voltage drive TFT is formed in the thickness of about 30 nm on the entire upper surface of the glass substrate 111 by the plasma CVD method, for example. Then, a molybdenum (Mo) film 118 constituting the gate electrode of the low voltage drive TFT is formed in the thickness of about 300 nm on the $SiO_2$ film 117. Here, instead of the Mo film 118, it is also possible to form a metallic film containing other high melting point metal such as titanium (Ti), chromium (Cr), tungsten (W) or tantalum (Ta) as a main component.

Next, as shown in FIG. 8A to FIG. 8D, a resist film 119 is formed into a predetermined pattern on the Mo film 118 by the photoresist method. This resist film 119 is formed above portions constituting channel regions of the respective TFTs. Then, the Mo film 118 is etched by using this resist film 119 as a mask. The etching of the Mo film 118 is carried out by means of dry etching with fluorine-based etching gas or wet etching with a phosphoric acid and hydrochloric acid-based etchant. The resist film 119 is removed after the etching of the Mo film 118 is completed.

Next, an n-type low density impurity region 120 constituting a LDD region of the n-type high voltage drive TFT is formed. Specifically, as shown in FIG. 9A to FIG. 9D, an n-type impurity (such as phosphorus (P)) is implanted into the polycrystalline silicon film 115 in low density through the $SiO_2$ film 117 while using the Mo film 118 as a mask. An ion doping device is used for implantation of the n-type impurity, and an acceleration voltage is set to 30 kV and a dosage is set to $10^{14}/cm^2$, for example.

Figure 19A:
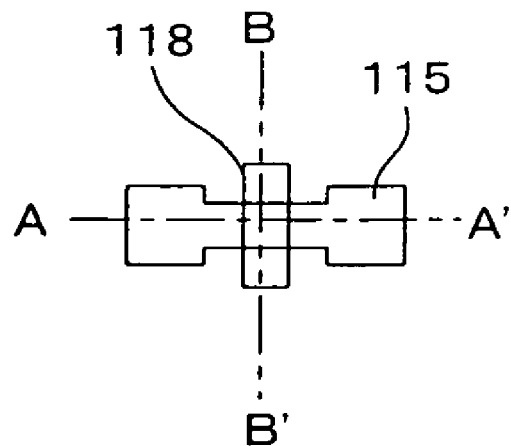
FIG. 19A is a top plan view showing a step in the method of manufacturing the thin film transistor device (the liquid crystal display panel) of the first embodiment.
Figure 19B:
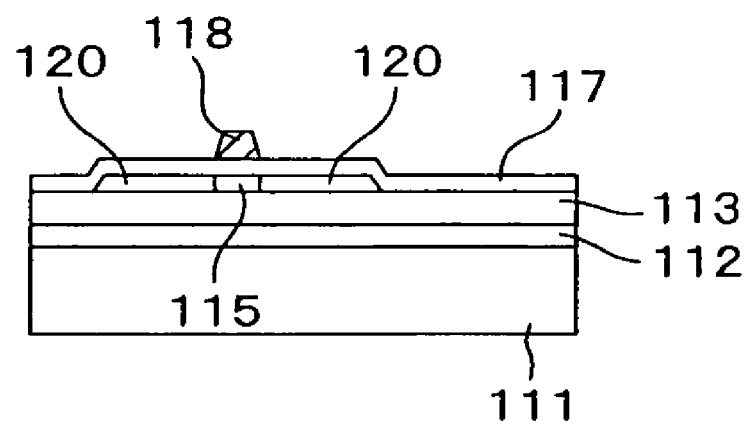
FIG. 19B is a cross-sectional view taken along the A-A' line in FIG. 19A.
Figure 19C:
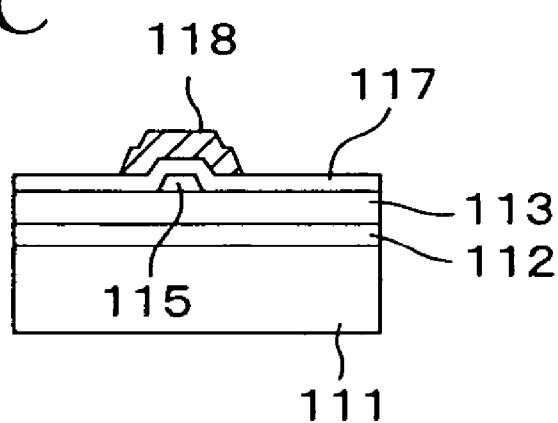
FIG. 19C is a cross-sectional view taken along the B-B' line in FIG. 19A.

FIG. 19A is a top plan view of the high voltage drive TFT (the n-type TFT) forming region of a picture element portion in this case. Meanwhile, FIG. 19B shows a cross section taken along the A-A' line in FIG. 19A, and FIG. 19C shows a cross section taken along the B-B' line in FIG. 19A. As shown in FIG. 19A to FIG. 19C, the polycrystalline silicon film 115 is formed into the shape having wider widths at both ends and a narrower width at a central portion. Meanwhile, the Mo film 118 is formed into the shape perpendicularly crossing the central portion of the polycrystalline silicon film 115.

Next, as shown in FIG. 10A to FIG. 10D, the channel region and the LDD region of the n-type high voltage drive TFT, the entire p-type low voltage drive TFT forming region, and the entire p-type high voltage drive TFT forming region are covered with a photoresist film 121. Then, an n-type impurity (such as P) is implanted into the polycrystalline silicon film 115 in the n-type low voltage drive TFT forming region and in the n-type high voltage drive TFT forming region in high density through the $SiO_2$ film 117, thereby forming an n-type high density impurity region 122 constituting the sources and the drains of the n-type low voltage drive TFT and the n-type high voltage drive TFT. An ion doping device is used for implantation of the n-type impurity, and an acceleration voltage is set to 30 kV and a dosage is set to $10^{15}/cm^2$, for example. Here, as indicated with a dashed line in FIG. 10A, it is also possible to form the resist film 121 in the n-type low density TFT forming region so as to preserve the n-type low density impurity region 120 (the LDD region).

Figure 20A:
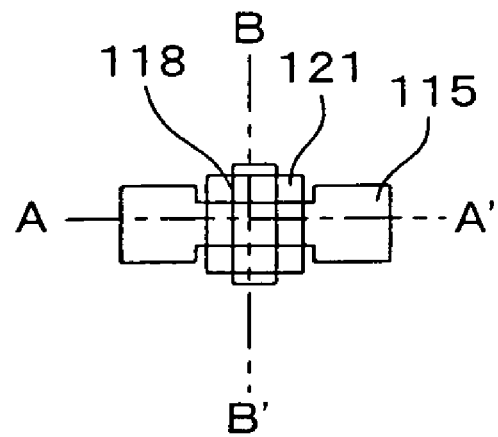
FIG. 20A is a top plan view showing another step in the method of manufacturing the thin film transistor device (the liquid crystal display panel) of the first embodiment.
Figure 20B:
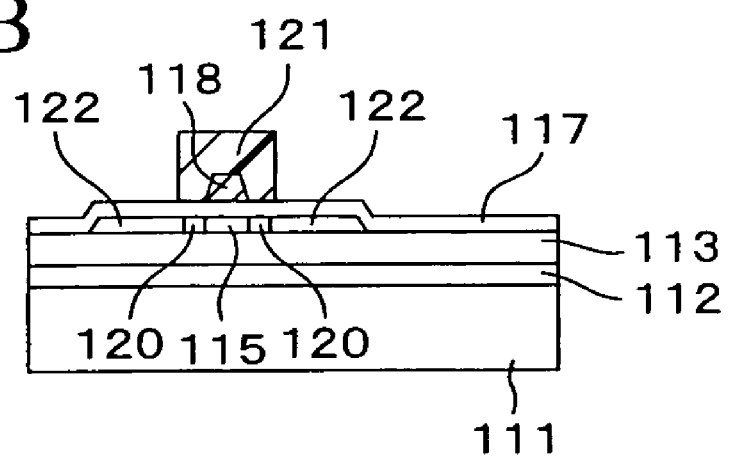
FIG. 20B is a cross-sectional view taken along the A-A' line in FIG. 20A.
Figure 20C:
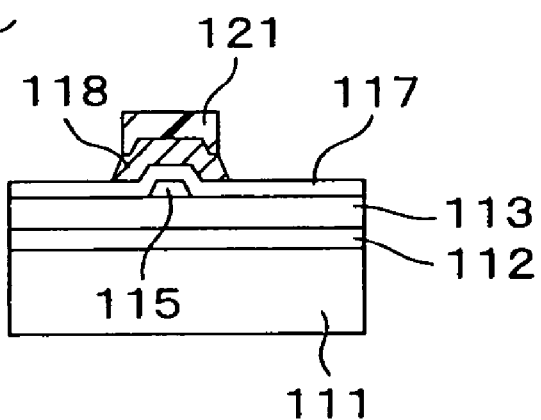
FIG. 20C is a cross-sectional view taken along the B-B' line in FIG. 20A.

FIG. 20A is a top plan view of the high voltage drive TFT (the n-type TFT) forming region of the picture element portion in this case. Meanwhile, FIG. 20B shows a cross section taken along the A-A' line in FIG. 20A, and FIG. 20C shows a cross section taken along the B-B' line in FIG. 20A. As shown in FIG. 20A to FIG. 20C, the resist film 121 covers the intersection of the Mo film 118 and the silicon film 115, and the vicinity thereof. Then, the n-type impurity is implanted into the portion of the polycrystalline silicon film 115 which is not covered with the resist film 121.

After forming the n-type high density impurity regions 122 respectively in the n-type low voltage drive TFT forming region and in the n-type high voltage drive TFT forming region as described above, the resist film 121 is removed by ashing.

Figure 1A:
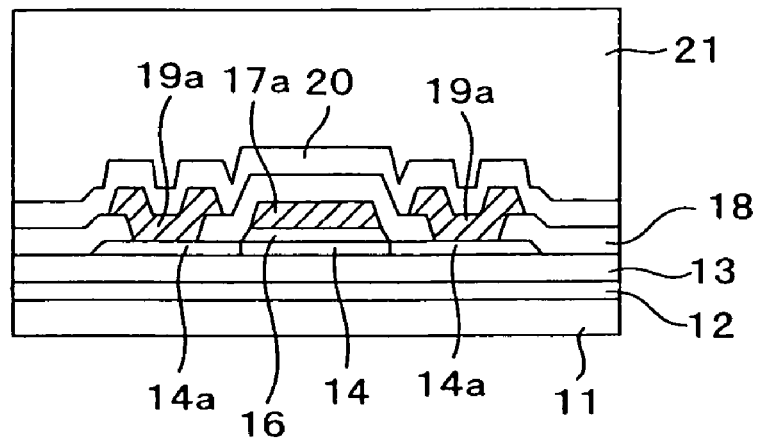
FIG. 1A is a cross-sectional view showing a low voltage drive TFT formed in a peripheral circuit portion of a conventional liquid crystal display panel.
Figure 1B:
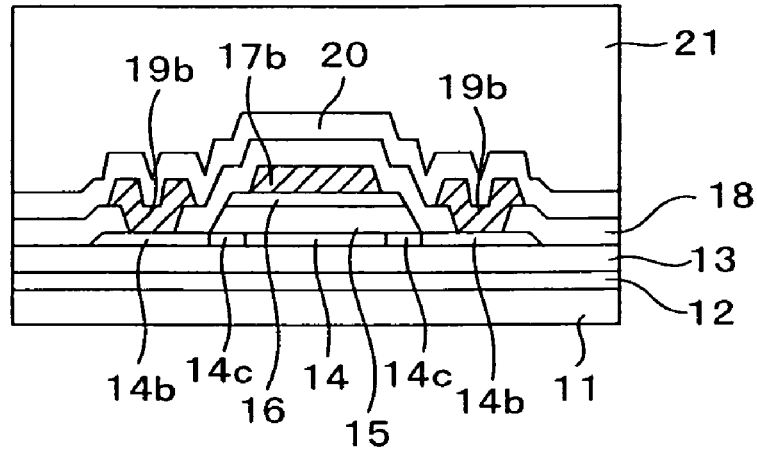
FIG. 1B is a cross-sectional view showing a high voltage drive TFT formed at a display portion of the conventional liquid crystal display panel.
Figure 11A:
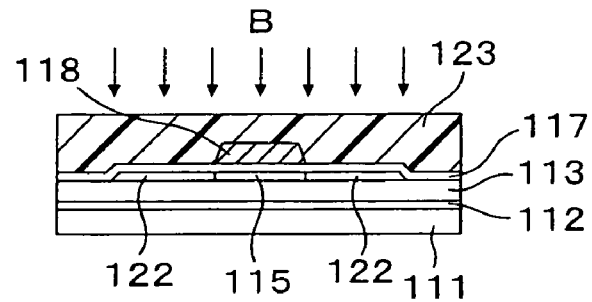
FIG. 11A to FIG. 11D are cross-sectional views (Stage 8) showing the method of manufacturing the thin film transistor device (the liquid crystal display panel) of the first embodiment.
Figure 11B:
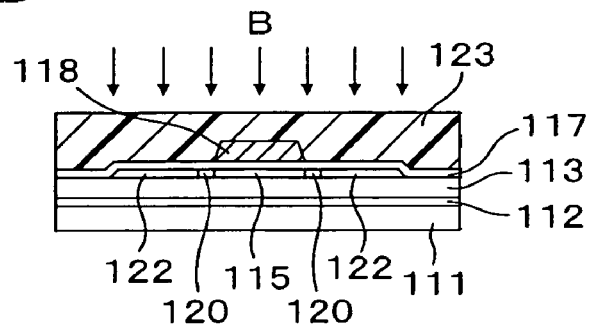
Figure 11C:
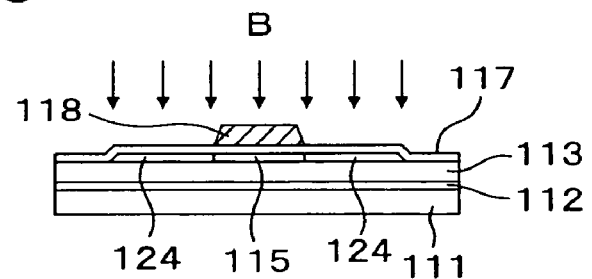
Figure 11D:
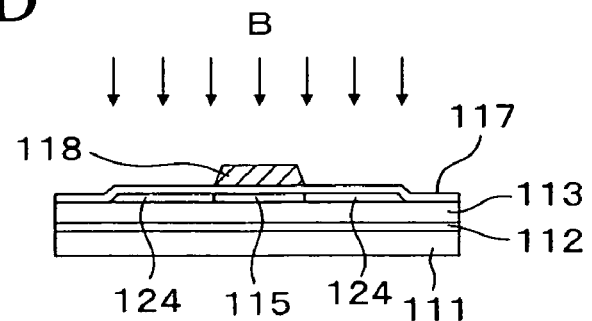
Figure 12A:
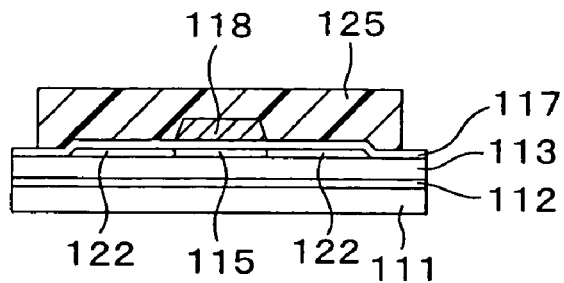
FIG. 12A to FIG. 12D are cross-sectional views (Stage 9) showing the method of manufacturing the thin film transistor device (the liquid crystal display panel) of the first embodiment.
Figure 12B:
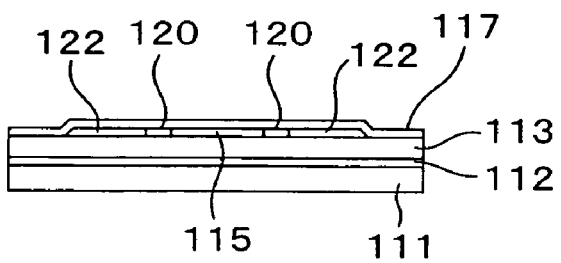
Figure 12C:
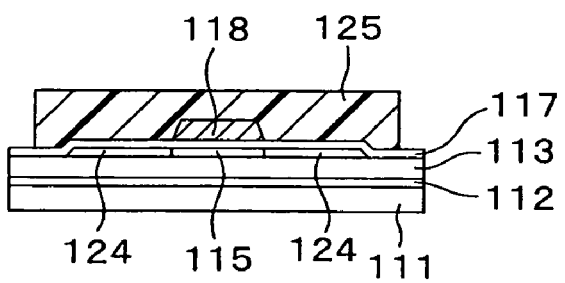
Figure 12D:
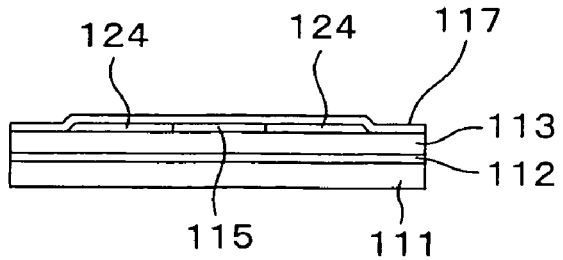
Figure 13A:
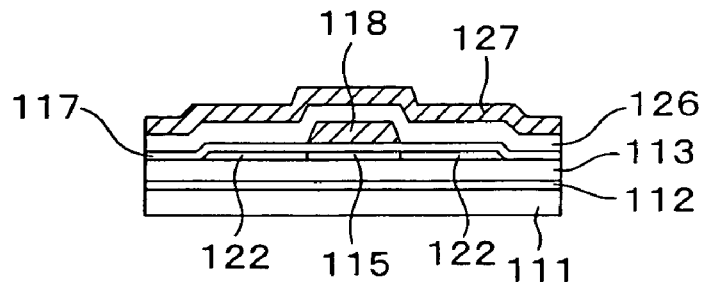
FIG. 13A to FIG. 13D are cross-sectional views (Stage 10) showing the method of manufacturing the thin film transistor device (the liquid crystal display panel) of the first embodiment.
Figure 13B:
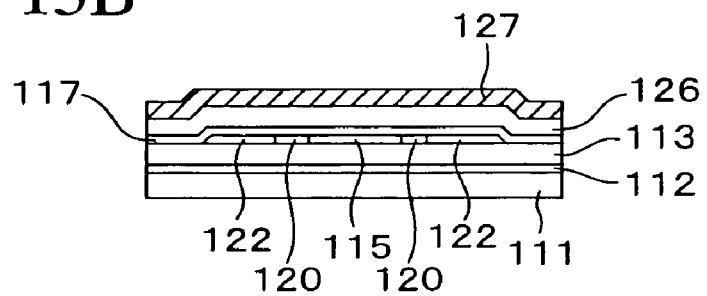
Figure 13C:
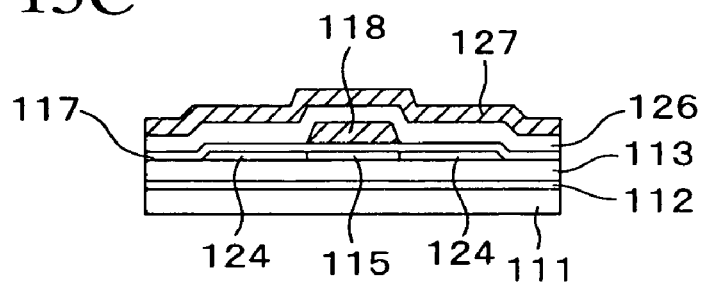
Figure 13D:
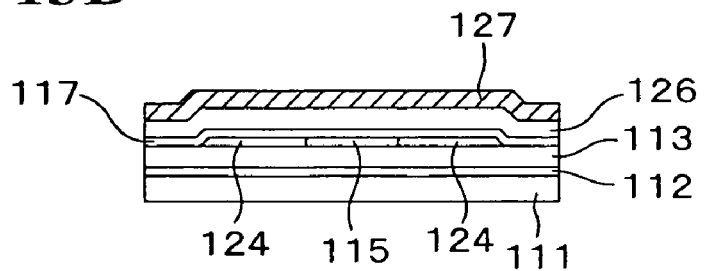
Figure 14A:
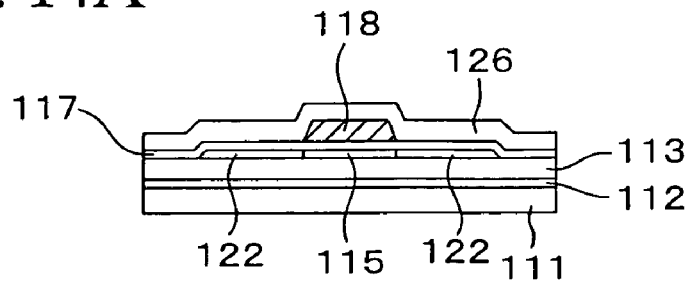
FIG. 14A to FIG. 14D are cross-sectional views (Stage 11) showing the method of manufacturing the thin film transistor device (the liquid crystal display panel) of the first embodiment.
Figure 14B:
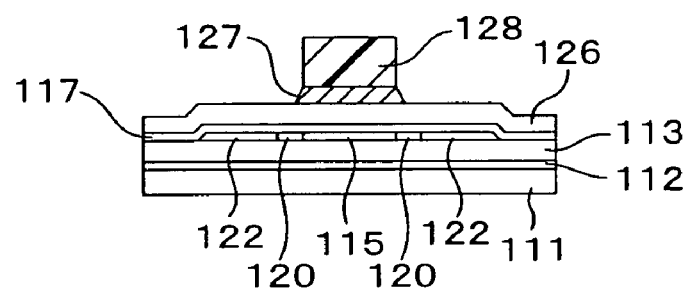
Figure 14C:
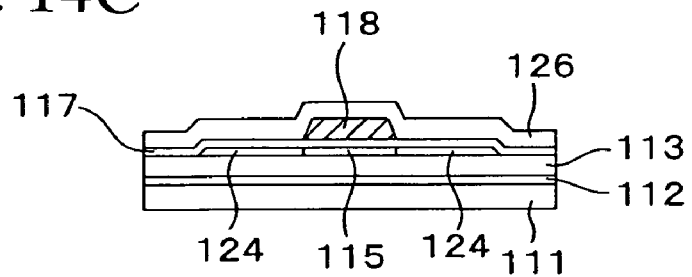
Figure 14D:
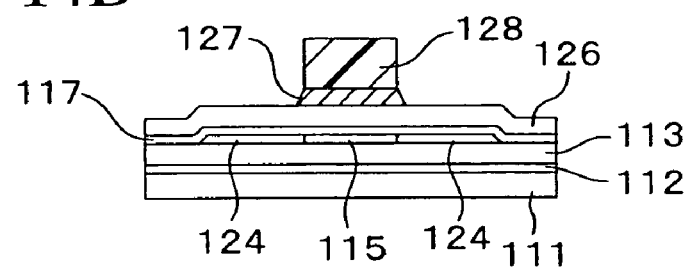
Figure 15A:
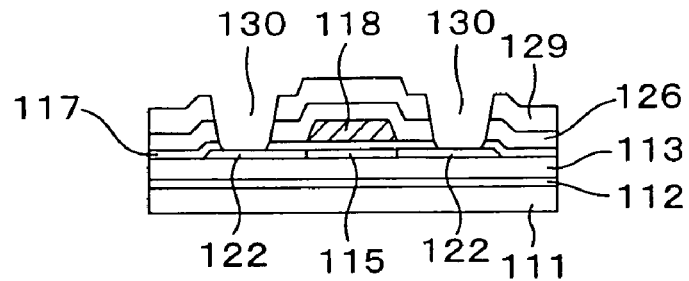
FIG. 15A to FIG. 15D are cross-sectional views (Stage 12) showing the method of manufacturing the thin film transistor device (the liquid crystal display panel) of the first embodiment.
Figure 15B:
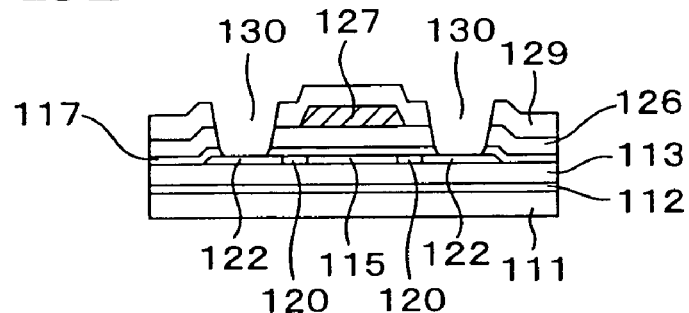
Figure 15C:
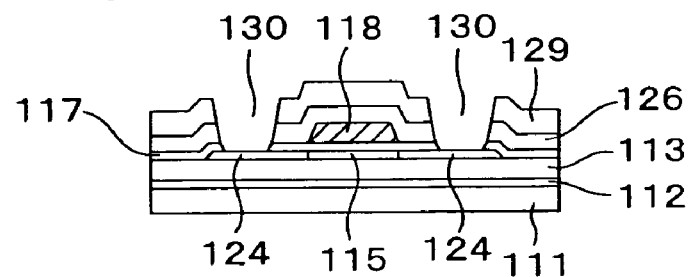
Figure 15D:
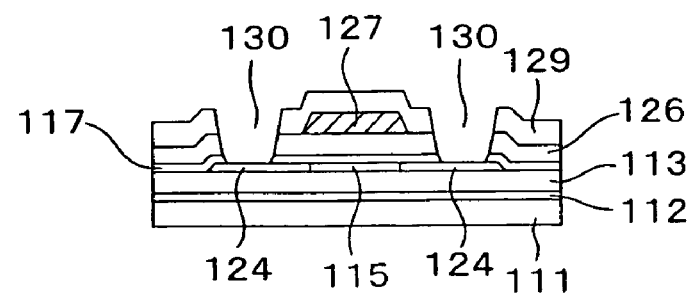
Figure 16A:
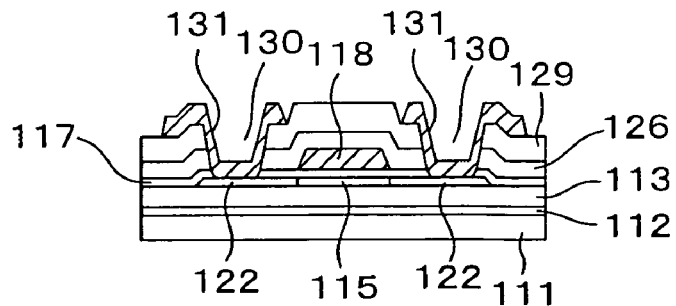
FIG. 16A to FIG. 16D are cross-sectional views (Stage 13) showing the method of manufacturing the thin film transistor device (the liquid crystal display panel) of the first embodiment.
Figure 16B:
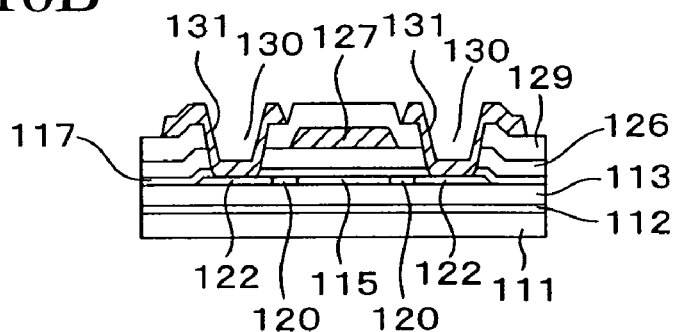
Figure 16C:
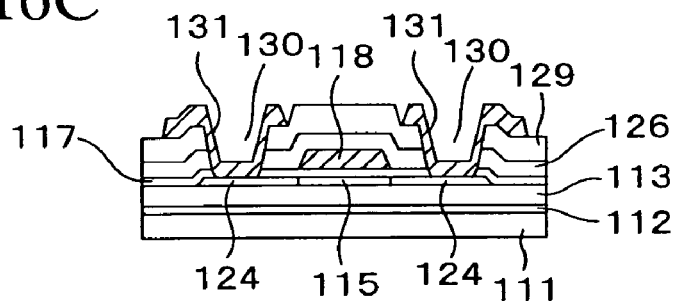
Figure 16D:
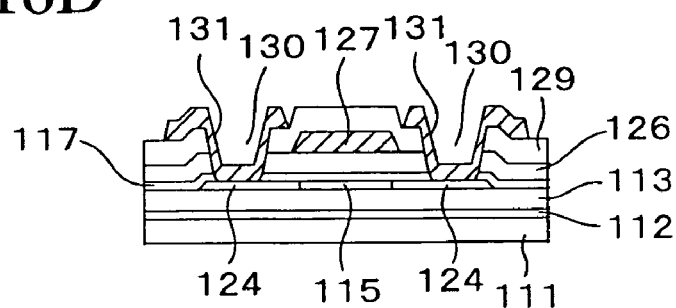

Next, as shown in FIG. 11A to FIG. 1D, the entire n-type high voltage drive TFT forming region and the entire n-type low voltage drive TFT forming region are covered with a photoresist film 123. Then, a p-type impurity (such as boron (B)) is implanted into the polycrystalline silicon film 115 in the p-type high voltage drive TFT forming region and in the p-type low voltage drive TFT forming region in high density, thereby forming a p-type high density impurity region 124 constituting the sources and the drains of the p-type low voltage drive TFT and the p-type high voltage drive TFT. An ion doping device is used for implantation of the p-type impurity, and an acceleration voltage is set to 30 kV and a dosage is set to $2\times10^{15}/cm^2$, for example. Thereafter, the resist film 123 is removed by ashing.

Here, it is possible to change the order between the step shown in FIGS. 10A to 10D and the step shown in FIGS. 11A to 11D.

Next, as shown in FIG. 12A to FIG. 12D, the Mo film 118 in the n-type low voltage drive TFT forming region and in the p-type low voltage drive TFT forming region is covered with a resist film 125. Then, the Mo film 118 in the n-type high voltage drive TFT forming region and in the p-type high voltage drive TFT forming region is etched and removed by use of a phosphoric acid and nitric acid-based etchant. Thereafter, the resist film 125 is removed.

Next, a thermal activation process for activating the impurities introduced to the polycrystalline silicon film 115 is carried out. The impurities are activated by performing a thermal process at a temperature of 500° C. for about 2 hours, for example. This thermal activation process may be carried out in a shorter period by use of a rapid thermal annealing (RTA) device or the like. Note that the impurity activation process may be carried out at any time after formation of the n-type high density impurity region 122 and the p-type high density impurity region 124 and before formation of an Al—Nd film 127 to be described later.

Next, as shown in FIG. 13A to FIG. 13D, a $SiO_2$ film 126 is formed on the entire upper surface of the glass substrate 111 in the thickness of 80 nm, for example, by use of a plasma CVD device, for example. Thereafter, an Al—Nd film 127 is formed on the $SiO_2$ film 126 in the thickness of 300 nm, for example, by use of a sputtering device. Here, instead of the Al—Nd film 127, it is also possible to form a film made of low resistance metal containing any one element of Al, silver (Ag), and copper (Cu) as a main component.

Next, as shown in FIG. 14A to FIG. 14D, a resist film 128 for covering the respective channel regions in the n-type high voltage drive TFT forming region and in the p-type high voltage drive TFT forming region is formed by the photoresist method. Then, the Al—Nd film 127 is etched by use of a phosphoric acid and nitric acid-based etchant while using this resist film 128 as a mask, thereby forming the gate electrodes of the n-type high voltage drive TFT and the p-type high voltage drive TFT. Here, the gate bus lines and the auxiliary capacitor bus lines are formed at the display portion simultaneously with these gate electrodes.

Figure 21A:
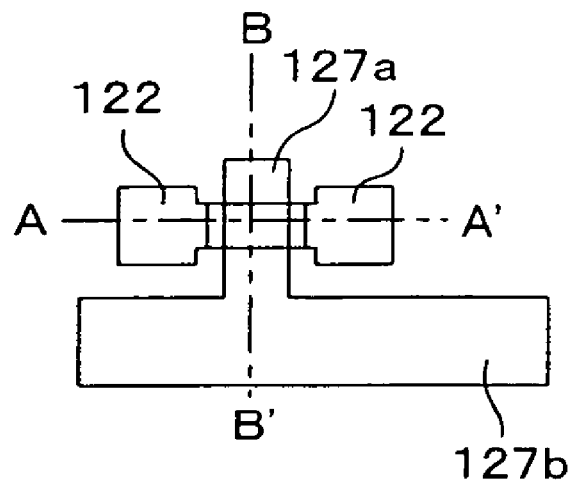
FIG. 21A is a top plan view showing another step in the method of manufacturing the thin film transistor device (the liquid crystal display panel) of the first embodiment.
Figure 21B:
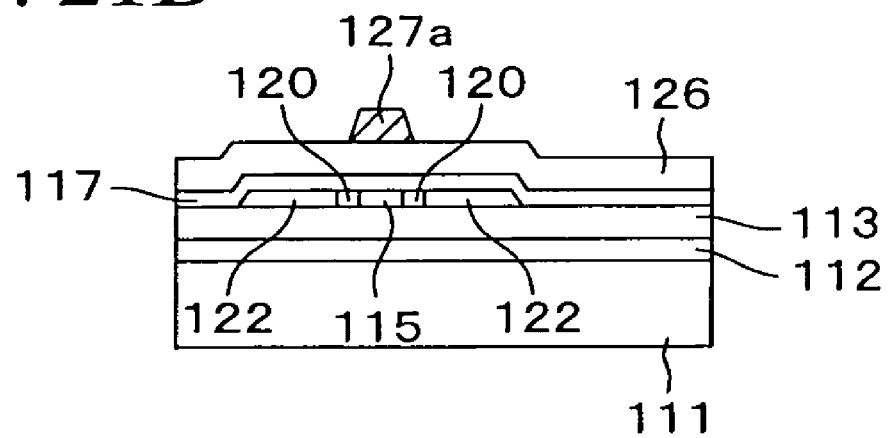
FIG. 21B is a cross-sectional view taken along the A-A' line in FIG. 21A.
Figure 21C:
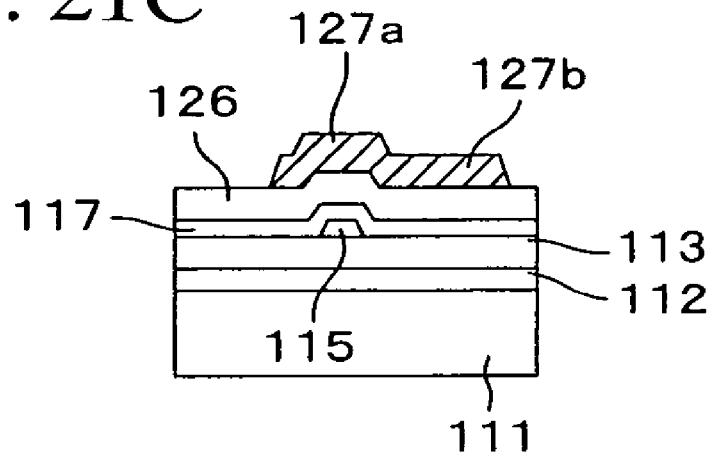
FIG. 21C is a cross-sectional view taken along the B-B' line in FIG. 21A.

FIG. 21A is a top plan view of the high voltage drive TFT forming region of the picture element portion in this case. Meanwhile, FIG. 21B shows a cross section taken along the A-A' line in FIG. 21A, and FIG. 21C shows a cross section taken along the B-B' line in FIG. 21A. As shown in FIG. 21A to FIG. 21C, a gate electrode 127a is formed so as to be connected to a gate bus line 127b. In this case, it is preferable to form the gate electrode 127a so as to cover part of the LDD region (the n-type low density impurity region 120). Here, the high voltage drive TFT may adopt an offset structure including a region not doped with any impurity, which is located between the channel region and the LDD region.

Next, as shown in FIG. 15A to FIG. 15D, a SiN film 129 is formed on the entire upper surface of the glass substrate 111 in the thickness of 370 nm by the plasma CVD method, for example. Thereafter, a resist film (not shown) is formed into a predetermined pattern on the SiN film 129 by the photoresist method. Then, the SiN film 129, the $SiO_2$ film 126, and the $SiO_2$ film 117 are subjected sequentially to dry etching with fluorine-based etching gas while using this resist film as a mask, thereby forming contact holes 130 so as to expose the n-type high density impurity region 122 and the p-type high density impurity region 124. Then, the resist film is removed.

Next, a Ti film in the thickness of 50 nm, an Al film in the thickness of 200 nm, and a Ti film in the thickness of 100 nm are sequentially formed on the entire upper surface of the glass substrate 111 by use of a sputtering device, for example, thereby forming a conductive film having a three-layer structure composed of Ti/Al/Ti. Thereafter, a resist film (not shown) is formed into a predetermined pattern on the conductive film by the photoresist method. Then, the conductive film is subjected to dry etching with chlorine-based etching gas while using this resist film as a mask. Accordingly, source and drain electrodes 131, the data bus lines (not shown), and the auxiliary capacitor electrode (not shown) are formed as shown in FIG. 16A to FIG. 16D. Thereafter, the resist film is removed.

Figure 22A:
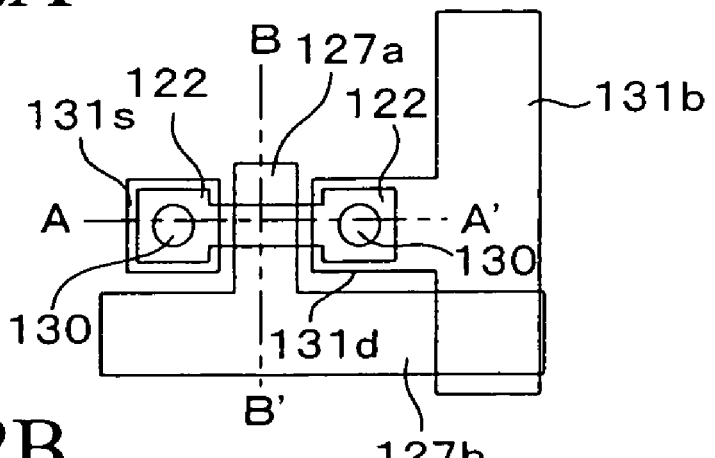
FIG. 22A is a top plan view showing another step in the method of manufacturing the thin film transistor device (the liquid crystal display panel) of the first embodiment.
Figure 22B:
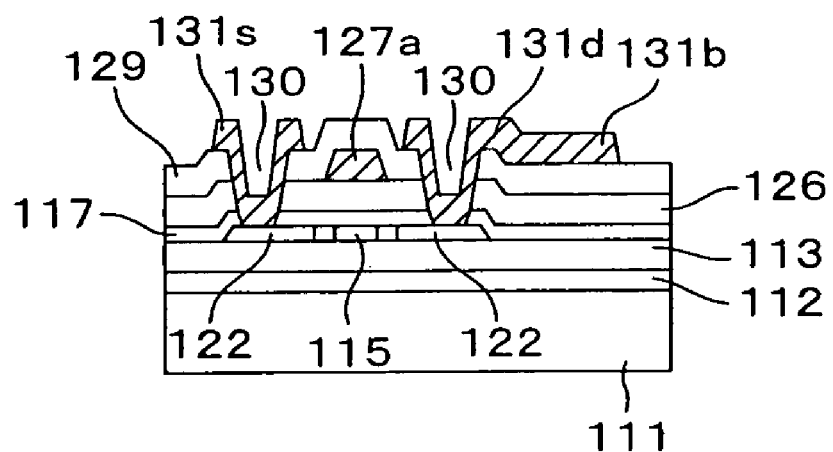
FIG. 22B is a cross-sectional view taken along the A-A' line in FIG. 22A.
Figure 22C:
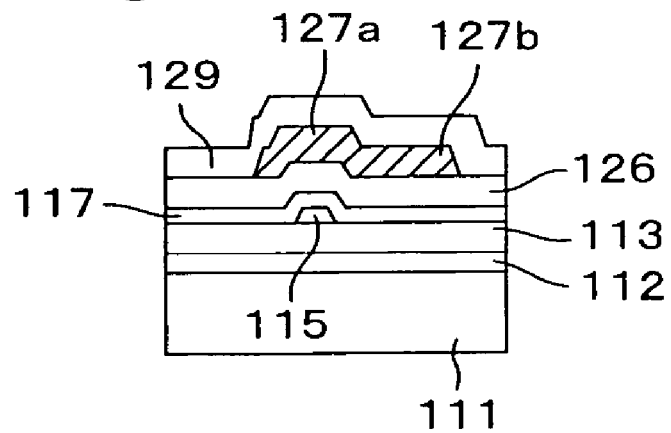
FIG. 22C is a cross-sectional view taken along the B-B' line in FIG. 22A.

FIG. 22A is a top plan view of the high voltage drive TFT forming region of the picture element portion in this case. Meanwhile, FIG. 22B shows a cross section taken along the A-A' line in FIG. 22A, and FIG. 22C shows a cross section taken along the B-B' line in FIG. 22A. As shown in FIG. 22A to FIG. 22C, a drain electrode 131d of the TFT at the display portion is formed so as to be connected to a data bus line 131b. Simultaneously, a pad to be connected to a transparent picture element electrode is formed as a source electrode 131s of the TFT, because it is difficult to maintain linearity as a current characteristic when the polycrystalline silicon film is directly connected to the transparent picture element electrode (such as an ITO film). As a consequence, it is not possible to obtain a sufficient panel performance in such a case.

Figure 17A:
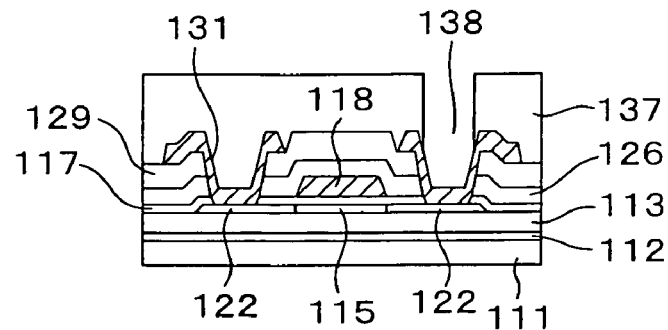
FIG. 17A to FIG. 17D are cross-sectional views (Stage 14) showing the method of manufacturing the thin film transistor device (the liquid crystal display panel) of the first embodiment.
Figure 17B:
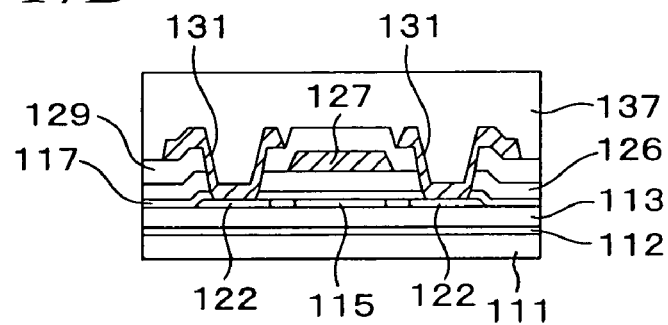
Figure 17C:
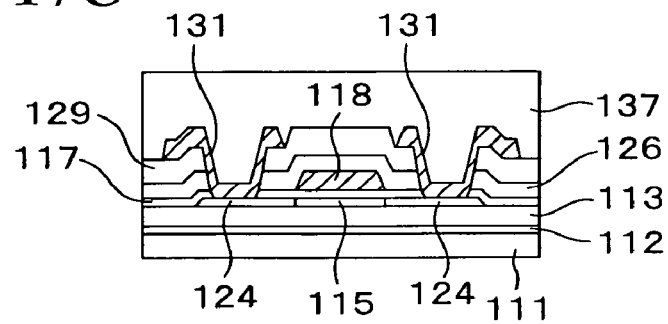
Figure 17D:
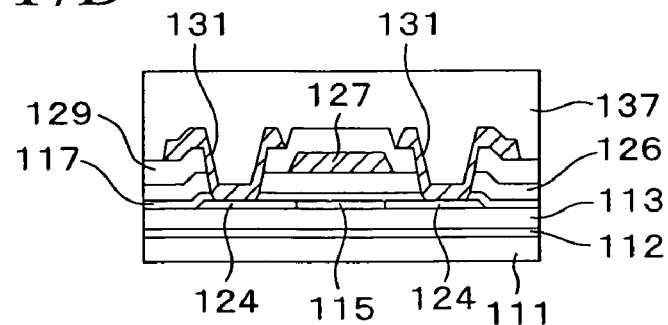
Figure 18A:
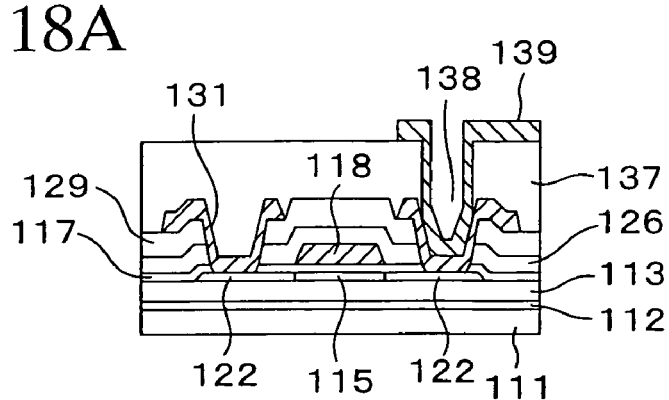
FIG. 18A to FIG. 18D are cross-sectional views (Stage 15) showing the method of manufacturing the thin film transistor device (the liquid crystal display panel) of the first embodiment.
Figure 18B:
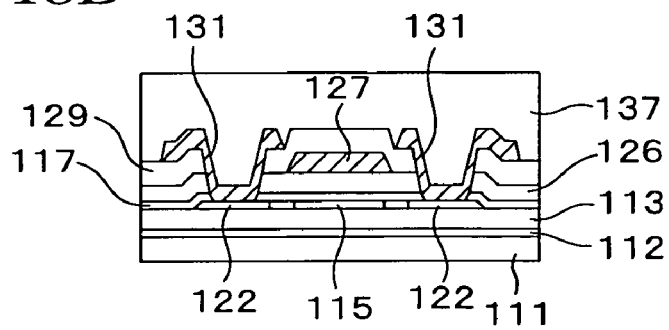
Figure 18C:
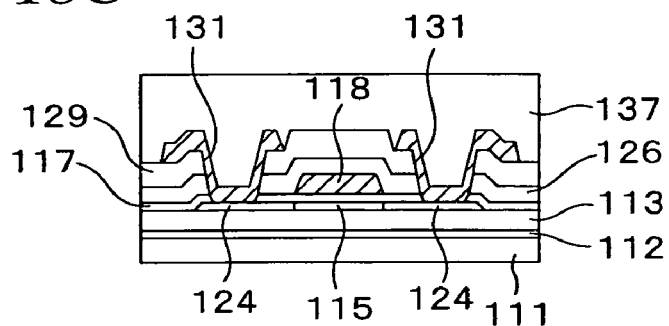
Figure 18D:
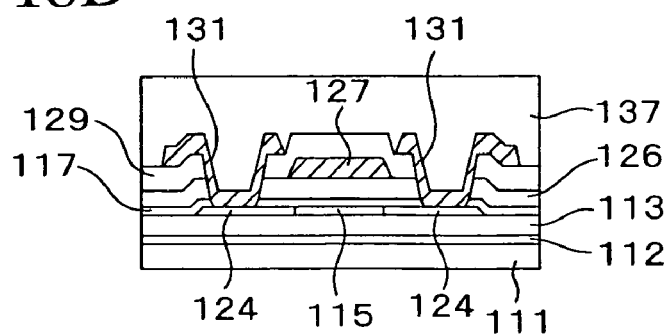

Next, as shown in FIG. 17A to FIG. 17D, an organic insulating film 137 is formed on the entire upper surface of the glass substrate 111 by coating photosensitive transparent organic insulative resin, for example. Thereafter, a contact hole 138 connecting to the source electrode in the TFT forming region of the display portion is formed as shown in FIG. 17A. Subsequently, the organic insulating film 137 is hardened by performing a thermal process.

Here, it is usually unnecessary to form a transparent picture element electrode at the peripheral circuit portion. Therefore, it is not necessary to form a contact hole on the organic insulating film 137. However, in case of providing an inspection terminal for inspecting circuit operations, a contact hole connecting to the inspection terminal may be formed in this step.

Next, an ITO film is formed on the entire upper surface of the glass substrate 111 in the thickness of 70 nm, for example, by use of a sputtering device. This ITO film is electrically connected to the n-type high density impurity region 122 (a source region) of the TFT in the display region through the contact hole 138. Then, after forming a resist film into a predetermined pattern on this ITO film by the photoresist method, the ITO film is subjected to wet etching. Accordingly, a transparent picture element electrode 139 is formed as shown in FIG. 18A to FIG. 18D. Thereafter, the resist film is removed.

Figure 23A:
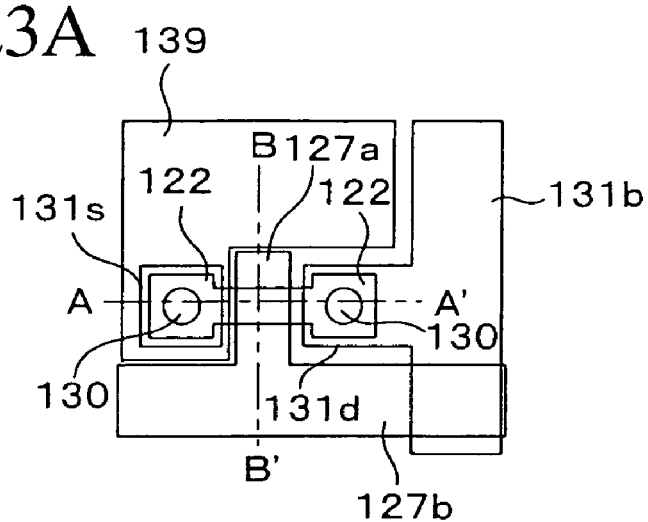
FIG. 23A is a top plan view showing another step in the method of manufacturing the thin film transistor device (the liquid crystal display panel) of the first embodiment.
Figure 23B:
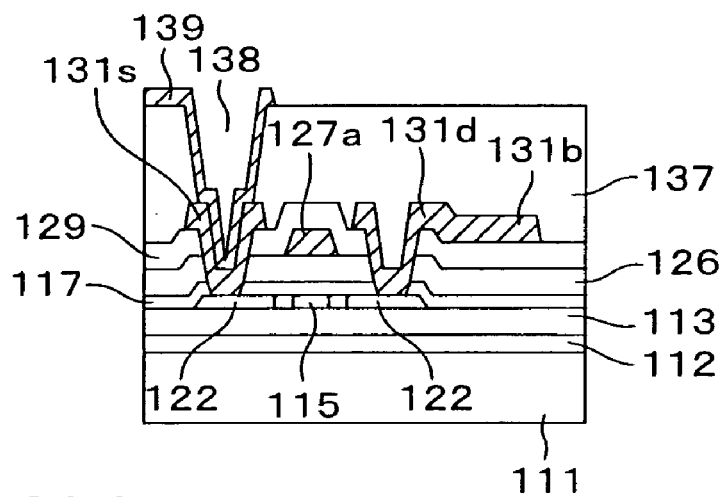
FIG. 23B is a cross-sectional view taken along the A-A' line in FIG. 23A.
Figure 23C:
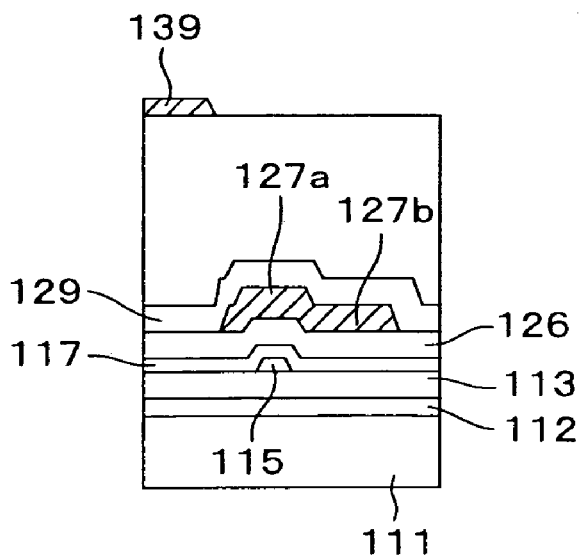
FIG. 23C is a cross-sectional view taken along the B-B' line in FIG. 23A.
Figure 24A:
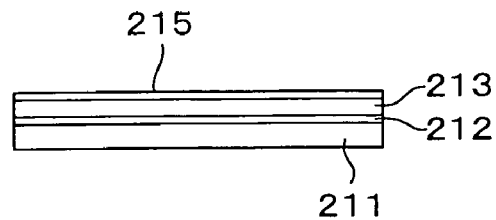
FIG. 24A to FIG. 24D are cross-sectional views (Stage 1) showing a method of manufacturing a thin film transistor device (a liquid crystal display panel) of a second embodiment.
Figure 24B:
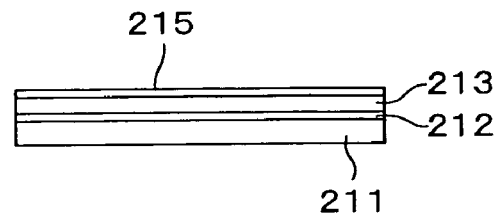
Figure 24C:
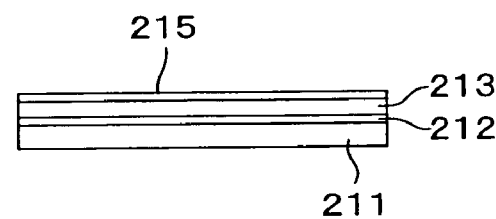
Figure 24D:
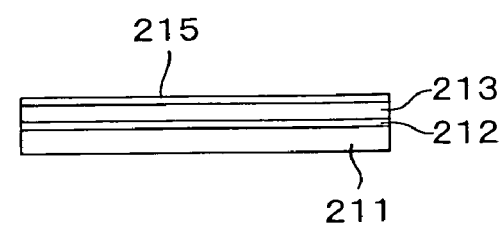
Figure 25A:
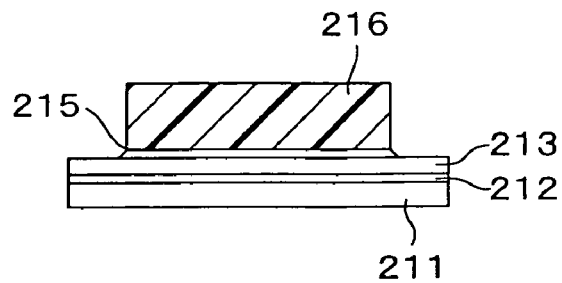
FIG. 25A to FIG. 25D are cross-sectional views (Stage 2) showing the method of manufacturing the thin film transistor device (the liquid crystal display panel) of the second embodiment.
Figure 25B:
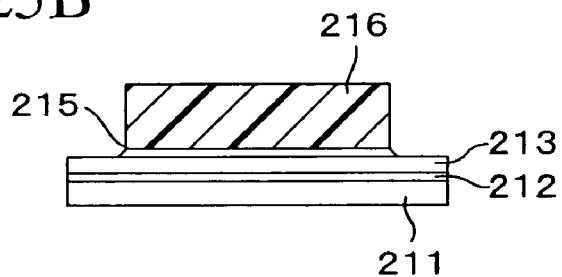
Figure 25C:
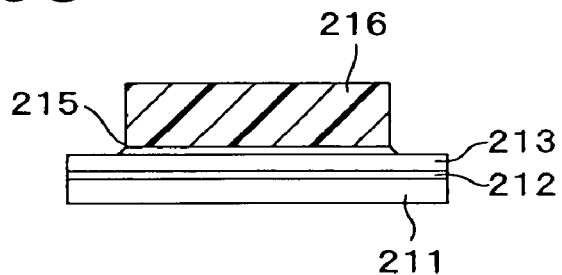
Figure 25D:
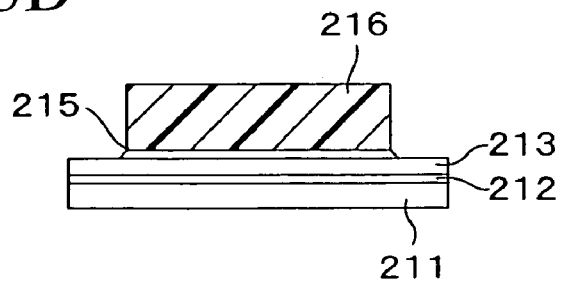
Figure 26A:
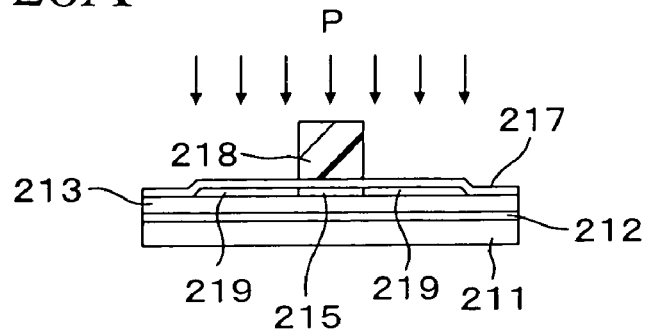
FIG. 26A to FIG. 26D are cross-sectional views (Stage 3) showing the method of manufacturing the thin film transistor device (the liquid crystal display panel) of the second embodiment.
Figure 26B:
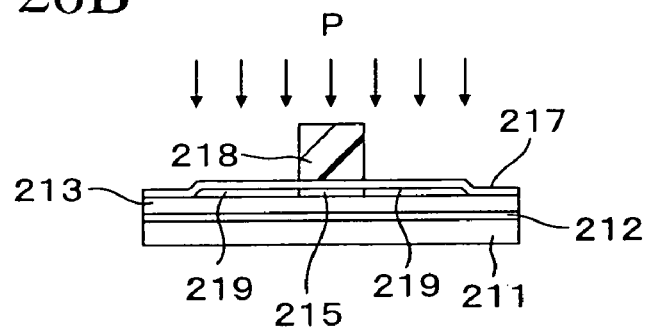
Figure 26C:
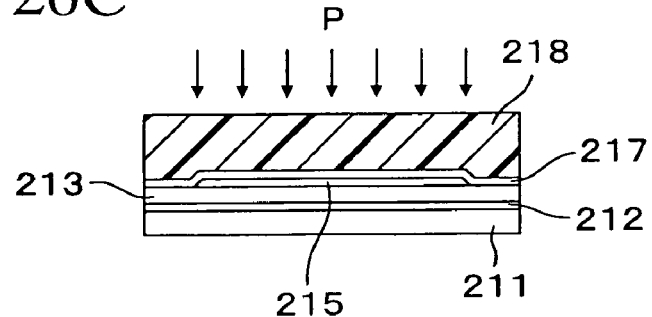
Figure 26D:
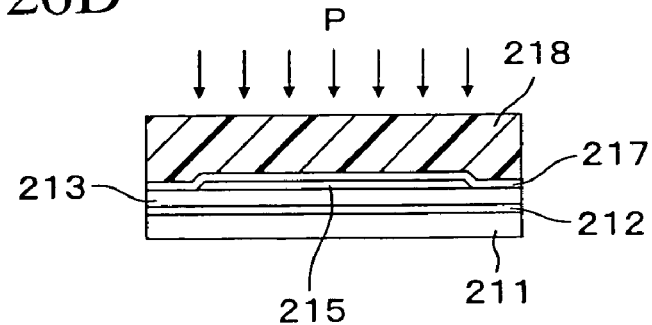
Figure 27A:
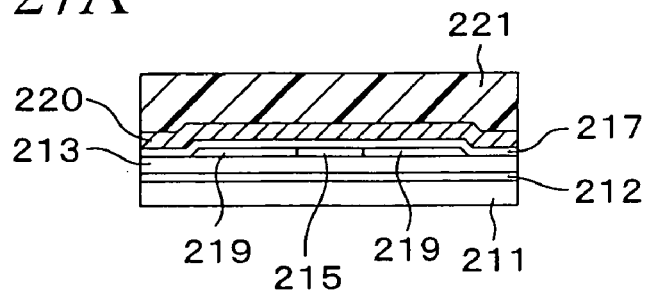
FIG. 27A to FIG. 27D are cross-sectional views (Stage 4) showing the method of manufacturing the thin film transistor device (the liquid crystal display panel) of the second embodiment.
Figure 27B:
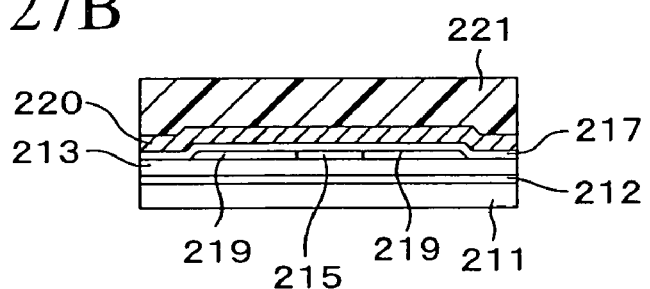
Figure 27C:
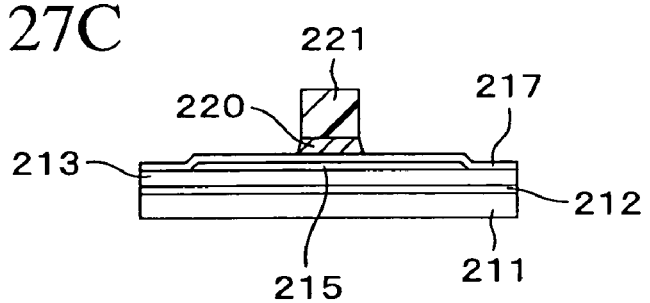
Figure 27D:
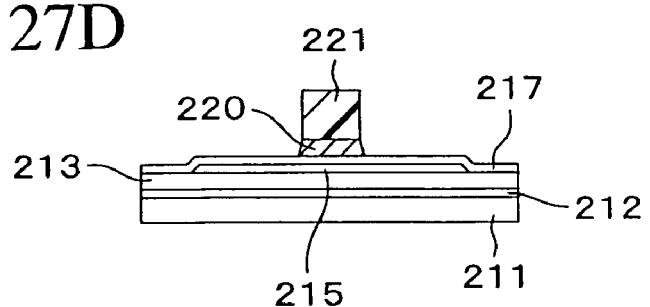
Figure 28A:
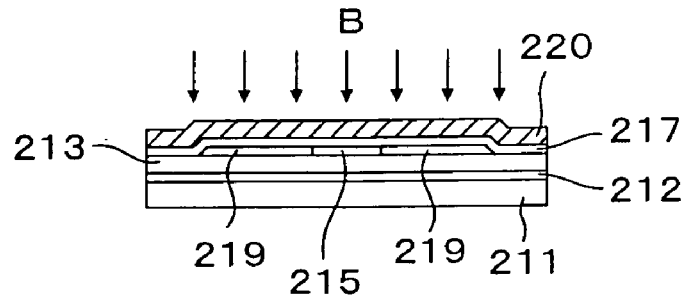
FIG. 28A to FIG. 28D are cross-sectional views (Stage 5) showing the method of manufacturing the thin film transistor device (the liquid crystal display panel) of the second embodiment.
Figure 28B:
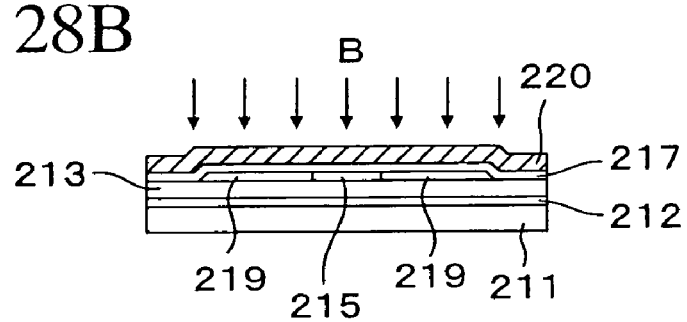
Figure 28C:
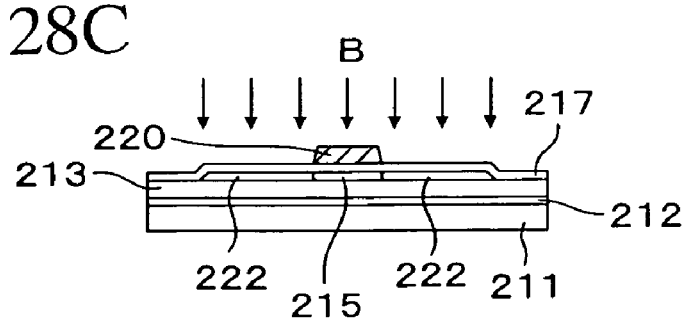
Figure 28D:
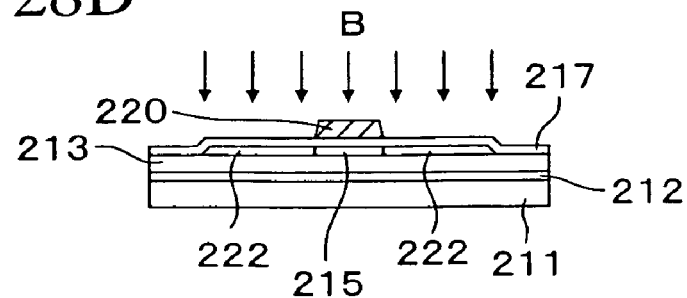
Figure 29A:
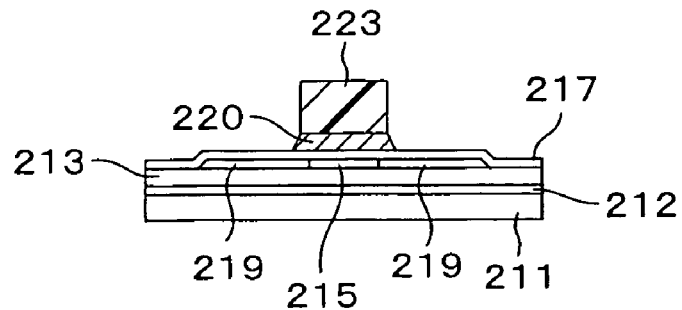
FIG. 29A to FIG. 29D are cross-sectional views (Stage 6) showing the method of manufacturing the thin film transistor device (the liquid crystal display panel) of the second embodiment.
Figure 29B:
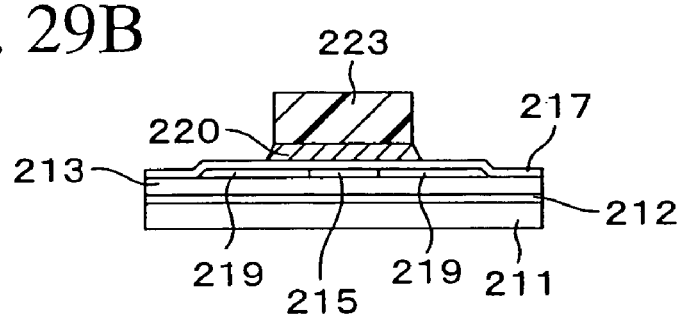
Figure 29C:
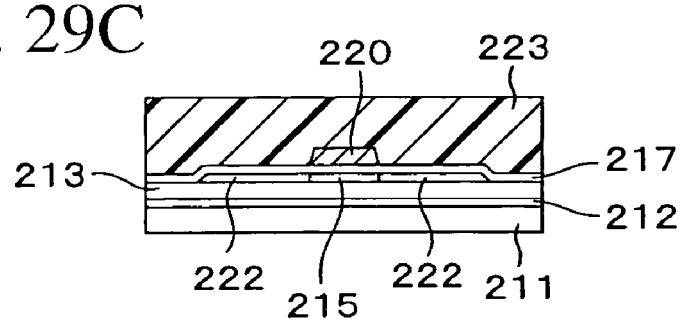
Figure 29D:
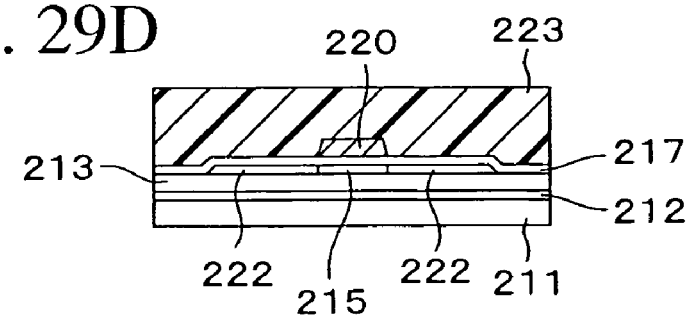
Figure 30A:
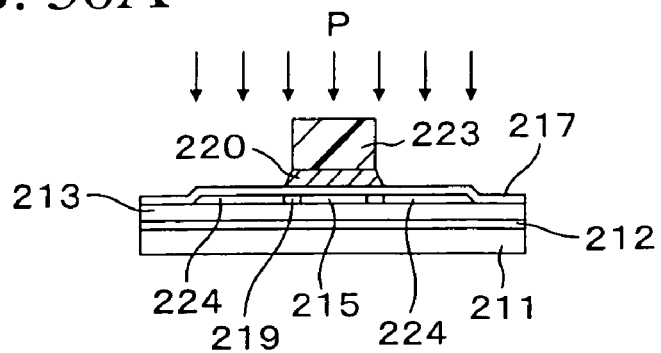
FIG. 30A to FIG. 30D are cross-sectional views (Stage 7) showing the method of manufacturing the thin film transistor device (the liquid crystal display panel) of the second embodiment.
Figure 30B:
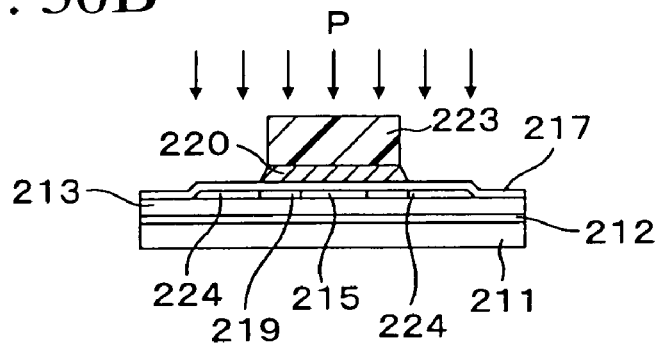
Figure 30C:
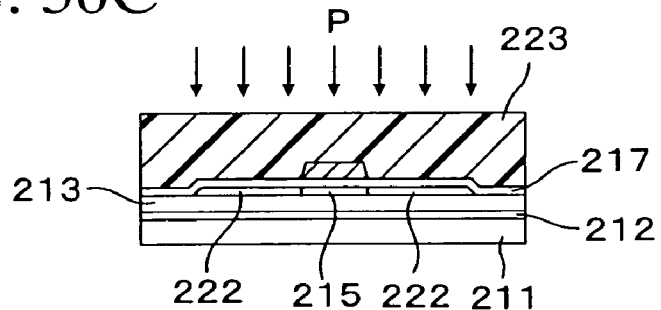
Figure 30D:
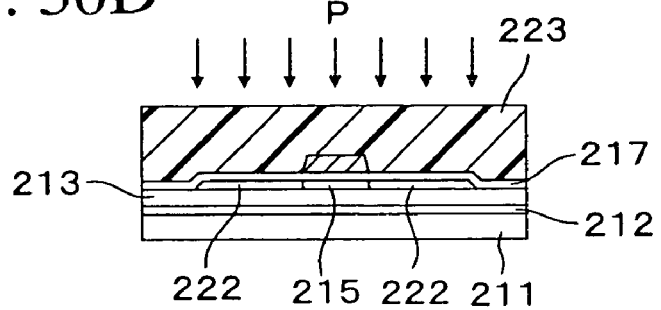
Figure 31A:
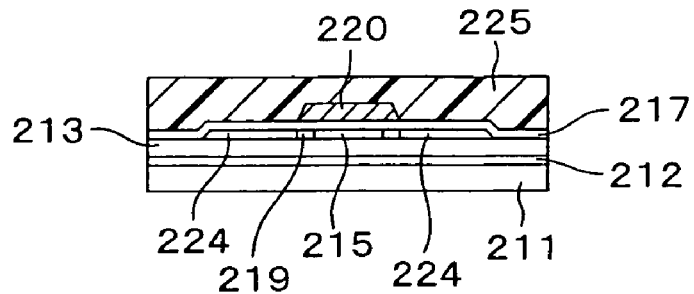
FIG. 31A to FIG. 31D are cross-sectional views (Stage 8) showing the method of manufacturing the thin film transistor device (the liquid crystal display panel) of the second embodiment.
Figure 31B:
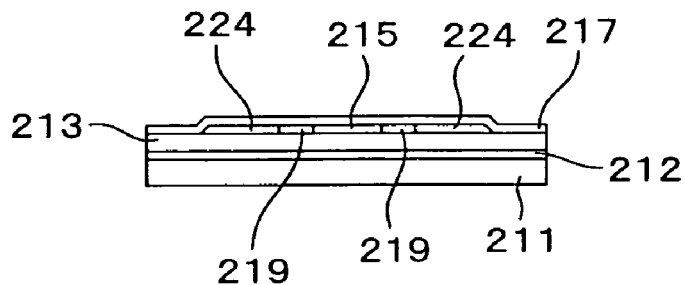
Figure 31C:
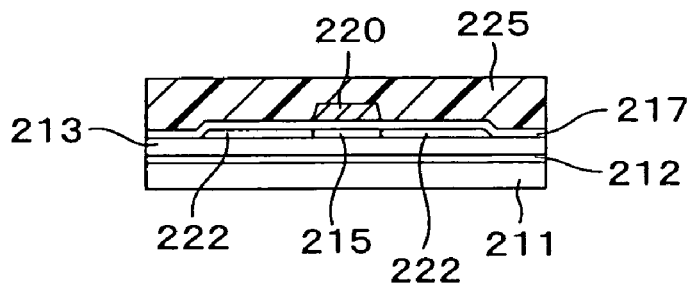
Figure 31D:
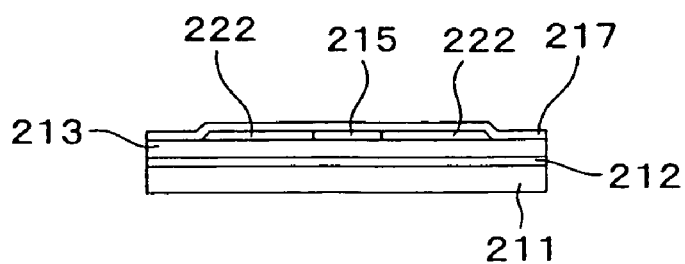
Figure 32A:
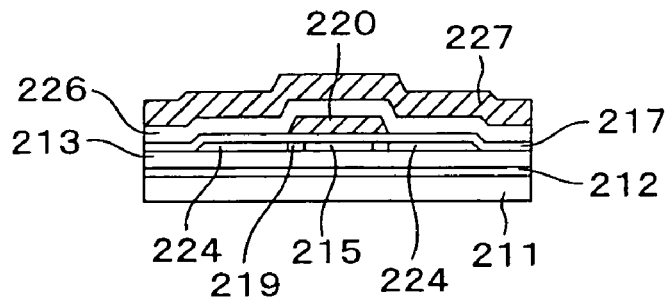
FIG. 32A to FIG. 32D are cross-sectional views (Stage 9) showing the method of manufacturing the thin film transistor device (the liquid crystal display panel) of the second embodiment.
Figure 32B:
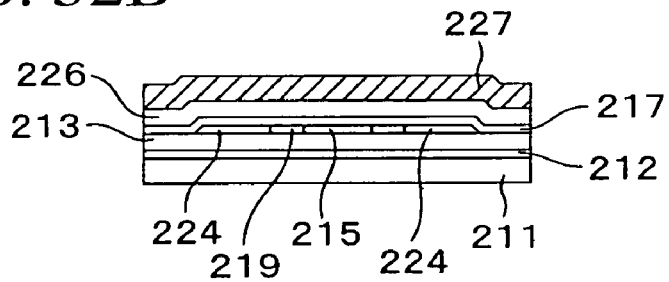
Figure 32C:
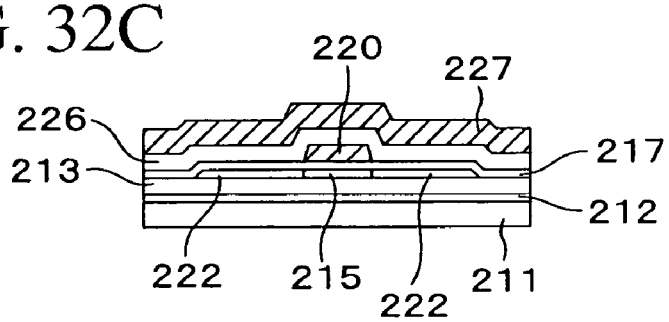
Figure 32D:
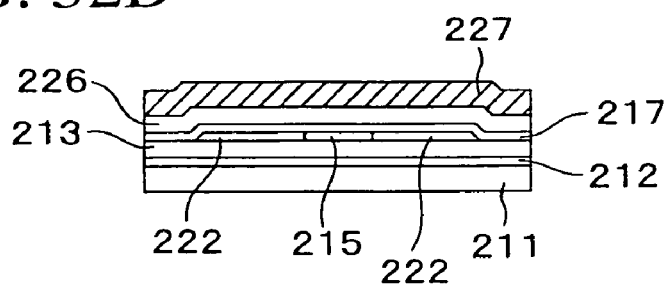
Figure 33A:
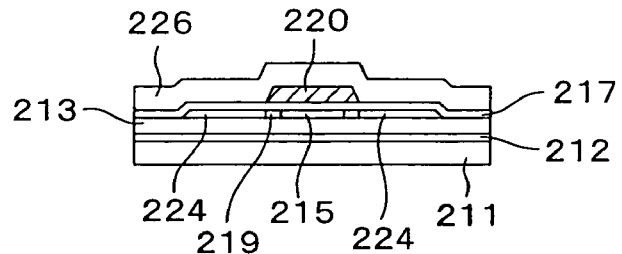
FIG. 33A to FIG. 33D are cross-sectional views (Stage 10) showing the method of manufacturing the thin film transistor device (the liquid crystal display panel) of the second embodiment.
Figure 33B:
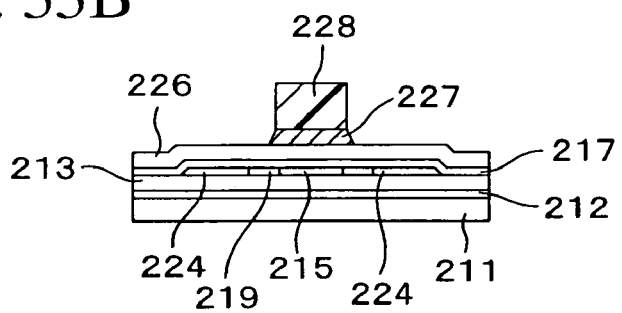
Figure 33C:
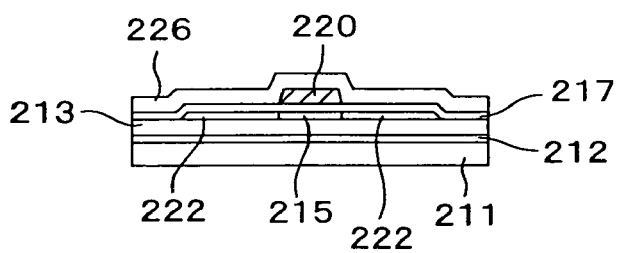
Figure 33D:
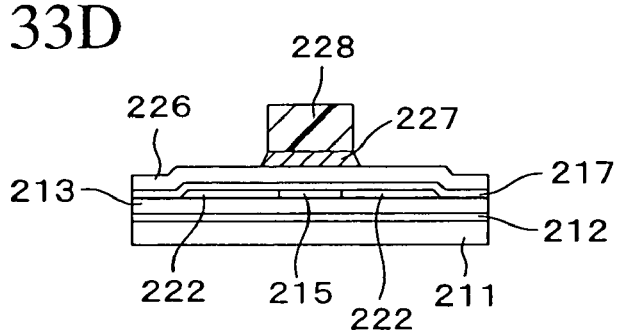
Figure 34A:
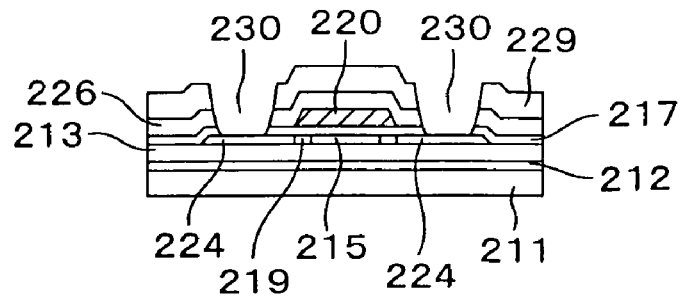
FIG. 34A to FIG. 34D are cross-sectional views (Stage 11) showing the method of manufacturing the thin film transistor device (the liquid crystal display panel) of the second embodiment.
Figure 34B:
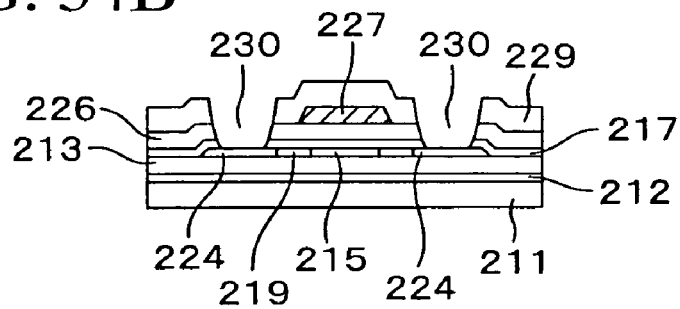
Figure 34C:
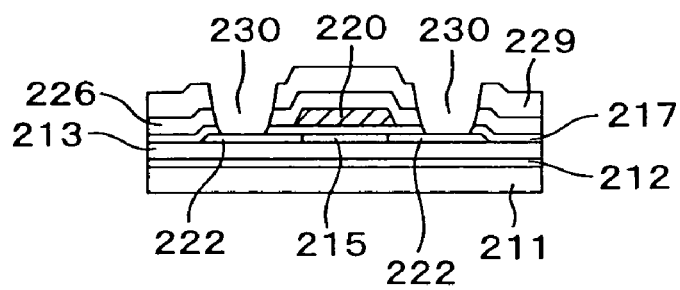
Figure 34D:
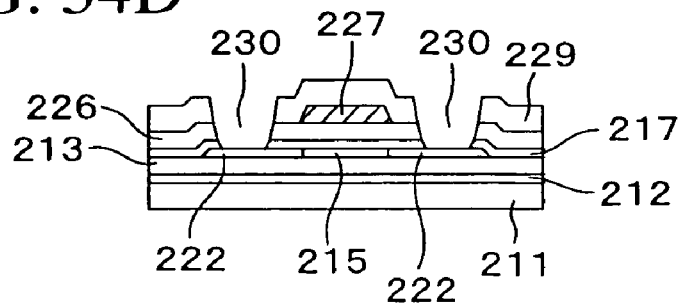
Figure 35A:
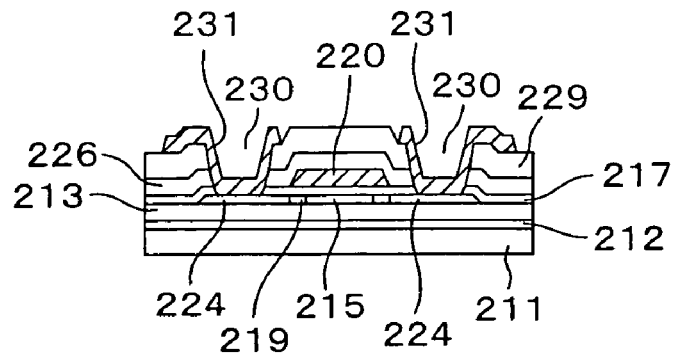
FIG. 35A to FIG. 35D are cross-sectional views (Stage 12) showing the method of manufacturing the thin film transistor device (the liquid crystal display panel) of the second embodiment.
Figure 35B:
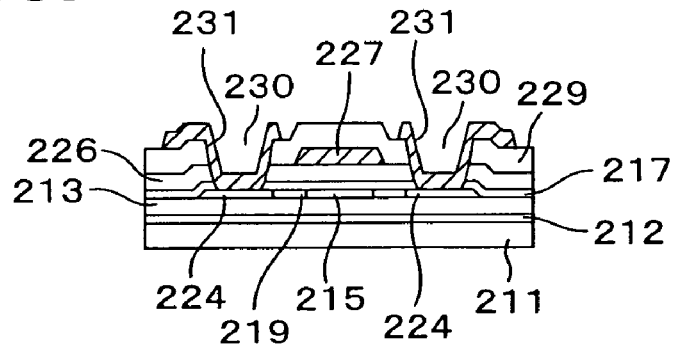
Figure 35C:
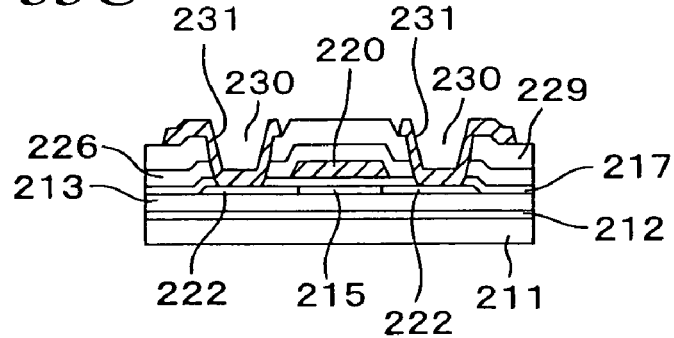
Figure 35D:
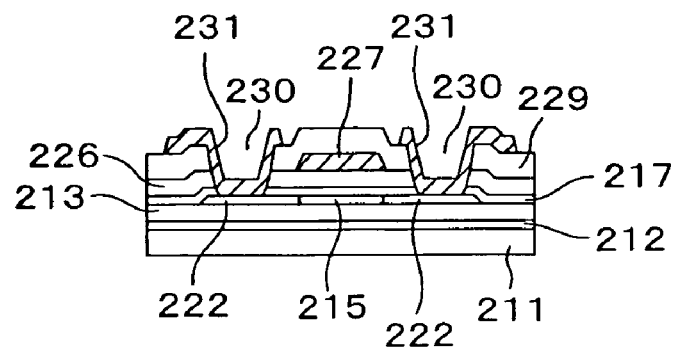

FIG. 23A is a top plan view of the high voltage drive TFT forming region of the picture element portion in this case. Meanwhile, FIG. 23B shows a cross section taken along the A-A' line in FIG. 23A, and FIG. 23C shows a cross section taken along the B-B' line in FIG. 23A. As shown in FIG. 23A to FIG. 23C, the picture element electrode 139 is electrically connected to the source electrode 131s of the TFT through the contact hole 138.

Here, in terms of FIG. 23A to FIG. 23C, the gate bus line 127b, the data bus line 131b, the gate electrode 127a, the source electrode 131s, and the drain electrode 131d correspond to the gate bus line 109, the data bus line 108, the gate electrode 105g, the source electrode 105s, and the drain electrode 105d shown in FIG. 3A and FIG. 3B, respectively. Meanwhile, the SiO$_2$ films 117 and 126, the SiN film 129, and the organic insulating film 137 in FIG. 23A to FIG. 23C correspond to the first insulating film 171, the second insulating film 172, and the third insulating film 173 in FIG. 3B, respectively.

In this way, the thin film transistor device (the liquid crystal display panel) of this embodiment is finished.

Here, to enhance the characteristics of the TFTs, it is preferable to perform a hydrogenation process after the thermal activation process so as to introduce hydrogen to the polycrystalline silicon film 115. Such a hydrogenation process may be carried out either by performing a thermal process at a temperature of 350° C. in the atmosphere after formation of the SiN film 129 or by performing a thermal process at a temperature in a range from 300° C. to 400° C. and in a H$_2$—N$_2$ atmosphere, for example.

In the above-described first embodiment, the gate electrode of the low voltage drive TFT is made of the high melting point metal (Mo). Meanwhile, the gate electrode of the high voltage drive TFT and the gate bus lines are made of the low resistance Al—Nd film. Moreover, the source electrode and the drain electrode of the high voltage drive TFT, and the data bus lines are made of the low resistance Ti/Al/Ti laminated film as well. Therefore, even when manufacturing a large-sized liquid crystal display panel, it is possible to manufacture a peripheral circuit integrated liquid crystal display panel suppressing damping of signals flowing on the gate bus lines and the data bus lines, having high reliability, and reducing power consumption.

Meanwhile, in this embodiment, the low melting point metal film such as Al—Nd is not formed yet when the impurities implanted into the polycrystalline silicon film 115 are subjected to the activation process. For this reason, it is possible to activate the impurities by the thermal activation process and thereby to form more reliable TFTs than the case of activating the impurities by a laser activation process.

In this embodiment, the impurities are implanted into the polycrystalline silicon film 115 prior to formation of the gate electrode of the n-type high voltage drive TFT. Accordingly, the n-type high voltage drive TFT does not include the LDD region, and therefore adopts either a structure of the gate electrode overlapping part of the n-type high density impurity region (a gate overlap structure: hereinafter also referred to as a GOLD structure) or a structure including an offset region. To improve reliability while maintaining on-resistance, it is preferable to adopt the GOLD structure. Moreover, in this embodiment, the n-type low voltage drive TFT and the p-type low voltage drive TFT adopt a structure not including the LDD region.

Second Embodiment

FIG. 24A to FIG. 37D are cross-sectional views showing a method of manufacturing a thin film transistor device (a liquid crystal display panel) according to a second embodiment of the present invention sequentially in the order of the steps. Throughout FIG. 24A to FIG. 37D, a drawing marked with a suffix A shows a cross section in an n-type low voltage drive TFT forming region, a drawing marked with a suffix B shows a cross section in an n-type high voltage drive TFT forming region, a drawing marked with a suffix C shows a cross section in a p-type low voltage drive TFT forming region, and a drawing marked with a suffix D shows a cross section in a p-type high voltage drive TFT forming region. In this embodiment, an entire configuration of the liquid crystal display panel is basically the same as the first embodiment shown in FIG. 2. Accordingly, description of the overlapping constituents will be omitted.

Firstly, as shown in FIG. 24A to FIG. 24D, a SiN film 212 in the thickness of 50 nm, for example, is formed on a glass substrate (a transparent insulative substrate) 211, and a SiO$_2$ film 213 in the thickness of 200 nm is further formed thereon to constitute a base film collectively. Then, a polycrystalline silicon film 215 is formed on the SiO$_2$ film 213 by a similar method to the first embodiment.

Next, as shown in FIG. 25A to FIG. 25D, a resist film 216 is formed on the TFT forming regions of the polycrystalline silicon film 215 by the photoresist method. Then, the polycrystalline silicon film 215 is subjected to dry etching with fluorine-based etching gas while using this resist film 216 as a mask. Thereafter, the resist film 216 is removed.

Next, as shown in FIG. 26A to FIG. 26D, a SiO$_2$ film 217 constituting a gate insulating film of the low voltage drive TFT is formed in the thickness of 30 nm on the entire upper surface of the glass substrate 211 by use of a plasma CVD device, for example. Then, a resist film 218 is formed into a predetermined pattern on the SiO$_2$ film 217 by the photoresist method. Regions constituting channels of the n-type low voltage drive TFT and the n-type high voltage drive TFT, the entire p-type low voltage drive TFT forming region, and the entire p-type high voltage drive TFT forming region are protected by this resist film 218.

Next, an n-type low density impurity region 219 constituting LDD regions of the n-type low voltage drive TFT and the n-type high voltage drive TFT is formed by implanting an n-type impurity (such as P) into the polycrystalline silicon film 215 in the n-type low voltage drive TFT forming region and in the n-type high voltage drive TFT forming region in low density through the SiO$_2$ film 217. An ion doping device is used for implantation of the n-type impurity, and an acceleration voltage is set to 30 kV and a dosage is set to $10^{14}/cm^2$, for example. Thereafter, the resist film 218 is removed.

Here, it is also possible to form the $SiO_2$ film 217 by forming the resist film directly on the polycrystalline silicon film 215, then implanting the n-type impurity into the polycrystalline silicon film 215 in the n-type low voltage drive TFT forming region and in the p-type high voltage drive TFT forming region, and then removing the resist film.

Figure 38A:
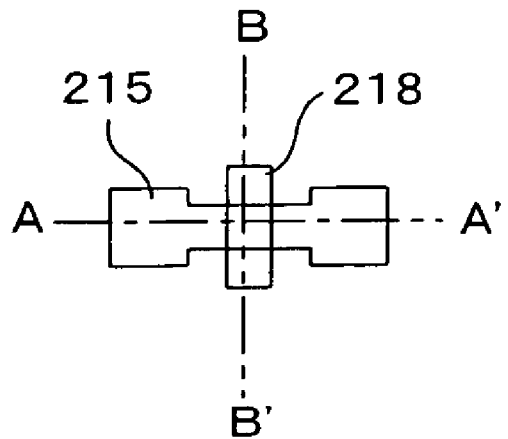
FIG. 38A is a top plan view showing a step in the method of manufacturing the thin film transistor device (the liquid crystal display panel) of the second embodiment.
Figure 38B:
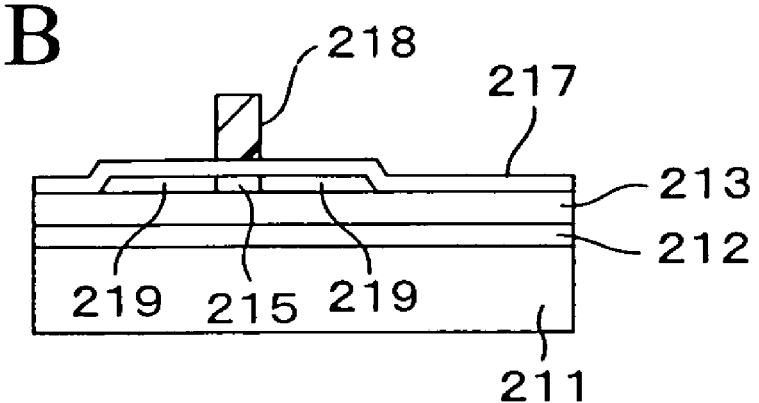
FIG. 38B is a cross-sectional view taken along the A-A' line in FIG. 38A.
Figure 38C:
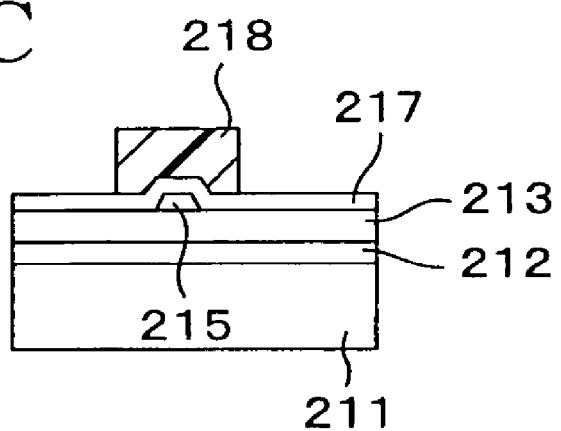
FIG. 38C is a cross-sectional view taken along the B-B' line in FIG. 38A.

FIG. 38A is a top plan view of the high voltage drive TFT (the n-type TFT) forming region of a picture element portion in this case. Meanwhile, FIG. 38B shows a cross section taken along the A-A' line in FIG. 38A, and FIG. 38C shows a cross section taken along the B-B' line in FIG. 38A. As shown in FIG. 38A to FIG. 38C, the polycrystalline silicon film 215 is formed into the shape having wider widths at both ends and a narrower width at a central portion. Meanwhile, the resist film 218 is formed into the shape perpendicularly crossing the central portion of the polycrystalline silicon film 215.

Next, as shown in FIG. 27A to FIG. 27D, a Mo film 220 constituting the gate electrode of the low voltage drive TFT is formed in the thickness of 300 nm on the $SiO_2$ film 217. Here, instead of the Mo film 220, it is also possible to form a metallic film containing other high melting point metal such as Ti, Cr, W or Ta as a main component.

Next, a resist film 221 for covering the entire n-type low voltage drive TFT forming region, the entire n-type high voltage drive TFT forming region, a region for forming the gate electrode of the p-type low voltage drive TFT, and a region for forming the gate electrode of the p-type high voltage drive TFT is formed by the photoresist method. Then, the Mo film 220 is subjected to dry etching by use of fluorine-based etching gas. The etching of the Mo film 118 may be carried out by means of wet etching with a phosphoric acid and nitric acid-based etchant, for example.

Next, after removing the resist film 221, the polycrystalline silicon film 215 in the p-type low voltage drive TFT forming region and in the p-type high voltage drive TFT forming region is subjected to ion implantation of a p-type impurity (such as B) as shown in FIG. 28A to FIG. 28D, thereby forming a p-type high density impurity region 222 constituting the sources and the drains of the p-type low voltage drive TFT and the p-type high voltage drive TFT. An ion doping device is used for implantation of the p-type impurity, and an acceleration voltage is set to 30 kV and a dosage is set to $10^{15}/cm^2$, for example. At this time, the Mo film 220 functions as a mask. Accordingly, the p-type impurity is not implanted into the polycrystalline silicon film 215 in the n-type low voltage drive TFT forming region and in the n-type high voltage drive TFT forming region.

Here, description has been made on the case of performing the ion implantation of the p-type impurity into the polycrystalline silicon film 215 after removing the resist film 221. However, it is also possible to remove the resist film 221 after implanting the p-type impurity into the polycrystalline silicon film 215. In this case, it is also possible to form an offset region utilizing a difference in width between the resist film 221 and the Mo film 220 by overetching the Mo film 220 and thereby forming the width of the Mo film 220 narrower than the width of the resist film 221 in the p-type low voltage drive TFT forming region and in the p-type high voltage drive TFT forming region.

Next, as shown in FIG. 29A to FIG. 29D, a resist film 223 is formed into a predetermined pattern by the photoresist method. This resist film 223 covers the Mo film 220 above the channel region of the n-type low voltage drive TFT, the Mo film 220 above the channel region and the LDD region of the n-type high voltage drive TFT, the entire p-type low voltage drive TFT forming region, and the entire p-type high voltage drive TFT forming region. Thereafter, the Mo film 220 is subjected to wet etching with a phosphoric acid and nitric acid-based etchant while using this photoresist film 223 as a mask.

Next, as shown in FIG. 30A to FIG. 30D, the polycrystalline silicon film 215 in the n-type low voltage drive TFT forming region and in the n-type high voltage drive TFT forming region is subjected to ion implantation of high density of an n-type impurity (such as P), thereby forming an n-type high density impurity region 224 constituting the sources and the drains of the n-type low voltage drive TFT and the n-type high voltage drive TFT. An ion doping device is used for implantation of the n-type impurity, and an acceleration voltage is set to 30 kV and a dosage is set to $10^{15}/cm^2$, for example. Thereafter, the resist film 223 is removed by ashing.

Figure 39A:
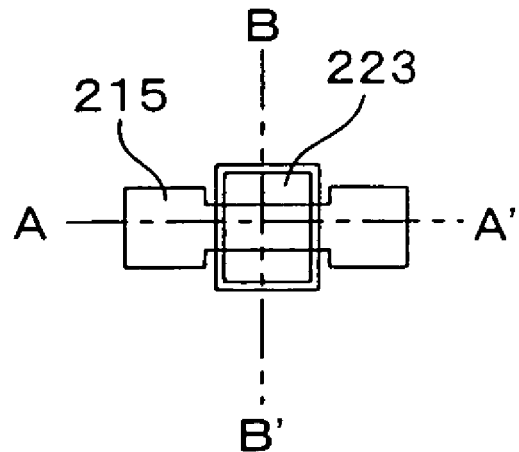
FIG. 39A is a top plan view showing another step in the method of manufacturing the thin film transistor device (the liquid crystal display panel) of the second embodiment, FIG.
Figure 39B:
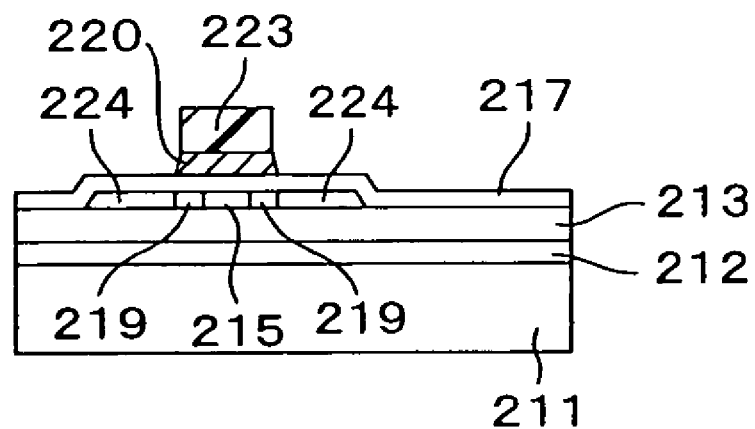
FIG. 39C is a cross-sectional view taken along the B-B' line in FIG. 39A.
Figure 39C:
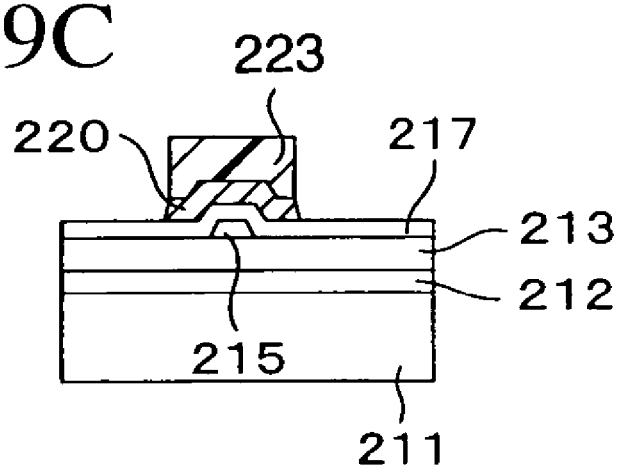

FIG. 39A is a top plan view of the high voltage drive TFT forming region of the picture element portion in this case. Meanwhile, FIG. 39B shows a cross section taken along the A-A' line in FIG. 39A, and FIG. 39C shows a cross section taken along the B-B' line in FIG. 39A. As shown in FIG. 39A to FIG. 39C, the n-type high density impurity regions 224 are formed on both ends of the resist film 223 by implanting the n-type impurity into the polycrystalline silicon film 215 in high density while covering the channel region and the LDD region with the resist film 223.

Here, it is possible to change the order between the step shown in FIGS. 27A to 28D and the step shown in FIGS. 29A to 30D.

Next, a thermal activation process for activating the impurities introduced to the polycrystalline silicon film 215 is carried out. The impurities are activated by performing a thermal process at a temperature of 500° C. for about 2 hours, for example. This thermal activation process may be carried out in a shorter period by use of an RTA device or the like. Note the impurity activation process may be carried out at any time after formation of the p-type high density impurity region 222 and the n-type high density impurity region 224 and before formation of an Al—Nd film 227 to be described later.

Next, as shown in FIG. 31A to FIG. 31D, a resist film 225 is formed on the entire n-type low voltage drive TFT forming region and on the entire p-type low voltage drive TFT forming region, and then the Mo film 220 in the n-type high voltage drive TFT forming region and in the p-type high voltage drive TFT forming region is etched and removed while using this resist film 225 as a mask. Thereafter, the resist film 225 is removed.

Next, as shown in FIG. 32A to FIG. 32D, a $SiO_2$ film 226 is formed on the entire upper surface of the glass substrate 211 in the thickness of 80 nm by use of a plasma CVD device, for example. Thereafter, an Al—Nd film 227 is formed on the $SiO_2$ film 226 in the thickness of 300 nm by use of a sputtering device. Here, instead of the Al—Nd film 227, it is also possible to form a film made of low resistance metal containing any one element of Al, Ag, and Cu as a main component.

Next, as shown in FIG. 33A to FIG. 33D, a resist film 228 is formed on a region for forming the gate electrode of the n-type high voltage drive TFT and the region for forming the gate electrode of the p-type high voltage drive TFT. Then, the Al—Nd film 227 is etched by using this resist film 228 as a mask, thereby forming the gate electrodes of the n-type high voltage drive TFT and the p-type high voltage drive TFT. Here, the gate bus lines and the auxiliary capacitor bus lines are formed at the display portion simultaneously with these gate electrodes. Thereafter, the resist film 228 is removed.

Figure 40A:
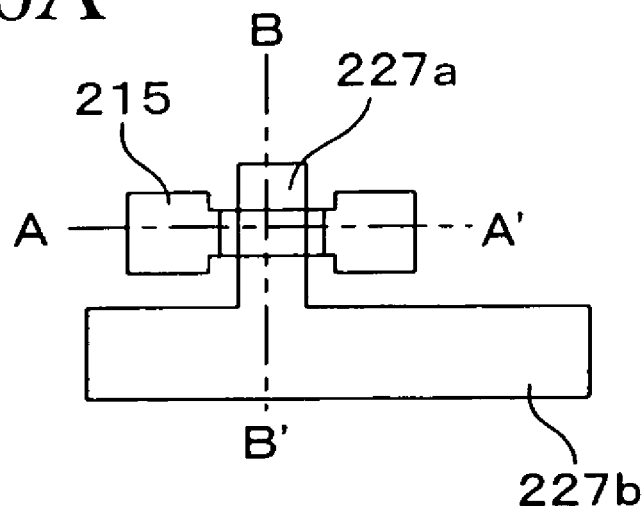
FIG. 40A is a top plan view showing another step in the method of manufacturing the thin film transistor device (the liquid crystal display panel) of the second embodiment.
Figure 40B:
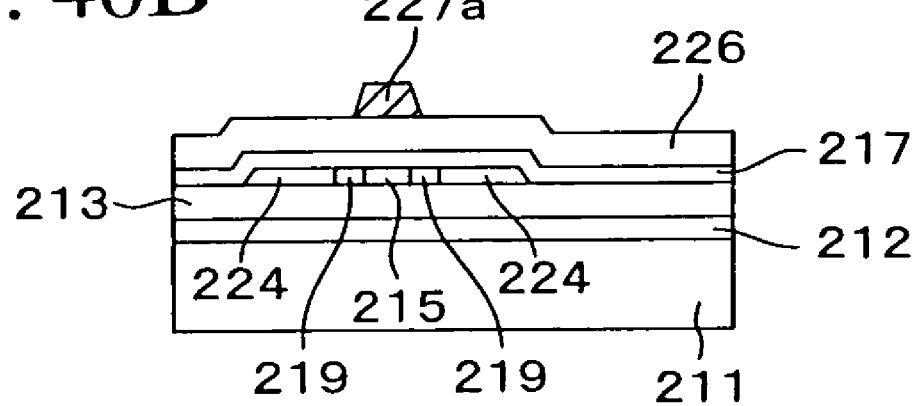
FIG. 40B is a cross-sectional view taken along the A-A' line in FIG. 40A.
Figure 40C:
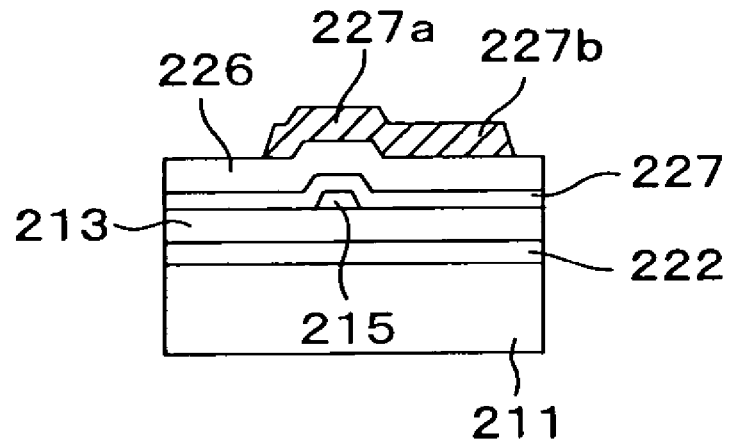
FIG. 40C is a cross-sectional view taken along the B-B' line in FIG. 40A.

FIG. 40A is a top plan view of the high voltage drive TFT forming region of the picture element portion in this case. Meanwhile, FIG. 40B shows a cross section taken along the A-A' line in FIG. 40A, and FIG. 40C shows a cross section taken along the B-B' line in FIG. 40A. As shown in FIG. 40A to FIG. 40C, a gate electrode 227a is formed so as to be connected to a gate bus line 227b.

Next, as shown in FIG. 34A to FIG. 34D, a SiN film 229 is formed on the entire upper surface of the glass substrate 211 in the thickness of 370 nm, for example, by use of a plasma CVD device, for example. Thereafter, a resist film (not shown) is formed into a predetermined pattern on the SiN film 229 by the photoresist method. Then, the SiN film 229, the SiO$_2$ film 226, and the SiO$_2$ film 217 are subjected sequentially to dry etching with fluorine-based etching gas while using this resist film as a mask, thereby forming contact holes 230 so as to expose the n-type high density impurity region 224 and the p-type high density impurity region 222. Thereafter, the resist film is removed.

Next, a Ti film in the thickness of 50 nm, an Al film in the thickness of 200 nm, and a Ti film in the thickness of 100 nm are sequentially formed on the entire upper surface of the glass substrate 211 by use of a sputtering device, for example, thereby forming a conductive film having a three-layer structure composed of Ti/Al/Ti. Thereafter, a resist film is formed into a predetermined pattern on the conductive film by the photoresist method. Then, the conductive film is subjected to dry etching with chlorine-based etching gas while using this resist film as a mask. Accordingly, source and drain electrodes 231, the data bus lines (not shown), and the auxiliary capacitor electrode (not shown) are formed as shown in FIG. 35A to FIG. 35D. Thereafter, the resist film is removed.

Figure 41A:
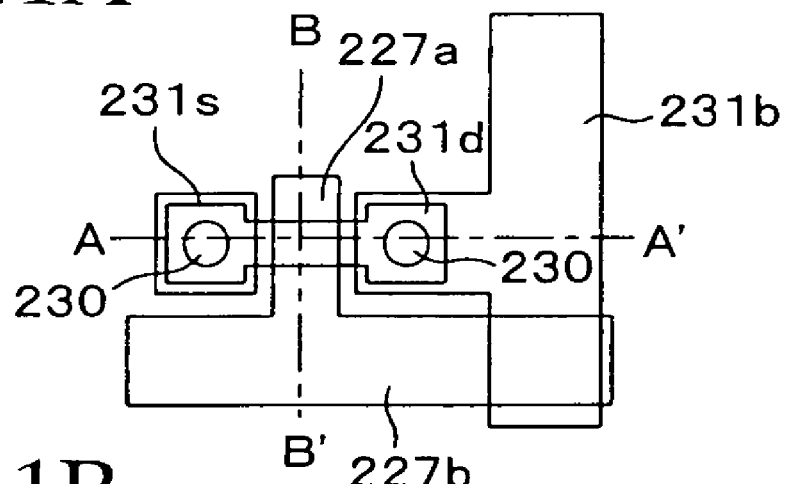
FIG. 41A is a top plan view showing another step in the method of manufacturing the thin film transistor device (the liquid crystal display panel) of the second embodiment.
Figure 41B:
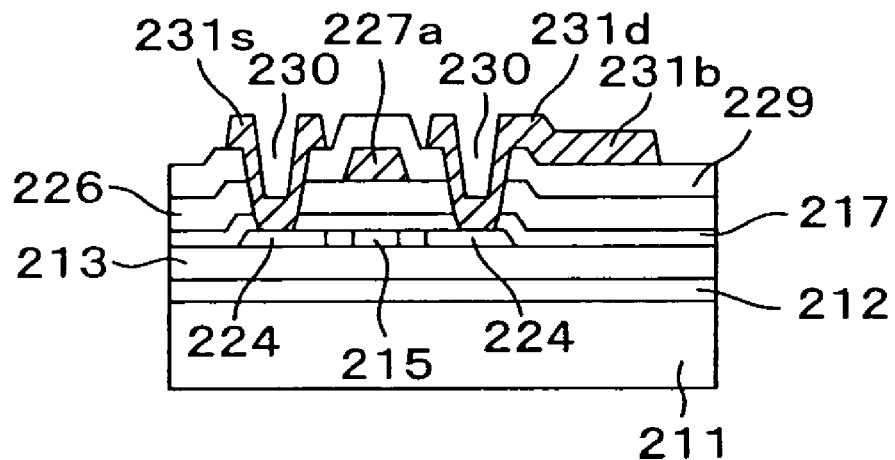
FIG. 41B is a cross-sectional view taken along the A-A' line in FIG. 41A.
Figure 41C:
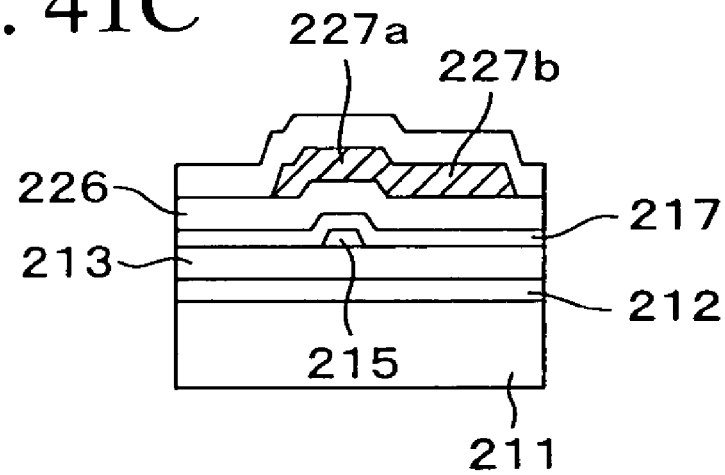
FIG. 41C is a cross-sectional view taken along the B-B' line in FIG. 41A.

FIG. 41A is a top plan view of the high voltage drive TFT forming region of the picture element portion in this case. Meanwhile, FIG. 41B shows a cross section taken along the A-A' line in FIG. 41A, and FIG. 41C shows a cross section taken along the B-B' line in FIG. 41A. As shown in FIG. 41A to FIG. 41C, a drain electrode 231d of the TFT at the display portion is formed so as to be connected to a data bus line 231b. Simultaneously, a pad to be connected to a transparent picture element electrode is formed as a source electrode 231s of the TFT.

Figure 36A:
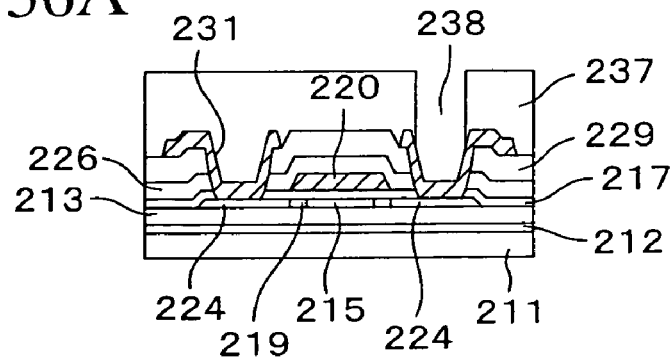
FIG. 36A to FIG. 36D are cross-sectional views (Stage 13) showing the method of manufacturing the thin film transistor device (the liquid crystal display panel) of the second embodiment.
Figure 36B:
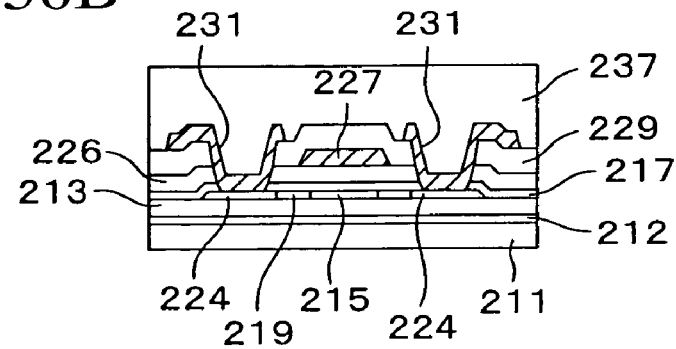
Figure 36C:
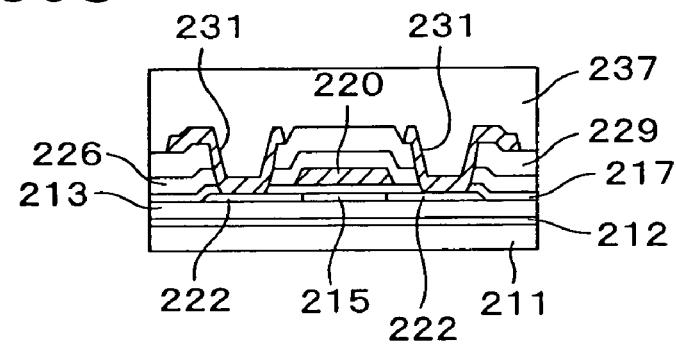
Figure 36D:
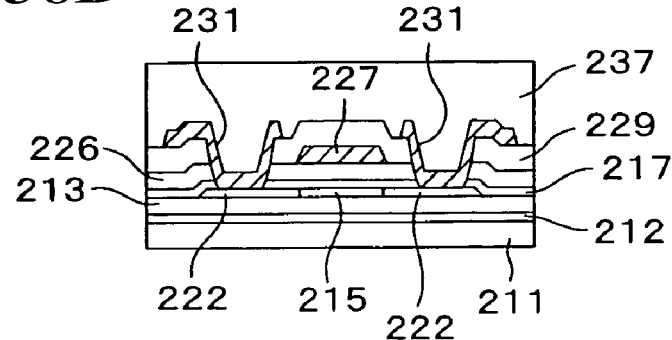
Figure 37A:
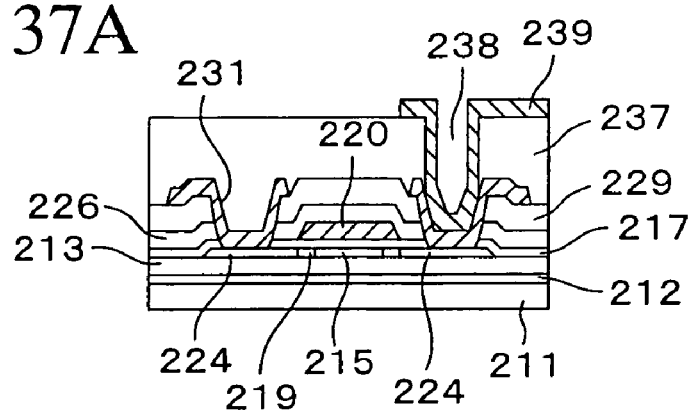
FIG. 37A to FIG. 37D are cross-sectional views (Stage 14) showing the method of manufacturing the thin film transistor device (the liquid crystal display panel) of the second embodiment.
Figure 37B:
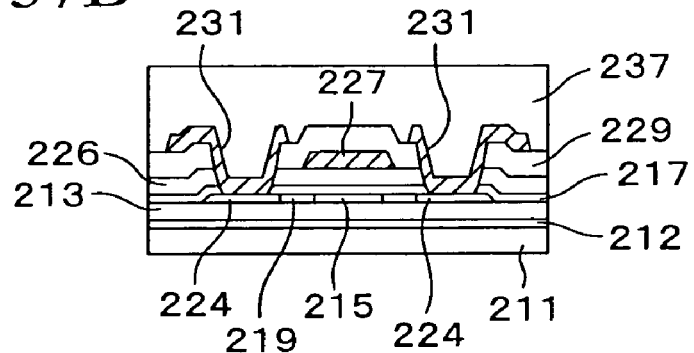
Figure 37C:
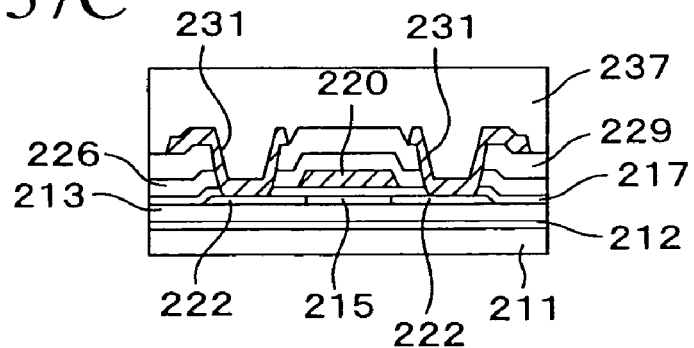
Figure 37D:
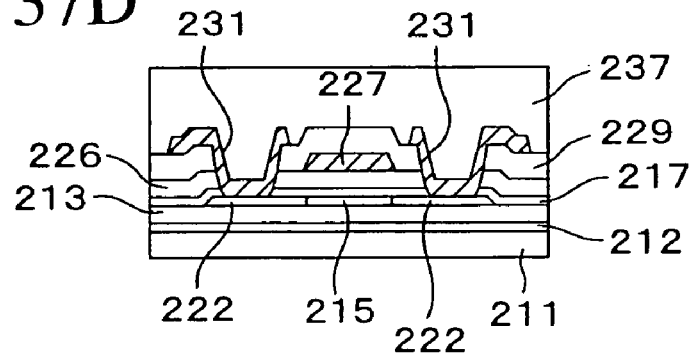

Next, as shown in FIG. 36A to FIG. 36D, an organic insulating film 237 is formed on the entire upper surface of the glass substrate 211 by coating photosensitive transparent organic insulative resin, for example. Thereafter, a contact hole 238 connecting to the source electrode in the TFT forming region of the display portion is formed as shown in FIG. 36A. Thereafter, the organic insulating film 237 is hardened by performing a thermal process.

Next, an ITO film is formed on the entire upper surface of the glass substrate 211 in the thickness of 70 nm, for example, by use of a sputtering device. This ITO film is electrically connected to the n-type high density impurity region 222 (a source region) of the TFT in the display region through the contact hole 238. Then, after forming a resist film into a predetermined pattern on this ITO film by the photoresist method, the ITO film is subjected to wet etching. Accordingly, a transparent picture element electrode 239 is formed as shown in FIG. 37A to FIG. 37D. Thereafter, the resist film is removed.

Figure 42A:
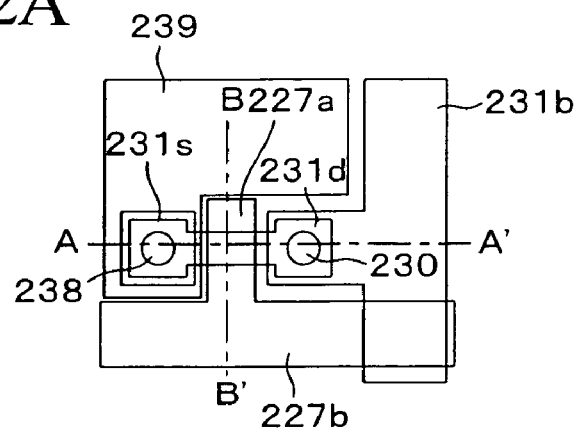
FIG. 42A is a top plan view showing another step in the method of manufacturing the thin film transistor device (the liquid crystal display panel) of the second embodiment.
Figure 42B:
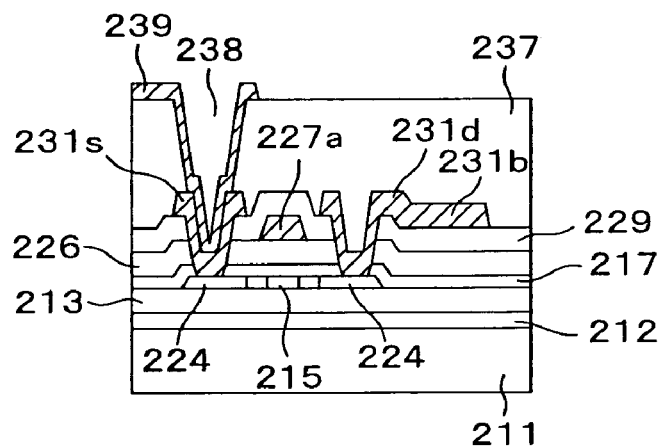
FIG. 42B is a cross-sectional view taken along the A-A' line in FIG. 42A.
Figure 42C:
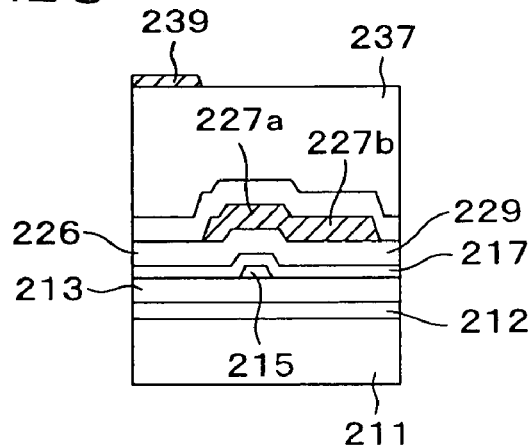
FIG. 42C is a cross-sectional view taken along the B-B' line in FIG. 42A.
Figure 43A:
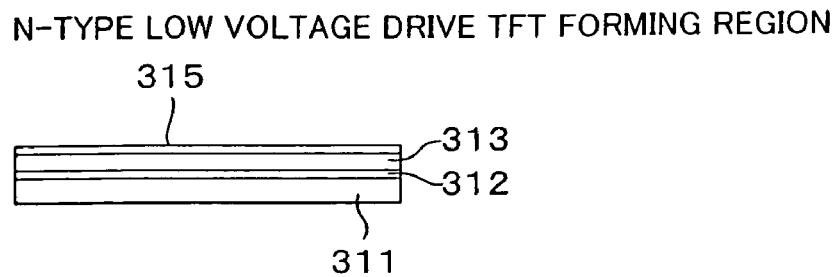
FIG. 43A to FIG. 43D are cross-sectional views (Stage 1) showing a method of manufacturing a thin film transistor device (a liquid crystal display panel) of a third embodiment.
Figure 43B:
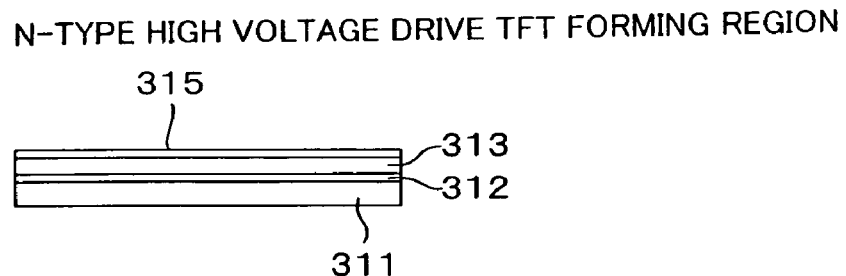
Figure 43C:
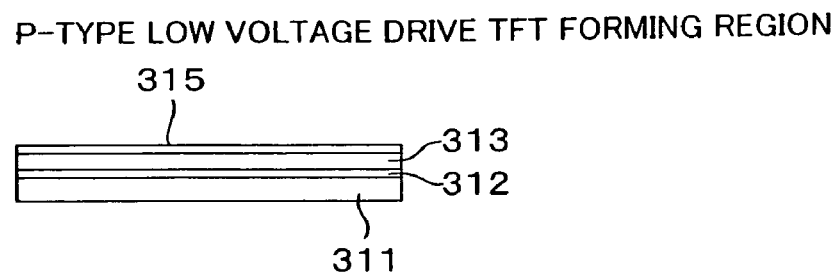
Figure 43D:
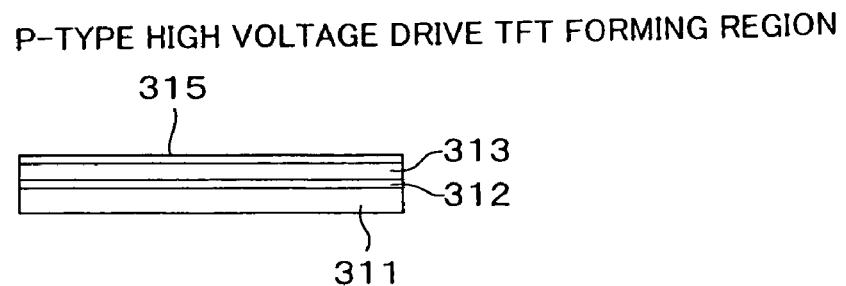
Figure 44A:
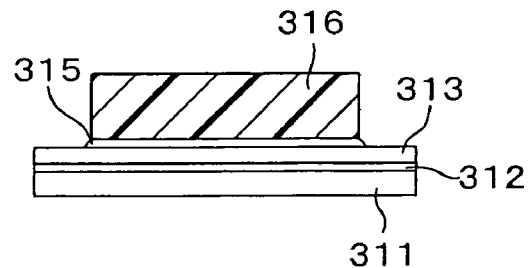
FIG. 44A to FIG. 44D are cross-sectional views (Stage 2) showing the method of manufacturing the thin film transistor device (the liquid crystal display panel) of the third embodiment.
Figure 44B:
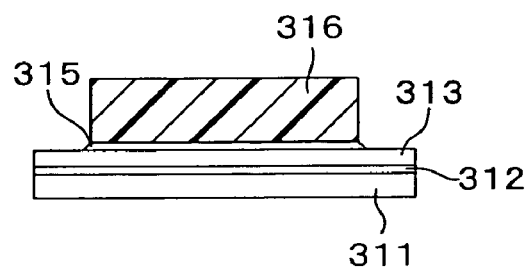
Figure 44C:
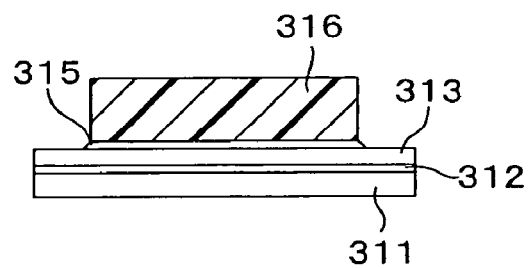
Figure 44D:
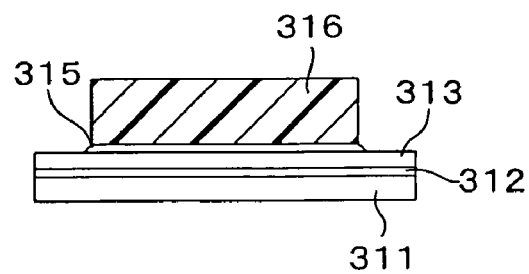
Figure 45A:
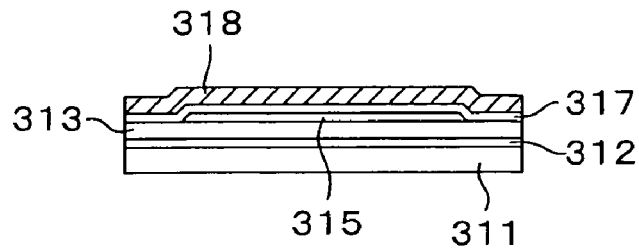
FIG. 45A to FIG. 45D are cross-sectional views (Stage 3) showing the method of manufacturing the thin film transistor device (the liquid crystal display panel) of the third embodiment.
Figure 45B:
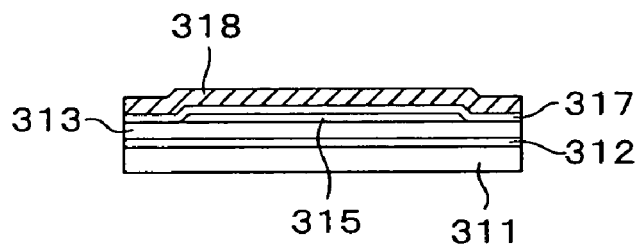
Figure 45C:
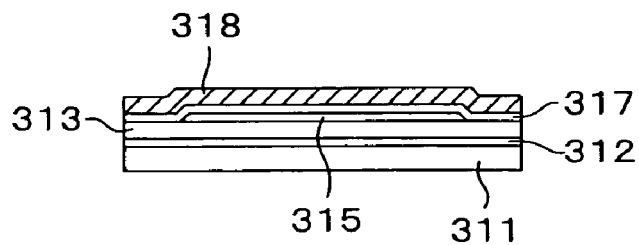
Figure 45D:
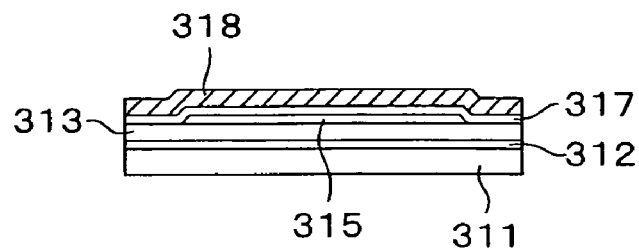
Figure 46A:
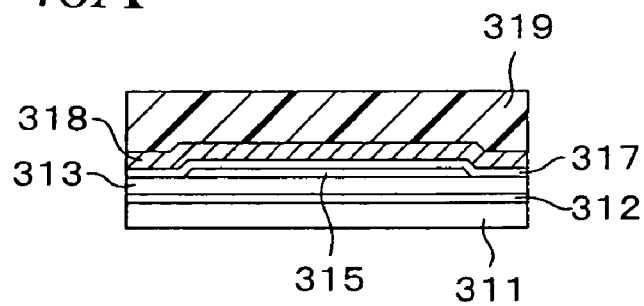
FIG. 46A to FIG. 46D are cross-sectional views (Stage 4) showing the method of manufacturing the thin film transistor device (the liquid crystal display panel) of the third embodiment.
Figure 46B:
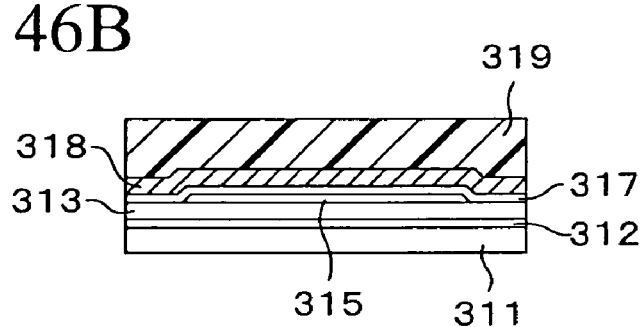
Figure 46C:
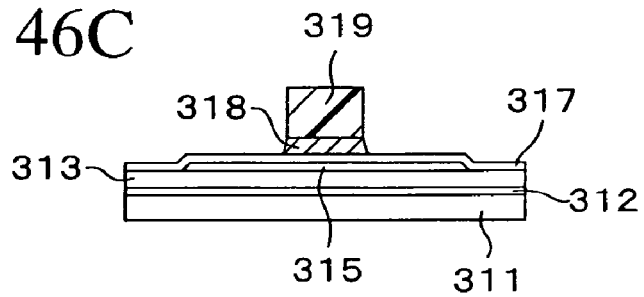
Figure 46D:
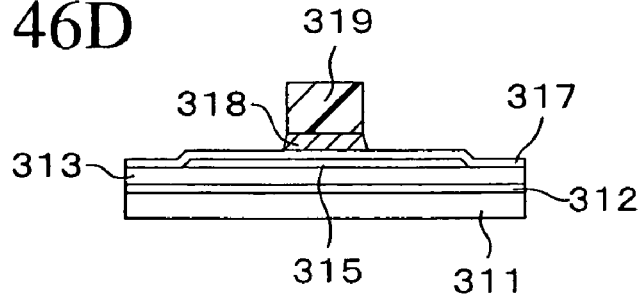
Figure 47A:
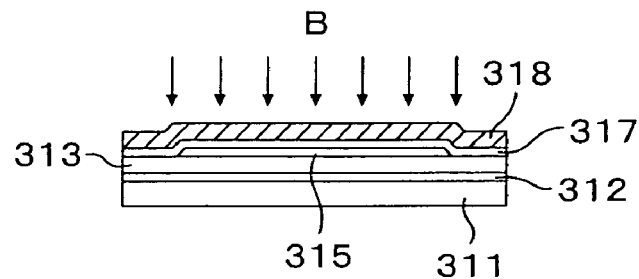
FIG. 47A to FIG. 47D are cross-sectional views (Stage 5) showing the method of manufacturing the thin film transistor device (the liquid crystal display panel) of the third embodiment.
Figure 47B:
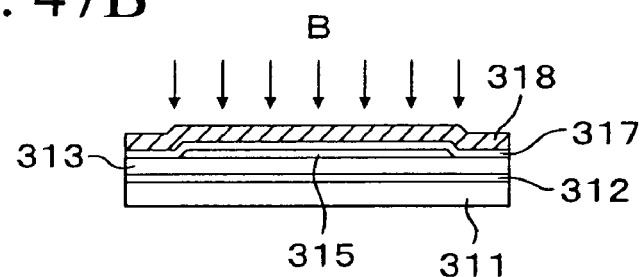
Figure 47C:
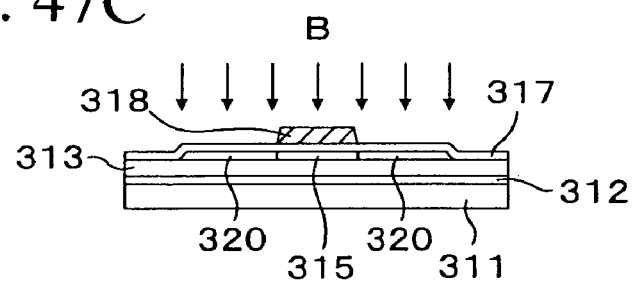
Figure 47D:
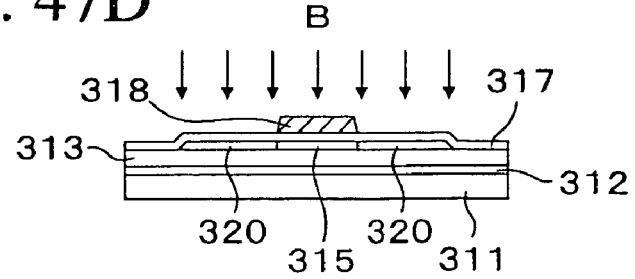
Figure 48A:
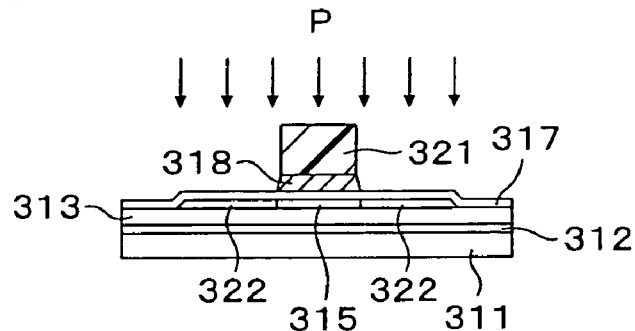
FIG. 48A to FIG. 48D are cross-sectional views (Stage 6) showing the method of manufacturing the thin film transistor device (the liquid crystal display panel) of the third embodiment.
Figure 48B:
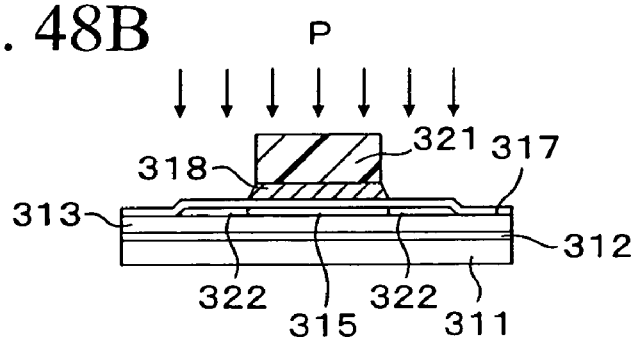
Figure 48C:
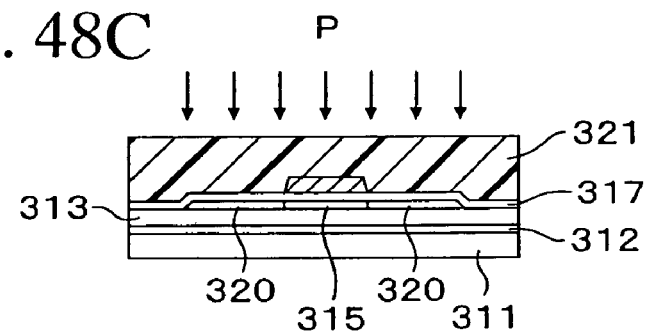
Figure 48D:
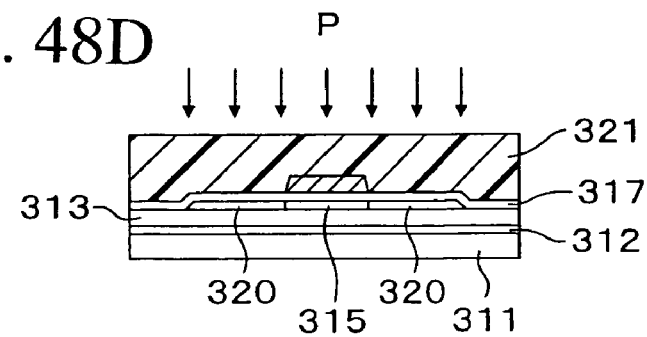
Figure 49A:
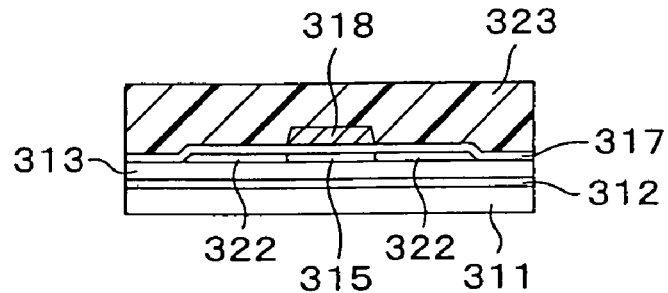
FIG. 49A to FIG. 49D are cross-sectional views (Stage 7) showing the method of manufacturing the thin film transistor device (the liquid crystal display panel) of the third embodiment.
Figure 49B:
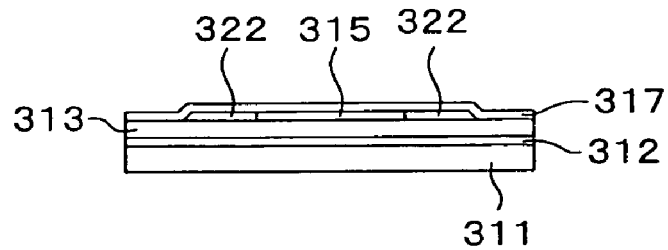
Figure 49C:
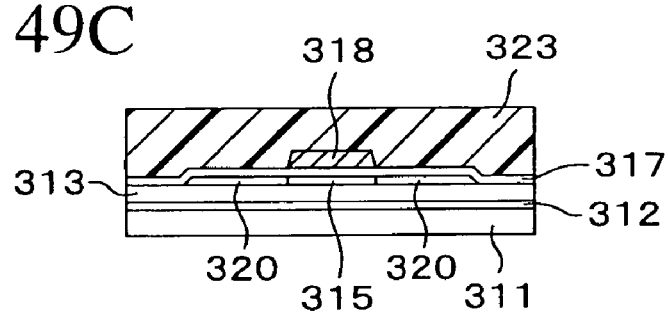
Figure 49D:
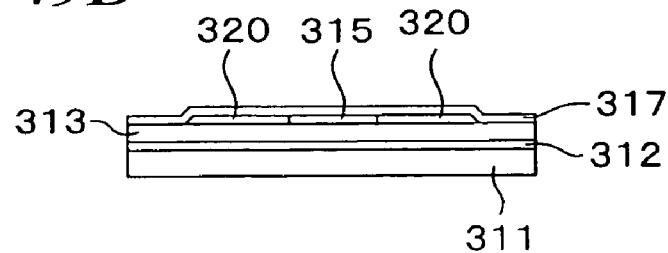
Figure 50A:
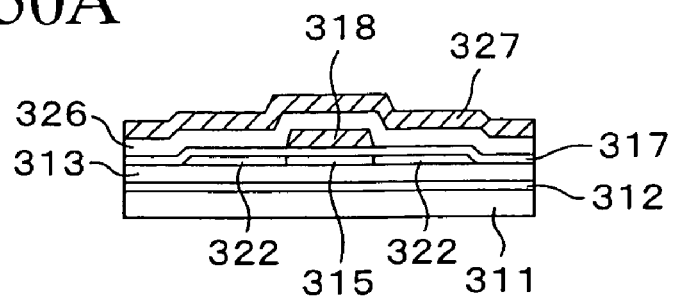
FIG. 50A to FIG. 50D are cross-sectional views (Stage 8) showing the method of manufacturing the thin film transistor device (the liquid crystal display panel) of the third embodiment.
Figure 50B:
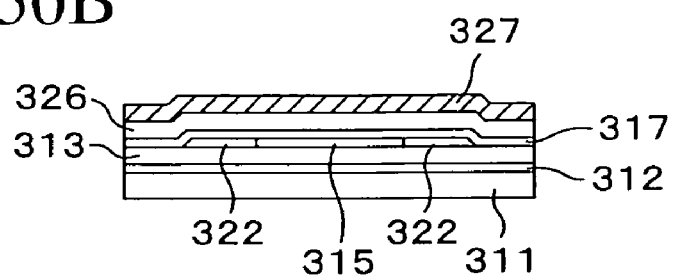
Figure 50C:
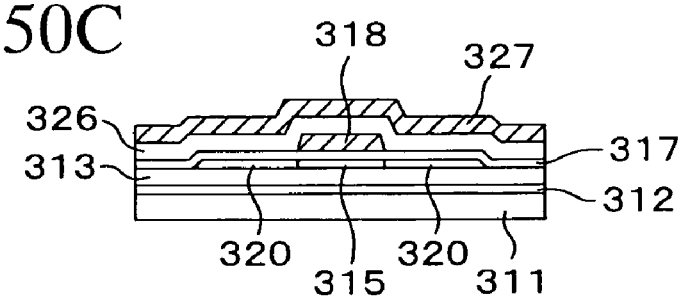
Figure 50D:
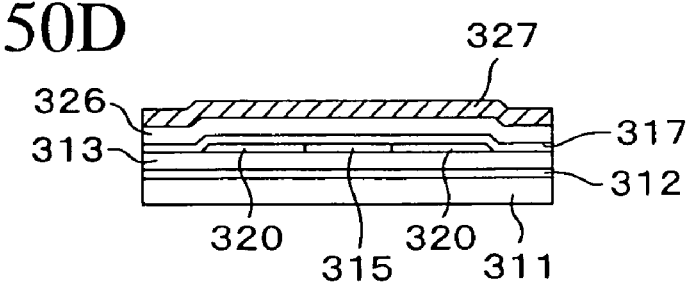

FIG. 42A is a top plan view of the high voltage drive TFT forming region of the picture element portion in this case. Meanwhile, FIG. 42B shows a cross section taken along the A-A' line in FIG. 42A, and FIG. 42C shows a cross section taken along the B-B' line in FIG. 42A. As shown in FIG. 42A to FIG. 42C, the picture element electrode 239 is electrically connected to the source electrode 231s of the TFT through the contact hole 238.

Here, in terms of FIG. 42A to FIG. 42C, the gate bus line 227b, the data bus line 231b, the gate electrode 227a, the source electrode 231s, and the drain electrode 231d correspond to the gate bus line 109, the data bus line 108, the gate electrode 105g, the source electrode 105s, and the drain electrode 105d shown in FIG. 3A and FIG. 3B, respectively. Meanwhile, the SiO$_2$ films 217 and 226, the SiN film 229, and the organic insulating film 237 in FIG. 42A to FIG. 42C correspond to the first insulating film 171, the second insulating film 172, and the third insulating film 173 in FIG. 3B, respectively.

In this way, the thin film transistor device (the liquid crystal display panel) of this embodiment is finished.

In this embodiment as well, the gate electrode of the low voltage drive TFT is made of the high melting point metal (Mo) as similar to the first embodiment. Meanwhile, the gate electrode of the high voltage drive TFT and the gate bus lines are made of the low resistance Al—Nd film. Moreover, the data bus lines are made of the low resistance Ti/Al/Ti laminated film. Therefore, even when manufacturing a large-sized liquid crystal display panel, it is possible to manufacture a liquid crystal display panel suppressing damping of signals flowing on the gate bus lines and the data bus lines, having high reliability, and reducing power consumption.

Meanwhile, in this embodiment as well, the low melting point metal film such as Al—Nd is not formed yet when the impurities implanted into the polycrystalline silicon film 215 are subjected to the activation process. For this reason, it is possible to activate the impurities by the thermal activation process and thereby to form more reliable TFTs than the case of activating the impurities by a laser activation process.

In this embodiment, the impurities are implanted prior to formation of the gate electrodes of the low voltage drive TFTs and the high voltage drive TFTs. Accordingly, not only the n-type high voltage drive TFT but also the n-type low voltage drive TFT adopts the structure of the gate electrode partially covering the region doped with the impurity. Therefore, it is possible to form the TFTs which are even more reliable than the first embodiment. However, the length of the gate of the n-type low voltage drive TFT becomes longer because the gate also includes the low density impurity region. Accordingly, the thin film transistor device of this embodiment required a larger circuit area than the thin film transistor device of the first embodiment. For this reason, this embodiment is suitable for the case where there is a room for a layout area.

Third Embodiment

FIG. 43A to FIG. 56D are cross-sectional views showing a method of manufacturing a thin film transistor device (a liquid crystal display panel) according to a third embodiment of the present invention sequentially in the order of the steps. Throughout FIG. 43A to FIG. 56D, a drawing marked with a suffix A shows a cross section in an n-type low voltage drive TFT forming region, a drawing marked with a suffix B shows a cross section in an n-type high voltage drive TFT forming region, a drawing marked with a suffix C shows a cross section in a p-type low voltage drive TFT forming region, and a drawing marked with a suffix D shows a cross section in a p-type high voltage drive TFT forming region. In this embodiment as well, an entire configuration of the liquid crystal display panel is basically the same as the first embodiment shown in FIG. 2. Accordingly, description of the overlapping constituents will be omitted.

Firstly, as shown in FIG. 43A to FIG. 43D, a SiN film 312 in the thickness of 50 nm, for example, is formed on a glass substrate (a transparent insulative substrate) 311, and a SiO$_2$ film 313 in the thickness of 200 nm is further formed thereon to constitute a base film collectively. Then, a polycrystalline silicon film 315 is formed on the SiO$_2$ film 313 by a similar method to the first embodiment.

Next, as shown in FIG. 44A to FIG. 44D, a resist film 316 is formed on the TFT forming regions of the polycrystalline silicon film 315 by the photoresist method. Then, the polycrystalline silicon film 315 is subjected to dry etching with fluorine-based etching gas while using this resist film 316 as a mask. Thereafter, the resist film 316 is removed.

Figure 57A:
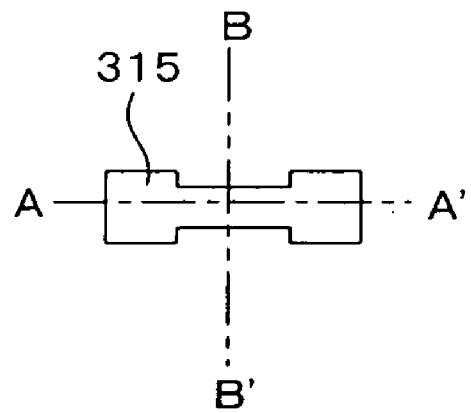
FIG. 57A is a top plan view showing a step in the method of manufacturing the thin film transistor device (the liquid crystal display panel) of the third embodiment.
Figure 57B:
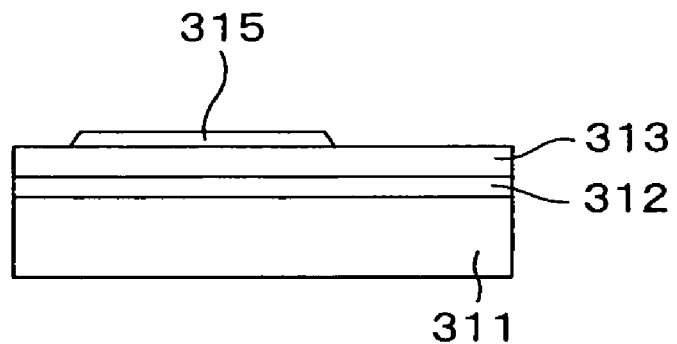
FIG. 57B is a cross-sectional view taken along the A-A' line in FIG. 57A.
Figure 57C:
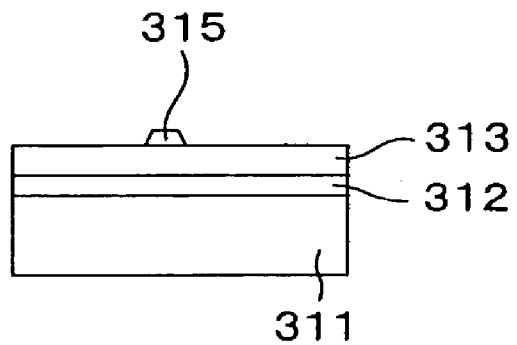
FIG. 57C is a cross-sectional view taken along the B-B' line in FIG. 57A.

FIG. 57A is a top plan view of the high voltage drive TFT (the n-type TFT) forming region of a picture element portion in this case. Meanwhile, FIG. 57B shows a cross section taken along the A-A' line in FIG. 57A, and FIG. 57C shows a cross section taken along the B-B' line in FIG. 57A. As shown in FIG. 57A to FIG. 57C, the polycrystalline silicon film 315 is formed into the shape having wider widths at both ends and a narrower width at a central portion Next, as shown in FIG. 45A to FIG. 45D, a SiO$_2$ film 317 constituting a gate insulating film of the low voltage drive TFT is formed in the thickness of about 30 nm on the entire upper surface of the glass substrate 311 by the plasma CVD method, for example. Then, a Mo film 318 constituting the gate electrode of the low voltage drive TFT is formed in the thickness of about 300 nm on the SiO$_2$ film 317, by the sputtering method. Here, instead of the Mo film 318, it is also possible to form a metallic film containing other high melting point metal such as Ti, Cr, W or Ta as a main component.

Next, as shown in FIG. 46A to FIG. 46D, a resist film 319 for covering the entire n-type low voltage drive TFT forming region, the entire n-type high voltage drive TFT forming region, a channel region in the p-type low voltage drive TFT forming region, and a channel region in the p-type high voltage drive TFT forming region is formed by the photoresist method. Then, the Mo film 318 is etched by using this resist film 319 as a mask. The etching of the Mo film 318 may be carried out by means of either dry etching with fluorine-based etching gas or wet etching with a phosphoric acid and hydrochloric acid-based etchant, for example. The resist film 319 is removed after the etching of the Mo film 318 is completed.

Then, as shown in FIG. 47A to FIG. 47D, the polycrystalline silicon film 315 in the p-type low voltage drive TFT forming region and in the p-type high voltage drive TFT forming region is subjected to ion implantation of high density of a p-type impurity (such as B) while using the Mo film 318 as a mask, thereby forming a p-type high density impurity region 320 constituting the sources and the drains of the p-type low voltage drive TFT and the p-type high voltage drive TFT. In this case, in the n-type low voltage drive TFT forming region and the n-type high voltage drive TFT forming region, the Mo film 318 functions as a mask and implantation of the p-type impurity into the polycrystalline silicon film 315 is thereby avoided. An ion doping device is used for implantation of the p-type impurity, and an acceleration voltage is set to 30 kV and a dosage is set to $10^{15}/cm^2$ for example.

In the step shown in FIG. 46A to FIG. 46D, it is also possible to adopt a structure including an offset region, in which no impurity is introduced to a space between the channel region and the p-type high density impurity region 320 (the source and the drain), by means of overetching the Mo film 318 and thereby forming the width of the Mo film 318 narrower than the width of the resist film 319, and then implanting the impurity into the polycrystalline silicon film 315 while using the resist film 319 as the mask.

Next, as shown in FIG. 48A to FIG. 48D, a resist film 321 for covering a channel region in the n-type low voltage drive TFT forming region, a channel region in the n-type high voltage drive TFT forming region, the entire p-type low voltage drive TFT forming region, and the entire p-type high voltage drive TFT forming region is formed by the photoresist method. Then, the Mo film 318 in the n-type low voltage drive TFT forming region and in the n-type high voltage drive TFT forming region is etched by using this resist film 321 as a mask.

Thereafter, the polycrystalline silicon film 315 in the n-type low voltage drive TFT forming region and in the n-type high voltage drive TFT forming region is subjected to ion implantation of high density of a n-type impurity (such as P) while using the resist film 321 as a mask, thereby forming an n-type high density impurity region 322 constituting the sources and the drains of the n-type low voltage drive TFT and the n-type high voltage drive TFT. An ion doping device is used for implantation of the n-type impurity, and an acceleration voltage is set to 30 kV and a dosage is set to $10^{15}/cm^2$, for example. Subsequently, the resist film 321 is removed by ashing.

Figure 58A:
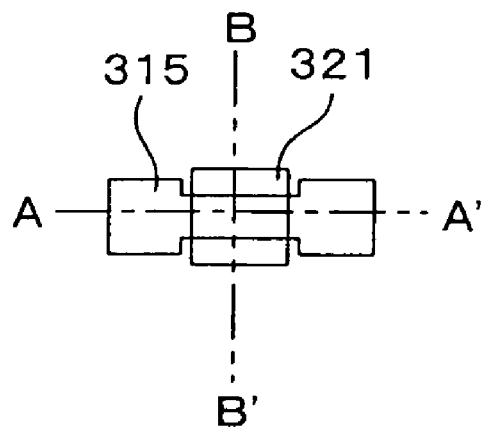
FIG. 58A is a top plan view showing another step in the method of manufacturing the thin film transistor device (the liquid crystal display panel) of the third embodiment.
Figure 58B:
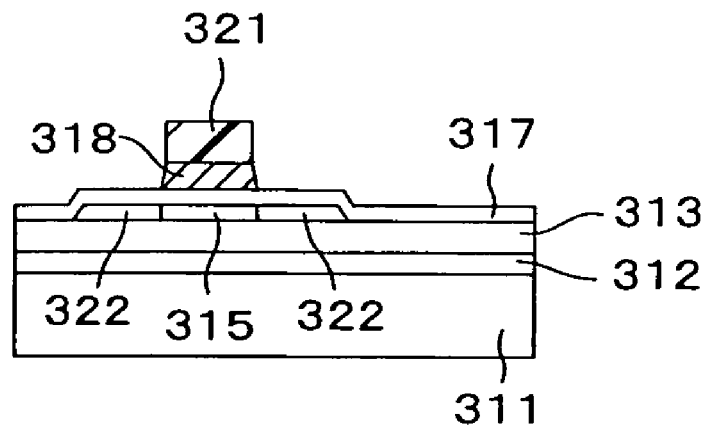
FIG. 58B is a cross-sectional view taken along the A-A' line in FIG. 58A.
Figure 58C:
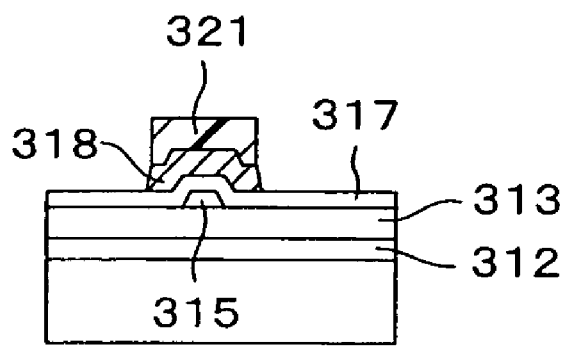
FIG. 58C is a cross-sectional view taken along the B-B' line in FIG. 58A.

FIG. 58A is a top plan view of the high voltage drive TFT (the n-type TFT) forming region of a picture element portion in this case. Meanwhile, FIG. 58B shows a cross section taken along the A-A' line in FIG. 58A, and FIG. 58C shows a cross section taken along the B-B' line in FIG. 58A. As shown in FIG. 58A to FIG. 58C, the resist film 321 covers the region for forming the channel as well as the region for forming the LDD region in the polycrystalline silicon film 315. Then, the n-type impurity is implanted into the region of the polycrystalline silicon film 315 which is not covered with the resist film 321.

Here, it is also possible to adopt a structure including an offset region, in which no impurity is introduced to a space between the channel region and any of the source and the drain, by means of overetching the Mo film 318 and thereby forming the width of the Mo film 318 narrower than the width of the resist film 321, and then implanting the impurity into the polycrystalline silicon film 315 while using the resist film 321 as the mask. In addition, it is possible to change the order between the steps shown in FIGS. 46A to 47D and the step shown in FIGS. 48A to 48D.

Next, as shown in FIG. 49A to FIG. 49D, a resist film 323 for covering the entire n-type low voltage drive TFT forming region and the entire p-type low voltage drive TFT forming region is formed by the photoresist method. Then, the Mo film 318 in the n-type high voltage drive TFT forming region and in the p-type high voltage drive TFT forming region is removed by use of a phosphoric acid and nitric acid-based etchant, for example, while using this resist film 323 as a mask.

Next, a thermal activation process for activating the impurities introduced to the polycrystalline silicon film 315 is carried out. The impurities are activated by performing a thermal process at a temperature of 500° C. for about 2 hours, for example. This thermal activation process may be carried out in a shorter period by use of an RTA device or the like. Note the impurity activation process may be carried out at any time after formation of the p-type high density impurity region 320 and the n-type high density impurity region 322 and before formation of an Al—Nd film 327 to be described later.

Next, as shown in FIG. 50A to FIG. 50D, a SiO$_2$ film 326 is formed on the entire upper surface of the glass substrate 311 in the thickness of 80 nm by the plasma CVD method, for example. Thereafter, an Al—Nd film 327 is formed on the SiO$_2$ film 326 in the thickness of 300 nm, for example, by use of a sputtering device. Here, instead of the Al—Nd film 327, it is also possible to form a film made of low resistance metal containing any one element of Al, Ag, and Cu as a main component.

Figure 51A:
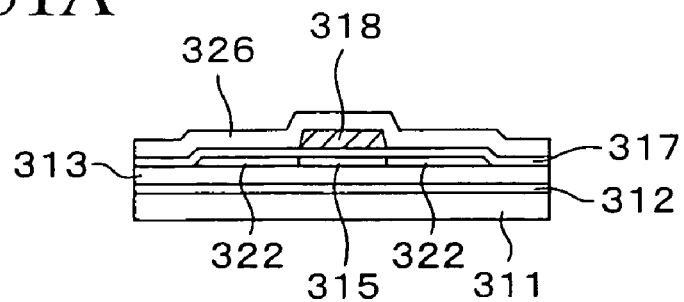
FIG. 51A to FIG. 51D are cross-sectional views (Stage 9) showing the method of manufacturing the thin film transistor device (the liquid crystal display panel) of the third embodiment.
Figure 51B:
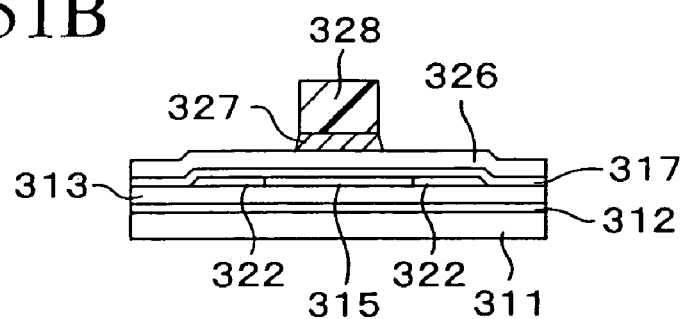
Figure 51C:
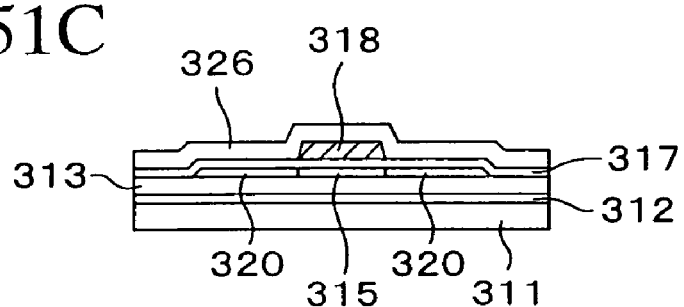
Figure 51D:
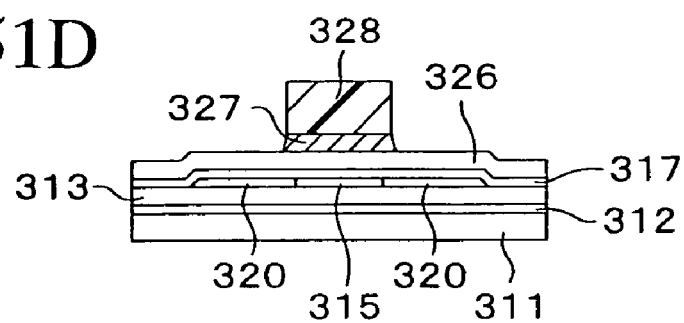
Figure 52A:
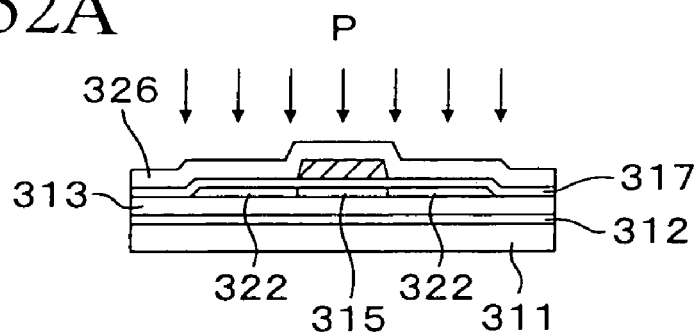
FIG. 52A to FIG. 52D are cross-sectional views (Stage 10) showing the method of manufacturing the thin film transistor device (the liquid crystal display panel) of the third embodiment.
Figure 52B:
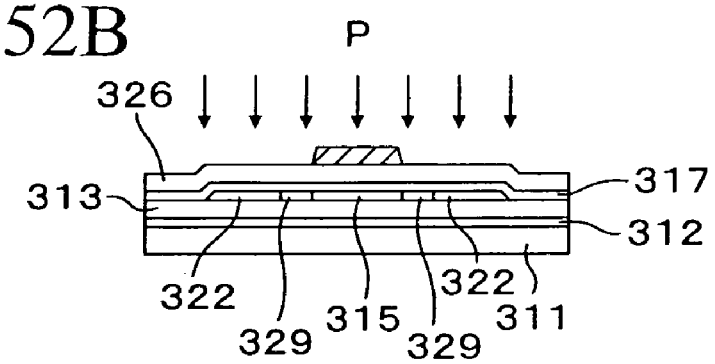
Figure 52C:
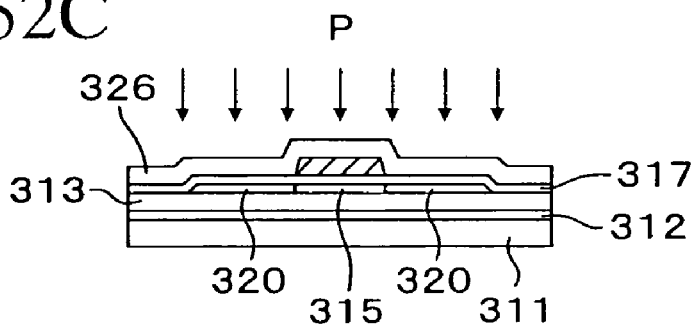
Figure 52D:
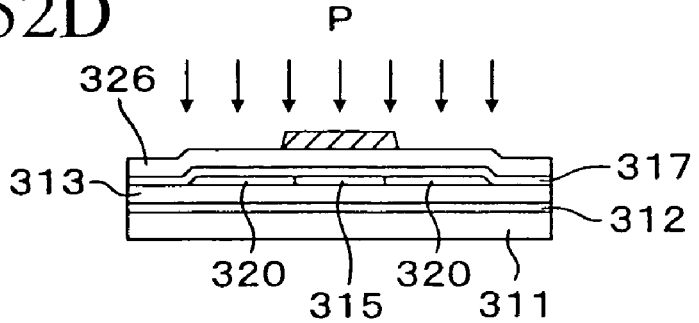
Figure 53A:
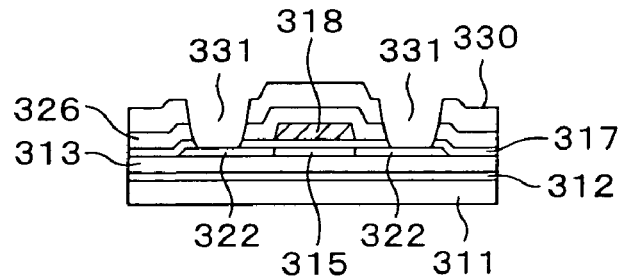
FIG. 53A to FIG. 53D are cross-sectional views (Stage 11) showing the method of manufacturing the thin film transistor device (the liquid crystal display panel) of the third embodiment.
Figure 53B:
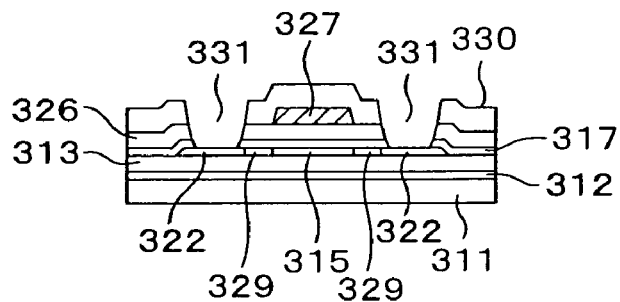
Figure 53C:
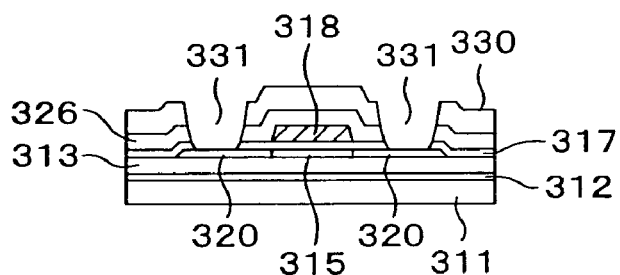
Figure 53D:
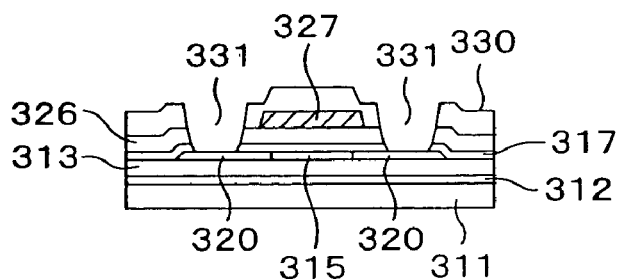
Figure 54A:
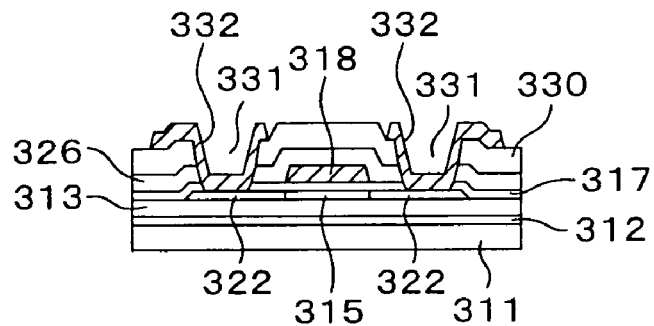
FIG. 54A to FIG. 54D are cross-sectional views (Stage 12) showing the method of manufacturing the thin film transistor device (the liquid crystal display panel) of the third embodiment.
Figure 54B:
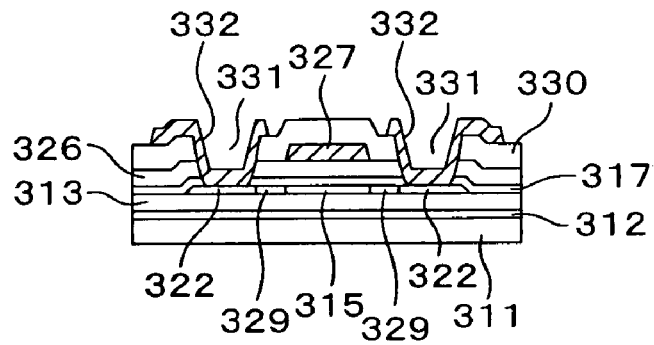
Figure 54C:
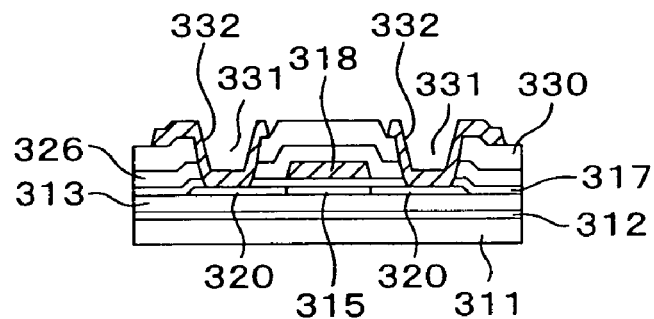
Figure 54D:
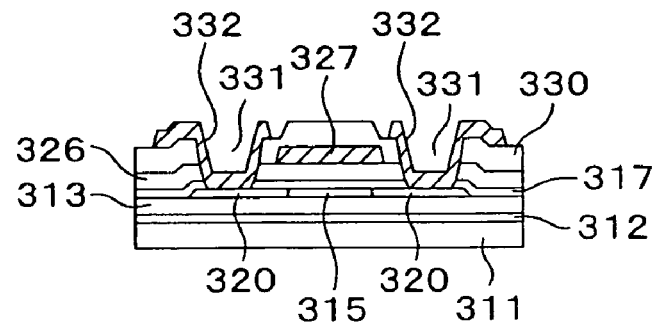

Next, as shown in FIG. 51A to FIG. 51D, a resist film 328 covering the respective channel regions in the n-type high voltage drive TFT forming region and in the p-type high voltage drive TFT forming region is formed by the photoresist method. In this case, as shown in FIG. 51B, the width of the resist film 328 in the n-type high voltage drive TFT forming region is formed smaller by an amount equivalent to the LDD region than the width of the region of the polycrystalline silicon film 315 where no impurity is introduced. Then, the Al—Nd film 327 is etched with a phosphoric acid and nitric acid-based etchant while using this resist film 328 as a mask, thereby forming the gate electrodes of the n-type high voltage drive TFT and the p-type high voltage drive TFT. Here, the gate bus lines and the auxiliary capacitor bus lines made of the Al—Nd film 327 are formed at the display portion simultaneously with these gate electrodes.

Figure 59A:
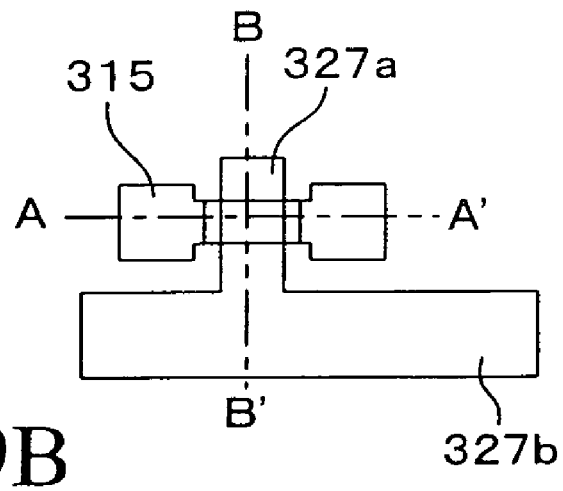
FIG. 59A is a top plan view showing another step in the method of manufacturing the thin film transistor device (the liquid crystal display panel) of the third embodiment.
Figure 59B:
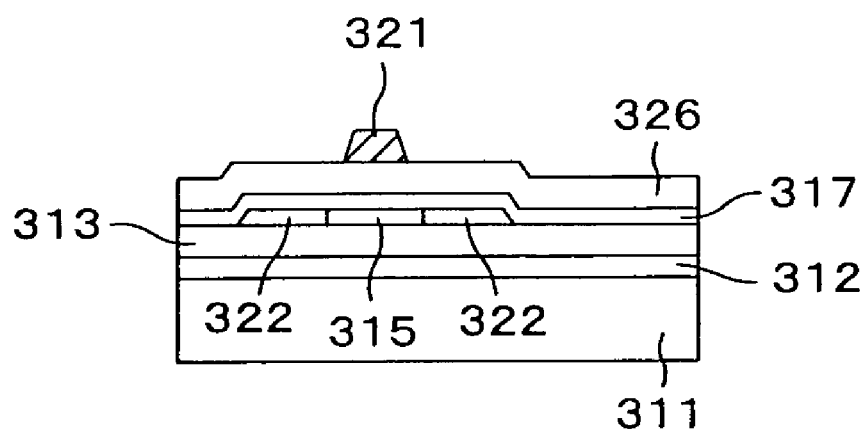
FIG. 59B is a cross-sectional view taken along the A-A' line in FIG. 59A.
Figure 59C:
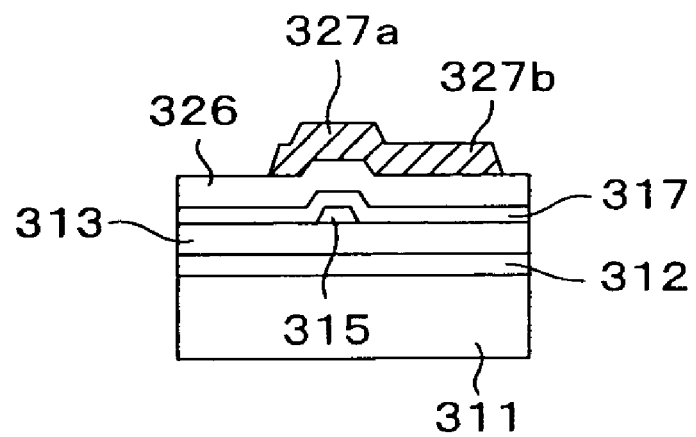
FIG. 59C is a cross-sectional view taken along the B-B' line in FIG. 59A.

FIG. 59A is a top plan view of the high voltage drive TFT forming region of the picture element portion in this case. Meanwhile, FIG. 59B shows a cross section taken along the A-A' line in FIG. 59A, and FIG. 59C shows a cross section taken along the B-B' line in FIG. 59A. As shown in FIG. 59A to FIG. 59C, a gate electrode 327a is formed so as to be connected to a gate bus line 327b. In this case, the width of the gate electrode 327a is formed slightly narrower than the width of the region of the polycrystalline silicon film 315 where the n-type impurity is not introduced.

Next, as shown in FIG. 52A to FIG. 52D, after removing the resist film 328, an n-type impurity (such as P) is implanted into the entire surface of the substrate in low density to form an n-type low density impurity region (a LDD region) 329 between the channel region of the n-type high voltage drive TFT and the n-type high density impurity region 322. An ion doping device is used for implantation of the n-type impurity, and an acceleration voltage is set to 90 kV and a dosage is set to 5×10$^{13}$/cm$^2$, for example. In this case, an amount of implantation of the n-type impurity is small and the conductive type of the p-type high density impurity region 320 is therefore not changed.

Thereafter, the impurity implanted into the n-type low density impurity region (the LDD region) 329 is activated by performing a thermal process under conditions not to deteriorate the Al—Nd film 327, such as a thermal process in an N$_2$ atmosphere at a temperature of 360° C. for about 2 hours.

Next, as shown in FIG. 53A to FIG. 53D, a SiN film 330 is formed on the entire upper surface of the glass substrate 311 in the thickness of 370 nm by use of the plasma CVD method, for example. Thereafter, a resist film (not shown) is formed into a predetermined pattern on the SiN film 330 by the photoresist method. Then, the SiN film 330, the SiO$_2$ film 326, and the SiO$_2$ film 317 are subjected sequentially to dry etching with fluorine-based etching gas while using this resist film as a mask, thereby forming contact holes 331 so as to expose the n-type high density impurity region 322 and the p-type high density impurity region 320. Thereafter, the resist film is removed.

Next, a Ti film in the thickness of 50 nm, an Al film in the thickness of 200 nm, and a Ti film in the thickness of 100 nm are sequentially formed on the entire upper surface of the glass substrate 311 by use of a sputtering device, for example, thereby forming a conductive film having a three-layer structure composed of Ti/Al/Ti. Thereafter, a resist film is formed into a predetermined pattern on the conductive film by the photoresist method. Then, the conductive film is subjected to dry etching with chlorine-based etching gas while using this resist film as a mask. Accordingly, source and drain electrodes 332, the data bus lines (not shown), and the auxiliary capacitor electrode (not shown) are formed as shown in FIG. 54A to FIG. 54D. Thereafter, the resist film is removed.

Figure 60A:
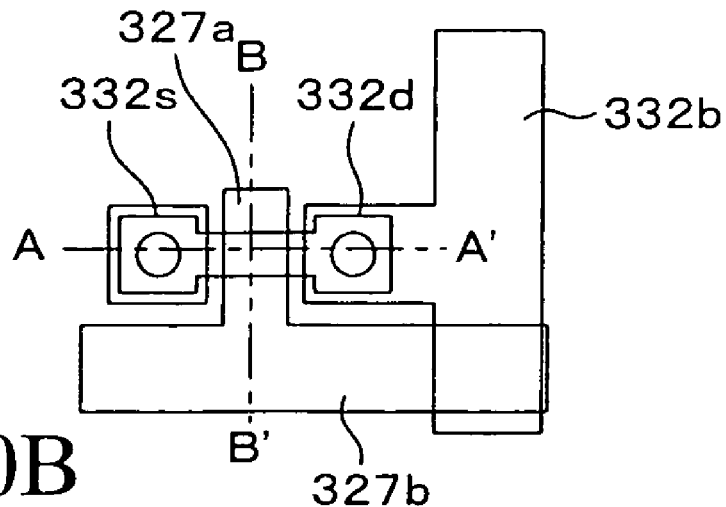
FIG. 60A is a top plan view showing another step in the method of manufacturing the thin film transistor device (the liquid crystal display panel) of the third embodiment.
Figure 60B:
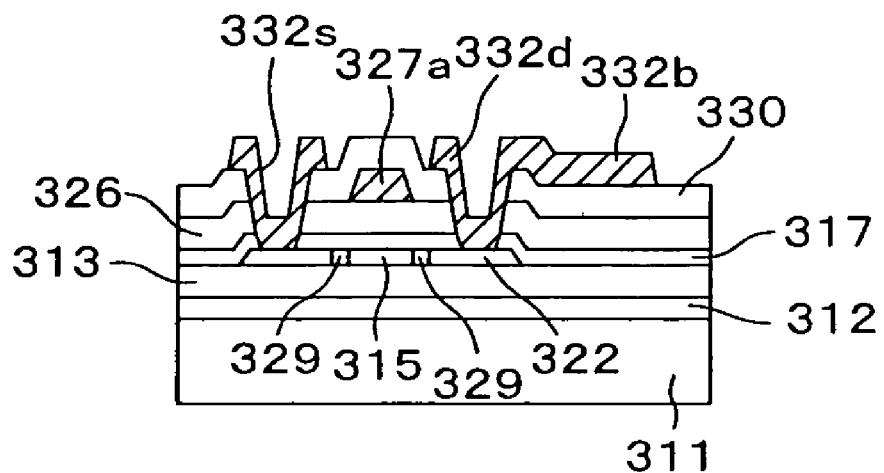
FIG. 60B is a cross-sectional view taken along the A-A' line in FIG. 60A.
Figure 60C:
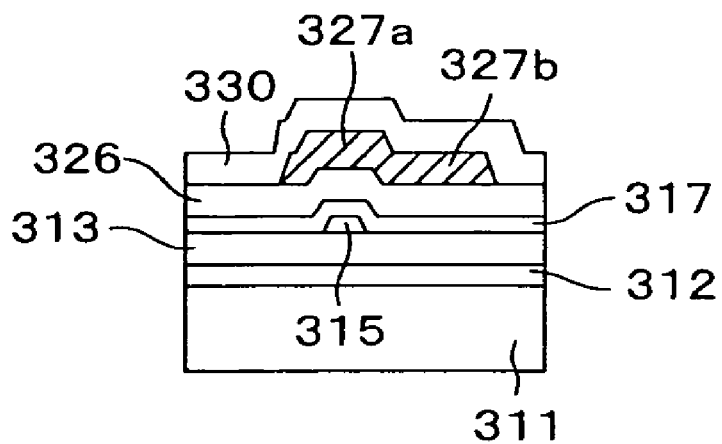
FIG. 60C is a cross-sectional view taken along the B-B' line in FIG. 60A.

FIG. 60A is a top plan view of the high voltage drive TFT forming region of the picture element portion in this case. Meanwhile, FIG. 60B shows a cross section taken along the A-A' line in FIG. 60A, and FIG. 60C shows a cross section taken along the B-B' line in FIG. 60A. As shown in FIG. 60A to FIG. 60C, a drain electrode 332d of the TFT at the display portion is formed so as to be connected to a data bus line 332b. Simultaneously, a pad to be connected to a transparent picture element electrode is formed as a source electrode 332s of the TFT.

Figure 55A:
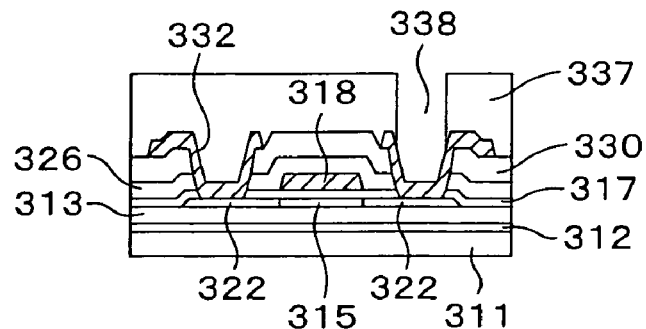
FIG. 55A to FIG. 55D are cross-sectional views (Stage 13) showing the method of manufacturing the thin film transistor device (the liquid crystal display panel) of the third embodiment.
Figure 55B:
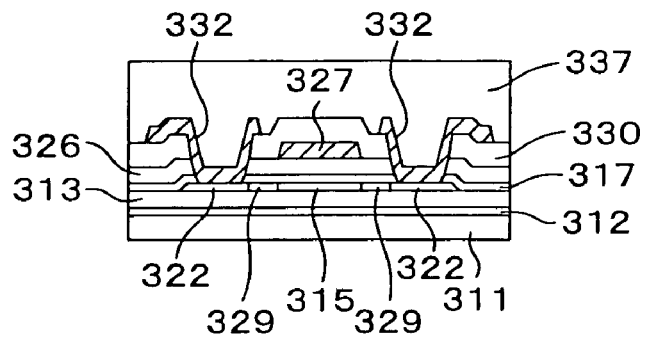
Figure 55C:
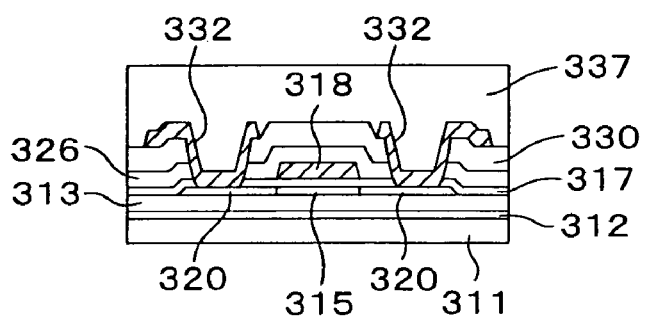
Figure 55D:
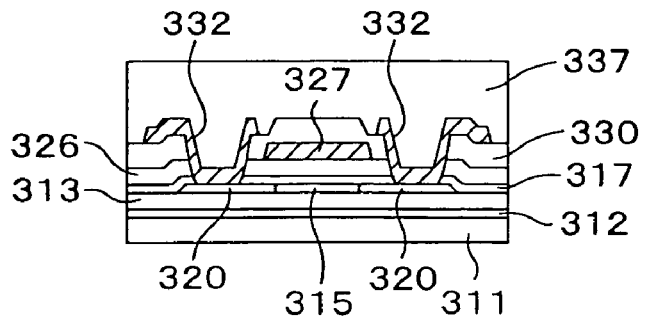
Figure 56A:
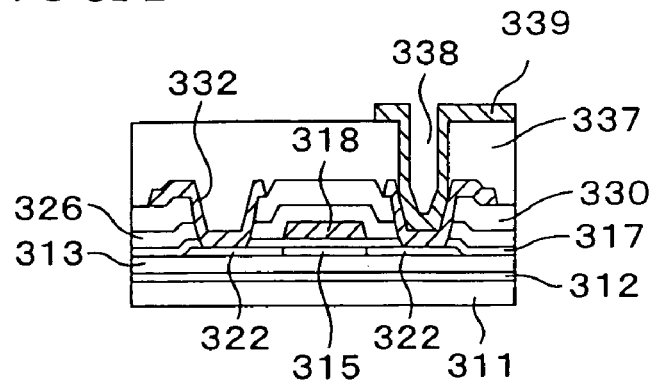
FIG. 56A to FIG. 56D are cross-sectional views (Stage 14) showing the method of manufacturing the thin film transistor device (the liquid crystal display panel) of the third embodiment.
Figure 56B:
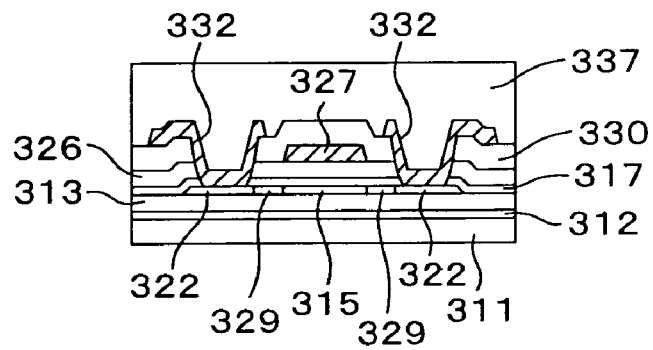
Figure 56C:
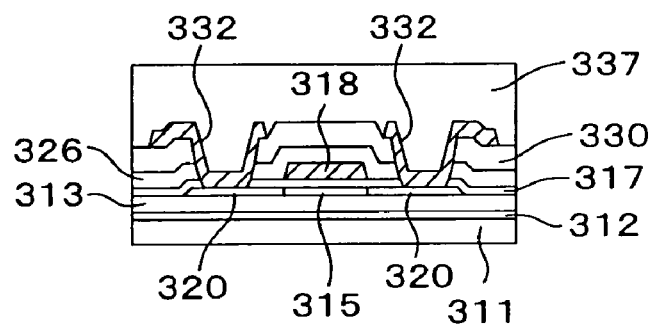
Figure 56D:
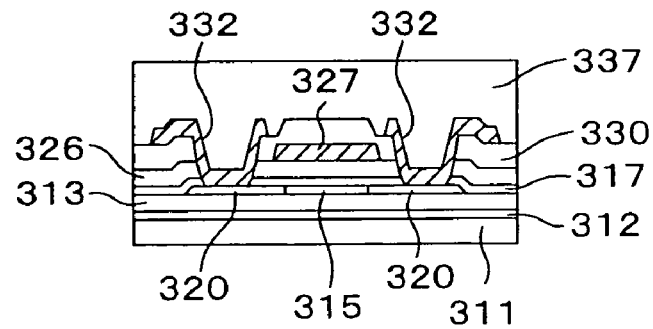

Next, as shown in FIG. 55A to FIG. 55D, an organic insulating film 337 is formed on the entire upper surface of the glass substrate 311 by coating photosensitive transparent organic insulative resin, for example. Thereafter, a contact hole 338 connecting to the source electrode in the TFT forming region of the display portion is formed as shown in FIG. 55A. Subsequently, the organic insulating film 337 is hardened by performing a thermal process.

Here, it is usually unnecessary to form a transparent picture element electrode at the peripheral circuit portion. Therefore, it is not necessary to form a contact hole on the organic insulating film 337. However, in case of providing an inspection terminal for inspecting circuit operations, a contact hole connecting to the inspection terminal may be formed in this step.

Next, an ITO film is formed on the entire upper surface of the glass substrate 311 in the thickness of 70 nm, for example, by use of a sputtering device. This ITO film is electrically connected to the n-type high density impurity region 322 (a source region) of the TFT in the display region through the contact hole 338. Then, after forming a resist film (not shown) into a predetermined pattern on this ITO film by the photoresist method, the ITO film is subjected to wet etching. Accordingly, a transparent picture element electrode 339 is formed as shown in FIG. 56A to FIG. 56D. Thereafter, the resist film is removed.

Figure 61A:
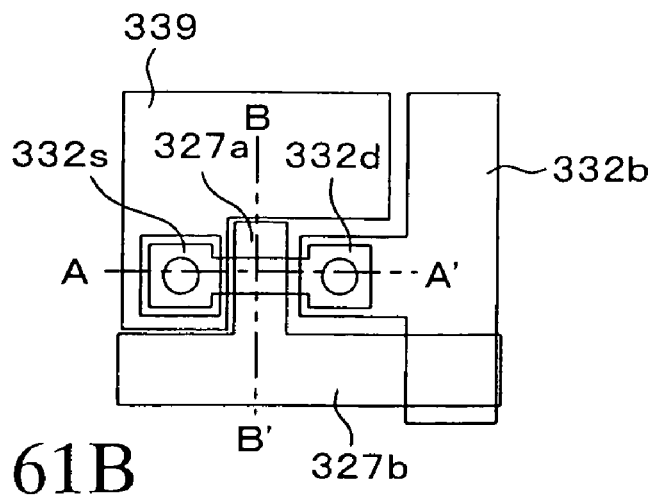
FIG. 61A is a top plan view showing another step in the method of manufacturing the thin film transistor device (the liquid crystal display panel) of the third embodiment.
Figure 61B:
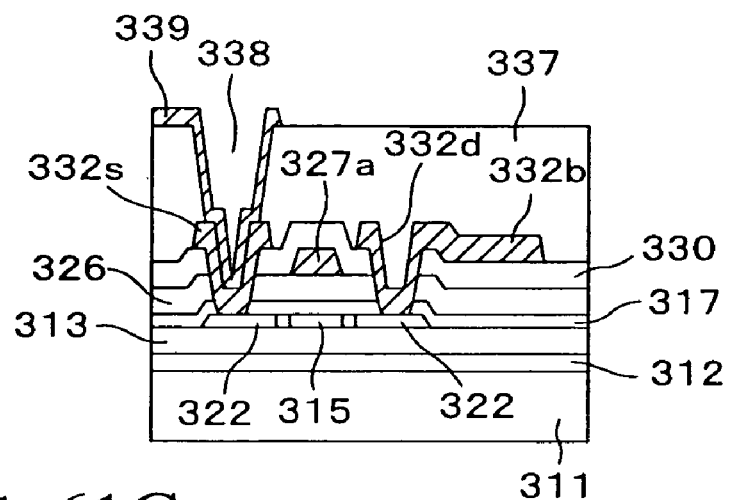
FIG. 61B is a cross-sectional view taken along the A-A' line in FIG. 61A.
Figure 61C:
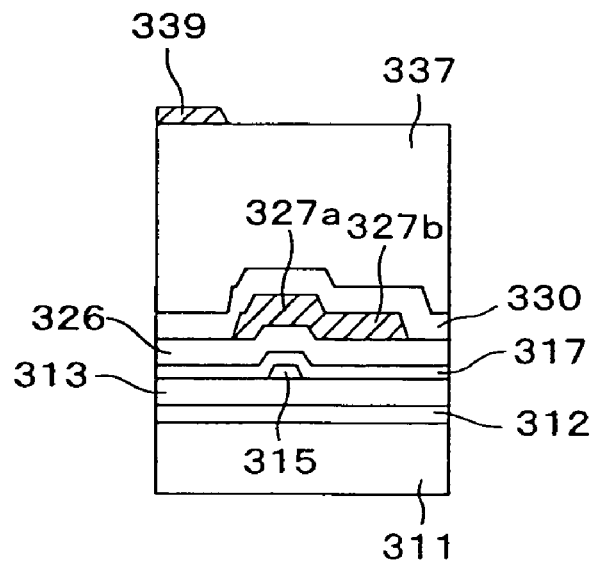
FIG. 61C is a cross-sectional view taken along the B-B' line in FIG. 61A.

FIG. 61A is a top plan view of the high voltage drive TFT forming region of the picture element portion in this case. Meanwhile, FIG. 61B shows a cross section taken along the A-A' line in FIG. 61A, and FIG. 61C shows a cross section taken along the B-B' line in FIG. 61A. As shown in FIG. 61A to FIG. 61C, the picture element electrode 339 is electrically connected to the source electrode 332s of the TFT through the contact hole 338.

Here, in terms of FIG. 61A to FIG. 61C, the gate bus line 327b, the data bus line 332b, the gate electrode 327a, the source electrode 332s, and the drain electrode 332d correspond to the gate bus line 109, the data bus line 108, the gate electrode 105g, the source electrode 105s, and the drain electrode 105d shown in FIG. 3A and FIG. 3B, respectively. Meanwhile, the SiO$_2$ films 317 and 326, the SiN film 330, and the organic insulating film 337 in FIG. 61A to FIG. 61C correspond to the first insulating film 171, the second insulating film 172, and the third insulating film 173 in FIG. 3B, respectively.

In this way, the thin film transistor device (the liquid crystal display panel) of this embodiment is finished.

This embodiment takes advantage of the fact that the impurity in the n-type low density impurity region 329 is sufficiently activated at a temperature (360° C. in this embodiment) which does not cause defects such as hillocks on the Al—Nd film 327 (the gate electrodes). In the present invention, the $SiO_2$ films 317 and 326 are formed on the polycrystalline silicon film 315. However, in case of using the SiN films instead of these $SiO_2$ films 317 and 326 and introducing hydrogen to the polycrystalline silicon film 315 by performing a thermal process, it is also possible to activate the impurity introduced to the n-type low density impurity region 329 by this thermal process.

In this embodiment as well, the low melting point metal film such as Al is not formed yet when activating the impurities implanted into the n-type high density impurity region and in the p-type high density impurity region. Accordingly, it is possible to activate the impurities by the thermal process and thereby to form more reliable TFTs than the case of activating the impurities by a laser activation process. Moreover, this embodiment can curtail one cycle of the photoresist step as compared to the second embodiment, and therefore has an advantage in light of reduction in manufacturing costs.

In this embodiment, the low voltage drive TFTs adopt the structure not including the LDD region, while the n-type high voltage drive TFT adopts the structure including the LDD region. This embodiment is suitable for the case where an operation voltage at the peripheral circuit portion is sufficiently low and it is not necessary to adopt the gate overlap structure in terms of reliability.

The above-described first to third embodiments show the examples of applying the present invention to the manufacture of the peripheral circuit integrated liquid crystal display panel. However, the present invention is also applicable to the manufacture of liquid crystal display panels adopting various structures such as a twisted nematic (TN) liquid crystal display panel, a multi-domain vertical alignment (MVA) liquid crystal display panel or an in-plane switching (IPS) liquid crystal display panel.

Moreover, the present invention is not limited only to the manufacture of liquid crystal display panels. It is also possible to apply the present invention to thin film transistor devices other than liquid crystal display panels, which include low voltage drive TFTs and high voltage drive TFTs.

What is claimed is:

1. A thin film transistor device comprising:
a substrate;
a first thin film transistor formed on the substrate and having a single layer first gate electrode, a first insulating film as a first gate insulating film and a first laminated film formed directly on the first gate electrode; and
a second thin film transistor formed on the substrate and having a single layer second gate electrode and a second laminated film formed directly on the second gate electrode, said second thin film transistor also having the first laminated film and the first insulating film as a second gate insulating film,
wherein a material of the first gate electrode of the first thin film transistor is selected to include any one element of molybdenum, titanium, chromium, tungsten and tantalum as a main component, and a material of the second gate electrode of the second thin film transistor is selected to be different from the material of the first gate electrode and include any one element of aluminum, silver and copper as a main component,
wherein the material of the first and second gate electrodes of the first and second thin film transistor are selected so that the second gate electrode of the second thin film transistor has a lower resistance and a lower melting point than the first gate electrode of the first thin film transistor.

2. The thin film transistor device according to claim 1,
wherein the first thin film transistor does not include a lightly doped drain region, and
the second thin film transistor includes the lightly doped drain region.

3. The thin film transistor device according to claim 1,
wherein each of the first thin film transistor and the second thin film transistor includes a lightly doped drain region,
the first gate electrode of the first thin film transistor entirely covers an upper part of the lightly doped drain region, and
the second gate electrode of the second thin film transistor partially covers an upper part of the lightly doped drain region.

4. The thin film transistor device according to claim 1,
wherein the second thin film transistor is driven by a higher voltage than the first thin film transistor.

* * * * *